US010025337B2

(12) United States Patent
Hancock et al.

(10) Patent No.: US 10,025,337 B2
(45) Date of Patent: Jul. 17, 2018

(54) METHOD AND SYSTEM FOR MANAGING AN ELECTRICAL DISTRIBUTION SYSTEM IN A FACILITY

(75) Inventors: Martin A. Hancock, Victoria (CA); Matthew Stanlake, Victoria (CA); Peter C. Cowan, Victoria (CA); John C. Van Gorp, Sidney (CA); David Kidd, Portland, OR (US); Hugh T. Lindsay, Victoria (CA); John Toffler, Victoria (CA); Catherine Gamroth, Victoria (CA); Kui Wu, Victoria (CA); Dimitri Marinakis, Duncan (CA)

(73) Assignee: SCHNEIDER ELECTRIC USA, INC., Andover, MA (US)

( * ) Notice: Subject to any disclaimer, the term of this patent is extended or adjusted under 35 U.S.C. 154(b) by 927 days.

(21) Appl. No.: 14/365,165

(22) PCT Filed: Dec. 16, 2011

(86) PCT No.: PCT/US2011/065554
§ 371 (c)(1),
(2), (4) Date: Oct. 28, 2014

(87) PCT Pub. No.: WO2013/089782
PCT Pub. Date: Jun. 20, 2013

(65) Prior Publication Data
US 2015/0051749 A1    Feb. 19, 2015

(51) Int. Cl.
*G05F 1/66* (2006.01)
*G01R 21/133* (2006.01)
(Continued)

(52) U.S. Cl.
CPC .......... *G05F 1/66* (2013.01); *G01R 21/1331* (2013.01); *G06Q 50/06* (2013.01)

(58) Field of Classification Search
None
See application file for complete search history.

(56) References Cited

U.S. PATENT DOCUMENTS 5,699,051 A    12/1997   Billig et al.
6,549,880 B1 *  4/2003   Willoughby ............ H02J 3/00
                                                   700/22
(Continued)

FOREIGN PATENT DOCUMENTS

CN    1651925 A    8/2005
CN    1751535 A    3/2006
(Continued)

OTHER PUBLICATIONS

International Search Report from corresponding PCT/US2011/065554 dated May 3, 2012.
(Continued)

*Primary Examiner* — Eric C Wai
(74) *Attorney, Agent, or Firm* — Lando & Anastasi, LLP

(57) ABSTRACT

A system and method for managing an electrical distribution system in a facility is disclosed. In one aspect, the method may include receiving at a computer system from a monitoring system data related to actual energy use of components of the electrical distribution system, receiving at the computer system a request for a modification to the electrical distribution system, using the computer system, providing a revised electrical distribution system design based on the request and the data related to actual energy use using a system optimization function for the electrical distribution system, modifying the electrical distribution system in accordance with the revised electrical distribution system design to provide a modified electrical distribution system in the facility, and receiving at the computer system from the
(Continued)

monitoring system data related to actual energy use of components of the modified electrical distribution system.

20 Claims, 39 Drawing Sheets

(51) Int. Cl.
*G06Q 50/06* (2012.01)
*G05D 3/12* (2006.01)
*G05D 5/00* (2006.01)
*G05D 9/00* (2006.01)
*G05D 11/00* (2006.01)
*G05D 17/00* (2006.01)

(56) References Cited

U.S. PATENT DOCUMENTS

| | | | |
|---|---|---|---|
| 7,085,824 | B2 | 8/2006 | Forth et al. |
| 2003/0225481 | A1 | 12/2003 | Sealing et al. |
| 2004/0036478 | A1 | 2/2004 | Logvinov et al. |
| 2004/0119608 | A1 | 6/2004 | Rao et al. |
| 2005/0116814 | A1 | 6/2005 | Rodgers et al. |
| 2005/0273281 | A1* | 12/2005 | Wall ............... G01D 4/004 702/60 |
| 2008/0235172 | A1 | 9/2008 | Rosenstein et al. |
| 2009/0093916 | A1 | 4/2009 | Parsonnet et al. |
| 2010/0037071 | A1 | 2/2010 | Chang |
| 2010/0070234 | A1 | 3/2010 | Steinberg et al. |
| 2010/0318826 | A1 | 12/2010 | Hansen et al. |
| 2010/0332373 | A1 | 12/2010 | Crabtree et al. |
| 2011/0004446 | A1 | 1/2011 | Dorn et al. |
| 2011/0046904 | A1 | 2/2011 | Souilmi |
| 2011/0077795 | A1 | 3/2011 | VanGilder et al. |
| 2011/0106327 | A1 | 5/2011 | Zhou et al. |

FOREIGN PATENT DOCUMENTS

| | | |
|---|---|---|
| CN | 101630840 A | 1/2010 |
| CN | 101888090 A | 11/2010 |
| CN | 102280935 A | 12/2011 |
| WO | 2004057907 A1 | 7/2004 |

OTHER PUBLICATIONS

Supplementary European Search Report for EP 11877589.9 dated May 11, 2015.
Wikipedia: "Data Center", Internet Article, Dec. 14, 2011. Retrieved from the Internet: URL:en.wikipedia.org/w/index. php?title=Data_center&oldid=465909841 [retrieved on Apr. 28, 2015].
Vangeet et al. "Best Practices Guide for Energy-Efficient Data Center Design", U.S. Department of Energy, Office of Energy Efficiency and Renewable Energy Internet Article, Mar. 15, 2011, Retrieved from the Internet: URL: www1.eere.energy.gov/femp/ pdfs/eedatacenterbestpractices.pdf [retrieved on Apr. 28, 2015].
"Best Practices Guide for Energy-Efficient Data Center Design", National Renewable Energy Laboratory, pp. 13-15, Mar. 31, 2011.
"Electrical Distribution Technology", Tianyou Li et al., China Electric Power Press, pp. 328-329, Mar. 2008.
"Appendix A to B" In: Peter M. Curtis: "Maintaining Mission Critical Systems in a 24/7 Environment", Mar. 9, 2007 (Mar. 9, 2007), Wiley-IEEE Press, XP055188130, ISBN: 978-0-47-168374-2 pp. 297-457.
"Chapter 09 to 11" In: Peter M. Curtis: "Maintaining Mission Critical Systems in a 24/7 Environment", Mar. 9, 2007 (Mar. 9, 2007), Wiley-IEEE Press, XP055188129, ISBN: 978-0-47-168374-2 pp. 127-228.
Wikipedia: "Gibbs sampling", Internet Article, Dec. 10, 2011 (Dec. 10, 2011), XP055432925, Retrieved from he Internet: URL:en. wikipedia.org/w/index.php? title=Gibbs_sampling &oldid=465169945 [retrieved on Dec. 7, 2017].
Wikipedia: "Mixture model", Internet Article, Nov. 22, 2011 (Nov. 22, 2011), XP055432924, Retrieved from the Internet: URL:en. wikipedia.org/w/index.php? title=Mixture_model &oldid=461935857 [retrieved on Jul. 12, 2017].

* cited by examiner

METHOD AND SYSTEM FOR MANAGING AN ELECTRICAL DISTRIBUTION SYSTEM IN A FACILITY

This application is a U.S. National Stage Application under 35 U.S.C. § 371 from International Application No. PCT/US2011/065554, filed Dec. 16, 2011, which is hereby incorporated by reference in its entirety for all purposes.

BACKGROUND

Field of the Invention

At least one embodiment in accordance with the present invention relates generally to systems and methods for designing, monitoring and operating co-location electrical critical building systems including data centers, and more specifically, to systems and methods for optimizing the design of co-location centers.

Discussion of Related Art

Due to complexities and economies of scale, companies typically outsource management of local data centers to co-location (or colocation) centers. Co-location centers provide space, power, cooling, and physical security for server, storage, and networking equipment of other companies. Co-location centers may also provide a variety of telecommunications and network services with a minimum of cost and complexity. Outsourcing to co-location centers may provide significant benefits, for example, higher reliability due to redundant systems, full time monitoring and security and lower network latency and higher bandwidth at a lower cost. Outsourcing to co-location centers may further allow companies to save money on information technology (IT) support by diverting IT personnel to other tasks. The popularity of co-location centers has forced co-location companies to continually expand co-location buildings and centers. With this additional expansion, co-location operators focus on providing reliable, low cost systems whose use can be accurately partitioned and billed to the customer.

SUMMARY

A first aspect of the invention is directed to a method for managing an electrical distribution system in a facility. The method includes receiving at a computer system from a monitoring system data related to actual energy use of components of the electrical distribution system, receiving at the computer system a request for a modification to the electrical distribution system, using the computer system, providing a revised electrical distribution system design based on the request and the data related to actual energy use using a system optimization function for the electrical distribution system, modifying the electrical distribution system in accordance with the revised electrical distribution system design to provide a modified electrical distribution system in the facility, and receiving at the computer system from the monitoring system data related to actual energy use of components of the modified electrical distribution system.

The method may further comprise using the computer system to validate the modified electrical distribution system using the data related to actual energy use of components of the modified electrical distribution system. In the method, using a system optimization function may include iteratively determining system parameters to achieve an optimized solution.

In the method, iteratively determining system parameters may include determining parameters related to at least one of system reliability, efficiency, risk, and redundancy. In the method, iteratively determining system parameters may also include calculating an efficiency metric for the electrical distribution system based on at least one of a redundancy level of the electrical distribution system and outdoor climate at a geographical location of the electrical distribution system. Iteratively determining system parameters may further include calculating a current system reliability metric for the electrical distribution system based on measurements of power quality at a plurality of measurement points in the electrical distribution system.

In the method, iteratively determining system parameters may include analyzing the monitoring system data to determine freed capacity in the electrical distribution system, comparing the freed capacity against utilization needs and providing a recommendation for a change in utilization of components in the electrical distribution system based on the freed capacity. Iteratively determining system parameters may also include determining and updating at least one real-time redundancy value for the electrical distribution system.

Another aspect of the invention is directed to a system for managing an electrical distribution system. The system comprises a monitoring system having a plurality of electrical monitors coupled to components of the electrical distribution system and a controller coupled to the monitoring system and configured to receive from the monitoring system data related to actual energy use of the components of the electrical distribution system, receive a request for a modification to the electrical distribution system, generate a revised electrical distribution system design based on the request and the data related to actual energy use using a system optimization function for the electrical distribution system and receive from the monitoring system data related to actual energy use of components of the modified electrical distribution system.

In the system, the controller may be configured to validate the modified electrical distribution system using the data related to actual energy use of components of the modified electrical distribution system. In addition, using a system optimization function may include iteratively determining system parameters to achieve an optimized solution.

In the system, iteratively determining system parameters includes determining parameters related to at least one of system reliability, efficiency, risk, and redundancy. Iteratively determining system parameters may also include calculating an efficiency metric for the electrical distribution system based on at least one of a redundancy level of the electrical distribution system and outdoor climate at a geographical location of the electrical distribution system. Iteratively determining system parameters may further include calculating a current system reliability metric for the electrical distribution system based on measurements of power quality at a plurality of measurement points in the electrical distribution system.

In the system, iteratively determining system parameters may include analyzing the monitoring system data to determine freed capacity in the electrical distribution system, comparing the freed capacity against utilization needs and providing a recommendation for a change in utilization of components in the electrical distribution system based on the freed capacity. Iteratively determining system parameters may also include determining and updating at least one real-time redundancy value for the electrical distribution system.

Another aspect of the invention is directed to a computer readable medium having stored thereon sequences of instruction. The sequences of instructions may include instructions that will cause a processor to receive from a monitoring system data related to actual energy use of components of an electrical distribution system, receive a request for a modification to the electrical distribution system, generate a revised electrical distribution system design based on the request and the data related to actual energy use using a system optimization function for the electrical distribution system, and receive from the monitoring system data related to actual energy use of components of the modified electrical distribution system.

In the computer readable medium, the sequences of instruction may further include sequences of instruction that will cause the processor to validate the modified electrical distribution system using the data related to actual energy use of components of the modified electrical distribution system. In the computer readable medium, the sequences of instruction may further comprise sequences of instruction that will cause the processor to use the system optimization function to iteratively determine system parameters to achieve an optimized solution. In the computer readable medium, iteratively determining system parameters may further include determine parameters related to at least one of system reliability, efficiency, risk, and redundancy.

Another aspect of the invention is directed to a method for managing an electrical distribution system in a facility. The method may comprise receiving at a computer system from a monitoring system data related to actual energy use of components of the electrical distribution system, determining using the computer system an efficiency metric for the electrical distribution system, receiving data at the computer system related to at least one of a redundancy level of the electrical computer system and climate data for a geographical location of the facility, determining a modified efficiency metric based on the efficiency metric the data related to at least one of a redundancy level of the electrical distribution system and climate data for a geographical location of the facility, and displaying to a user on a graphical user interface a representation of the modified efficiency metric.

The method may further comprise receiving at the computer system a request for a modification to the electrical distribution system, using the computer system, providing a revised electrical distribution system design based on the request and the modified efficiency metric, and modifying the electrical distribution system in accordance with the revised electrical distribution system design to provide a modified electrical distribution system in the facility. In addition, the method may further comprise determining and displaying a representation of a modified efficiency metric for the modified electrical distribution facility.

In the method, the computer system may be further configured to determine a present level of redundancy for at least one group of redundant equipment in the electrical distribution system and is configured to determine the modified efficiency metric based on the present level of redundancy. The computer system may be further configured to determine an alternate redundancy level for the at least one group of redundant equipment and determine the modified efficiency metric based on the alternate redundancy level.

In the method, the computer system is configured to receive data related to HVAC energy consumption in the electrical distribution system for a first weather profile and for a second weather profile, and to determine a first value of the modified efficiency metric based on the first weather profile and to determine a second value of the modified efficiency metric based on the second weather profile.

In the method, the computer system may be configured to receive data related to HVAC energy consumption in the electrical distribution system for a first temperature set point for the facility and for a second temperature set point in the facility, and to determine a first value of the modified efficiency metric based on the first temperature set point and to determine a second value of the modified efficiency metric based on the second temperature set point.

Another aspect of the invention is directed to a system for managing an electrical distribution system. The system may comprise a monitoring system having a plurality of electrical monitors coupled to components of the electrical distribution system, and a controller coupled to the monitoring system and configured to receive data from the monitoring system data related to actual energy use of components of the electrical distribution system, determine an efficiency metric for the electrical distribution system, receive data related to at least one of a redundancy level of the electrical computer system and climate data for a geographical location of the facility, determine a modified efficiency metric based on the efficiency metric the data related to at least one of a redundancy level of the electrical distribution system and climate data for a geographical location of the facility; and provide to a graphical user interface a representation of the modified efficiency metric.

In the system, the controller may be further configured to receive a request for a modification to the electrical distribution system, provide a revised electrical distribution system design based on the request and the modified efficiency metric, and modify the electrical distribution system in accordance with the revised electrical distribution system design to provide a modified electrical distribution system in the facility.

The system may further includes a display coupled to the controller, and wherein the controller is further configured to determine and output to the display a representation of a modified efficiency metric for the modified electrical distribution facility.

In the system, the controller may be further configured to determine a present level of redundancy for at least one group of redundant equipment in the electrical distribution system and is configured to determine the modified efficiency metric based on the present level of redundancy. In the system, the controller may be further configured to determine an alternate redundancy level for the at least one group of redundant equipment and determine the modified efficiency metric based on the alternate redundancy level. In the system, the controller may be configured to receive data related to HVAC energy consumption in the electrical distribution system for a first weather profile and for a second weather profile, and to determine a first value of the modified efficiency metric based on the first weather profile and to determine a second value of the modified efficiency metric based on the second weather profile.

In the system, the controller may be configured to receive data related to HVAC energy consumption in the electrical distribution system for a first temperature set point for the facility and for a second temperature set point in the facility, and to determine a first value of the modified efficiency metric based on the first temperature set point and to determine a second value of the modified efficiency metric based on the second temperature set point.

Another aspect of the invention is directed to a computer readable medium having stored thereon sequences of instruction including instructions that will cause a processor to receive from a monitoring system data related to actual energy use of components of an electrical distribution system in a facility, determine an efficiency metric for the electrical distribution system, receive data related to at least one of a redundancy level of the electrical distribution system and climate data for a geographical location of the facility, determine a modified efficiency metric based on the efficiency metric the data related to at least one of a redundancy level of the electrical computer system and climate data for a geographical location of the facility, and provide to a graphical user interface a representation of the modified efficiency metric.

The computer readable medium may further comprise sequences of instruction including instructions that will cause the processor to receive a request for a modification to the electrical distribution system, and provide a revised electrical distribution system design based on the request and the modified efficiency metric. The computer readable medium may further comprise sequences of instruction including instructions that will cause the processor to determine and provide to a display a representation of a modified efficiency metric for the modified electrical distribution facility.

In addition, the computer readable medium may further comprise sequences of instruction including instructions that will cause the processor to determine a present level of redundancy for at least one group of redundant equipment in the electrical distribution system and to determine the modified efficiency metric based on the present level of redundancy. The sequences of instructions may include instructions that will cause the processor to determine an alternate redundancy level for the at least one group of redundant equipment and determine the modified efficiency metric based on the alternate redundancy level.

In the computer readable medium, the sequences of instructions may further comprising sequences of instruction that include instructions that will cause the processor to receive data related to HVAC energy consumption in the electrical distribution system for a first weather profile and for a second weather profile, and to determine a first value of the modified efficiency metric based on the first weather profile and to determine a second value of the modified efficiency metric based on the second weather profile.

Another aspect of the invention is directed to a method for managing electrical distribution system in a facility. The method may comprise receiving at a computer system from a monitoring system data related to actual energy use of components of the electrical distribution system, identifying, using the computer system, a present redundancy level of the electrical distribution system, comparing the present redundancy level with a desired redundancy level and obtaining a comparison result and presenting the comparison result on a display of the computer system.

The method may further comprise receiving at the computer system a request for a modification to the electrical distribution system, using the computer system, providing a revised electrical distribution system design based on the request and data related to actual energy use of the electrical distribution system, and performing a redundancy check on the revised electrical distribution system design. The method may further comprise calculating, by the computer system, at least one redundancy fail scenario of the revised electrical distribution system design. In the method, identifying a present redundancy level may include determining the redundancy level using the computer system.

The method may further comprise using the computer system, identifying a weak point in the electrical distribution system susceptible to a failure that could lead to a change in the present redundancy level. The method may further comprise presenting, on the display, a recommendation to modify the weak point to reduce susceptibility to failure.

The method may further comprise detecting a failure of a component in the electrical distribution system, and in response, updating the present redundancy level. The method may further comprise in response to detecting the failure, presenting a recommendation on the display for modifying the electrical distribution system.

In the method, identifying a present level of redundancy may include preparing an hierarchal based representation of power flow in the electrical distribution system and determining redundancy at each of a number of hierarchal nodes identified in the hierarchal based representation starting with a lowest hierarchal node.

Another aspect of the invention is directed to a system for managing an electrical distribution system in a facility. The system may comprise a display, a monitoring system having a plurality of electrical monitors coupled to components of the electrical distribution system, and a controller coupled to the monitoring system and the display and configured to receive from the monitoring system data related to actual energy use of components of the electrical distribution system, identify a present redundancy level of the electrical distribution system, compare the present redundancy level with a desired redundancy level and obtain a comparison result, and present the comparison result on the display.

In the system, the controller may be configured to identify a present redundancy level may be further configured to determine the redundancy level based on system information retrieved by the controller. In the system, the controller may be further configured to identify a weak point in the electrical distribution system susceptible to a failure that could lead to a change in the present redundancy level. In the system, the controller may be further configured to present on the display a recommendation to modify the weak point to reduce susceptibility to failure.

In the system, the controller may be further configured to detect a failure of a component in the electrical distribution system, and in response, update the present redundancy level. The controller may be further configured to, in response to detecting the failure, present a recommendation on the display for modifying the electrical distribution system. In the system, identify a present level of redundancy may further includes prepare an hierarchal based representation of power flow in the electrical distribution system, and determine redundancy at each of a number of hierarchal nodes identified in the hierarchal based representation starting with a lowest hierarchal node.

Another aspect of the invention is directed to a computer readable medium having stored thereon sequences of instruction including instructions that will cause a processor to receive from a monitoring system data related to actual energy use of components of an electrical distribution system in a facility, identify a present redundancy level of the electrical distribution system, compare the present redundancy level with a desired redundancy level and obtain a comparison result, and generate an output of the comparison result for a display unit.

In the computer readable medium, the sequences of instruction that include instructions to identify a present redundancy level includes instructions that will cause a processor to receive layout information for the electrical distribution system and determine the redundancy level based on the layout information.

In the computer readable medium, the sequences of instruction include instructions that will cause the processor to identify a weak point in the electrical distribution system susceptible to a failure that could lead to a change in the present redundancy level, and produce instructions for a display to present a recommendation to modify the weak point to reduce susceptibility to failure.

In the computer readable medium, the sequences of instruction include instructions that will cause the processor to detect a failure of a component in the electrical distribution system, and in response, update the present redundancy level. In the computer readable medium, the sequences of instruction include instructions that will cause the processor to, in response to detecting the failure, produce instructions for a display to present a recommendation for modifying the electrical distribution system.

In the computer readable medium, the sequences of instruction that include instructions to identify a present level of redundancy further include instructions that will cause the processor to prepare an hierarchal based representation of power flow in the electrical distribution system, and determine redundancy at each of a number of hierarchal nodes identified in the hierarchal based representation starting with a lowest hierarchal node.

Another aspect of the invention is directed to a method for managing an electrical distribution system in a facility. The method may further comprise receiving at a computer system a request to add an electrical load to the electrical distribution system, determining, using the computer system, that addition of the electrical load will cause a safe capacity level of the electrical distribution system to be exceeded, receiving at the computer system from a monitoring system coupled to the electrical distribution system data related to actual energy use of components of the electrical distribution system, based on the data related to actual energy use, using the computer system, generating an updated safe capacity level, determining, using the computer system, whether addition of the electrical load will cause the updated safe capacity level to be exceeded, and adding the electrical load to the electrical distribution system if the addition of the electrical load will not cause the updated safe capacity level to be exceeded.

The method may further comprise modifying the electrical distribution system to create additional freed capacity if the addition of the electrical load will cause the updated safe capacity level to be exceeded. The method may further comprise adding the electrical load to the electrical distribution system.

The method may further comprise using the computer system, determining freed capacity for the electrical distribution system based on the data related to actual energy use and the safe capacity level. In addition, the method may further comprise periodically receiving at the computer system updated actual energy use of components of the electrical distribution system and periodically updating the freed capacity for the electrical distribution system based on the updated actual energy use of components of the electrical distribution system.

The method may further comprise coupling the computer system to the monitoring system using a communications network and receiving energy usage data at the computer system from a monitoring device embedded within a component of the electrical distribution system. In addition, the method may further comprise presenting on a display of a computer system a graphical representation of the electrical distribution system along with an indication of actual energy usage of at least one component of the electrical distribution system and receiving from a user of the computer system data related to freed capacity in the electrical distribution system.

Another aspect of the invention is directed to a system for managing an electrical distribution system in a facility. The system may comprise a display, a monitoring system having a plurality of electrical monitors coupled to components of the electrical distribution system and a controller coupled to the monitoring system and the display. The controller may be configured to receive a request to add an electrical load to the electrical distribution system, determine that addition of the electrical load will cause a safe capacity level of the electrical distribution system to be exceeded, receive from the monitoring system data related to actual energy use of components of the electrical distribution system, based on the data related to actual energy use, generate an updated safe capacity level, determine whether addition of the electrical load will cause the updated safe capacity level to be exceeded, and provide instructions for output on the display to add the electrical load to the electrical distribution system if the addition of the electrical load will not cause the updated safe capacity level to be exceeded.

In the system, the controller may be further configured to provide instructions for output on the display to modify the electrical distribution system to create additional freed capacity if the addition of the electrical load will cause the updated safe capacity level to be exceeded. The controller may be further configured to determine freed capacity for the electrical distribution system based on the data related to actual energy use and the safe capacity level.

In the system, the controller may be further configured to periodically receive updated actual energy use of components of the electrical distribution system, and periodically update the freed capacity for the electrical distribution system based on the updated actual energy use of components of the electrical distribution system. The system may further comprise a communications network coupled to the electrical distribution system and the power monitoring system.

In the system, the monitoring system may include a monitoring device embedded within a component of the electrical distribution system and coupled to the communications network. In the system, the controller may be configured to provide instructions to the display to present a graphical representation of the electrical distribution system along with an indication of actual energy usage of at least one component of the electrical distribution system, and receive from a user of the system data related to freed capacity in the electrical distribution system.

Another aspect of the invention is directed to a computer readable medium having stored thereon sequences of instruction including instructions that will cause a processor to receive a request to add an electrical load to the electrical distribution system, determine that addition of the electrical load will cause a safe capacity level of the electrical distribution system to be exceeded, receive from a monitoring system data related to actual energy use of components of the electrical distribution system, based on the data related to actual energy use, generate an updated safe capacity level, determine whether addition of the electrical load will cause the updated safe capacity level to be exceeded, and provide instructions for output on a display to add the electrical load to the electrical distribution system if the addition of the electrical load will not cause the updated safe capacity level to be exceeded.

In the computer readable medium, the sequences of instructions may include instructions that will cause the processor to generate instructions for output on the display to modify the electrical distribution system to create additional freed capacity, if the addition of the electrical load will cause the updated safe capacity level to be exceeded.

In the computer readable medium, the sequences of instructions may include instructions that will cause the processor to determine freed capacity for the electrical distribution system based on the data related to actual energy use and the safe capacity level. In addition, the sequences of instructions may include instructions that will cause the processor to periodically receive updated actual energy use of components of the electrical distribution system and periodically update the freed capacity for the electrical distribution system based on the updated actual energy use of components of the electrical distribution system.

In the computer readable medium, the sequences of instructions may include instructions that will cause the processor to provide instructions to the display to present a graphical representation of the electrical distribution system along with an indication of actual energy usage of at least one component to the electrical distribution system, and receive from a user of the system data related to freed capacity in the electrical distribution system.

Another aspect of the invention is directed to a method for managing an electrical distribution system in a facility. The method may comprise conducting, using a computer system, measurements related to power quality at a plurality of nodes in the electrical distribution system using a power monitoring system, receiving at the computer system from the power monitoring system data related to the power quality at the plurality of nodes in the electrical distribution system, and based on the data related to the power quality, using the computer system, generating a current network reliability status for the electrical distribution system.

The method may further comprise coupling a communications network between the power monitoring system and the computer system and transferring the data related to the power quality over the communications network. The method may further comprise using the computer system, providing an estimate of power quality at a node in the electrical distribution system other than the plurality of nodes based on the measurements and based on a power quality transfer function of at least one component in the electrical distribution system.

Method may further comprise periodically updating the power quality transfer function of the at least one component. In addition, the method may further include using the computer system, providing a prediction for a power outage for the at least one component in the electrical distribution system based on the measurements related to power quality and the estimate of power quality. Further, the method may further comprise using the computer system, developing a maintenance schedule for the at least one component in the electrical distribution system based on the measurements related to the power quality and the estimate of power quality. The method may further comprise periodically updating the current network reliability status based on updated measurements of power quality at the plurality of nodes.

Another aspect of the invention is directed to a system for managing an electrical distribution system in a facility. The system may comprise a display, a power monitoring system having a plurality of electrical monitors coupled to components of the electrical distribution system and a controller coupled to the power monitoring system and the display. The controller may be configured to receive, from the power monitoring system, data related to the power quality at the plurality of nodes in the electrical distribution system, and based on the data related to the power quality, generate a current network reliability status for the electrical distribution system and provide an output of the status for the display.

The system may further comprise a communications network coupled to the power monitoring system and the electrical distribution system. In the system, the controller may be further configured to provide an estimate of power quality at a node in the electrical distribution system other than the plurality of nodes based on the measurements and based on a power quality transfer function of at least one component in the electrical distribution system.

In the system, the controller may be further configured to periodically update the power quality transfer function of the at least one component. In the system, the controller may be further configured to provide a prediction for a power outage for at least one component in the electrical distribution system based on the measurements related to power quality and the estimate of power quality. The controller may be further configured to develop a maintenance schedule for at least one component in the electrical distribution system based on the measurements related to power quality and the estimate of power quality. In the system, the controller may be further configured to update the current network reliability status based on updated measurements of power quality at the plurality of nodes.

Another aspect of the invention is directed to a computer readable medium having stored thereon sequences of instruction including instructions that will cause a processor to receive from a power monitoring system data related to power quality at a plurality of nodes in the electrical distribution system, and based on the data related to power quality, generate a current network reliability status for the electrical distribution system and provide an output of the status for display.

In the computer readable medium, the sequences of instruction may include instructions that will cause the processor to provide an estimate of power quality at a node in the electrical distribution system other than the plurality of nodes based on measured data and based on a power quality transfer function of at least one component in the electrical distribution system. In the computer readable medium, the sequences of instruction may include instructions that will cause the processor to periodically update the power quality transfer function of the at least one component.

In the computer readable medium, the sequences of instruction may include instructions that will cause the processor to provide a prediction for a power outage for at least one component in the electrical distribution system based on measurements related to power quality and the estimate of power quality. In the computer readable medium, the sequences of instruction may include instructions that will cause the processor to develop a maintenance schedule for at least one component in the electrical distribution system based on measurements related to power quality and the estimate of power quality. In the computer readable medium, the sequences of instruction may include instructions that will cause the processor to update the current network reliability status based on updated measurements of power quality at the plurality of nodes.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings.

DETAILED DESCRIPTION

Figure 1:
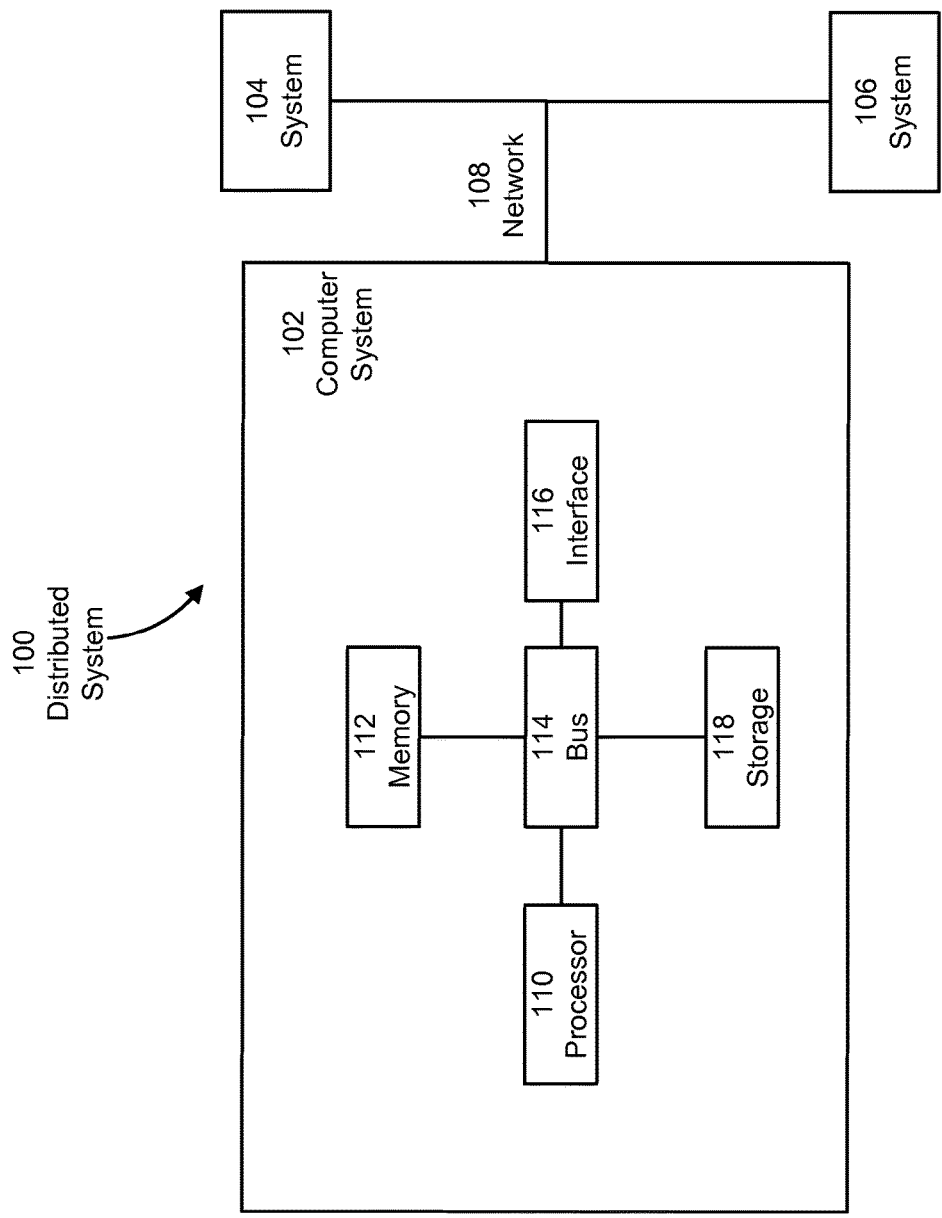
FIG. 1 is a block diagram of one example of a computer system with which various aspects in accord with the present invention may be implemented.

To provide an efficient solution, an operator of a critical co-location facility, such as a data center, needs to balance multiple variables related to the facility, such as operator or user risk, reliability and cost. Service providers in existing co-location facilities typically lack an accurate way to bill customers for the customers' actual energy and resource usage. While total operational costs may be determined, the apportionment of these total costs to individual customers can be difficult to determine when different levels of service (i.e. redundancy) are provided. Typically, providers of co-location centers estimate costs with approximately 5% to 10% margin of error. Without a way to provide accurate pricing based on actual resource usage, co-location service providers lack a reliable way to lower costs, while still ensuring reliability of the co-location services and meeting user needs.

At least some embodiments described herein provide a system and/or method that allows a user or facility manager of a co-location center to use metrics of power reliability, power usage effectiveness, redundancy and cost estimation capabilities, on a real time basis, to balance the variables of end user risk, reliability and cost to provide customers with an individualized solution that can be appropriately priced. The metrics used in at least some systems described herein to evaluate co-location centers can be adjusted to accommodate specific weather, country specific environments, as well as other location specific issues.

At least some systems and methods described herein combine reliability focused analysis tools with cost saving analysis tools and data center management tools to provide accurate metrics on a real-time basis. In addition, the systems and methods may provide co-location architecture management reports, as well as best practice guidelines for screen development, & updated infrastructure components. Furthermore, the systems and methods may provide co-location architecture specifically focused, sub-solutions for power incident notification (i.e. Event Notification), backup generator testing and geographical time-stamped data logging for accurately determining the root cause of power incidents.

Operators and users of co-location architecture systems and methods provided herein may receive cost savings and reliability benefits. First, co-location architecture management systems and methods provided herein may provide a power efficiency analysis for a data center. The power efficiency analysis can be used to identify and track distribution and equipment losses, harmonic losses (total and by equipment) and the power delivery ratio of total data center load to IT load. These metrics can help customers reduce the energy cost per IT rack which improves their bottom line.

Second, co-location architecture management systems and methods provided herein may receive input from multiple users and can provide targeted output to the users responsible for operating and maintaining power distribution infrastructure. These users may include site operators, electrical engineering staff, and facility or data center managers. Typically, in existing systems, if an IT manager requests a change to the electrical system, such as adding a new server rack for increased customer usage, the building operator checks if the change to the electrical system is possible. This is usually a complex question that requires the operator's expertise to review the extra required power, and compare it to the system's available power. Any such change impacts the building's reliability capabilities, redundancy capabilities and also may cause an increase in cost, for example measured in dollars per kilowatt-hour consumed by the electrical system. Instead, the co-location architecture management systems and methods described herein are able to accept input from both IT managers and building managers and calculate the reliability, risk and cost variables for output to the appropriate parties. The parties can base decisions regarding changes to system based on the provided output.

Further, the co-location architecture management systems and methods described herein provide power reliability analysis that allows for identifying both quality and availability issues with power being distributed to IT and support loads. In addition, the systems and methods may provide power incident management for identifying, reacting to, and analyzing power incidents, and power capacity management for identifying overloaded and/or redundancy compromised distribution circuits and key equipment.

The aspects disclosed herein in accordance with the present invention, are not limited in their application to the details of construction and the arrangement of components set forth in the following description or illustrated in the drawings. These aspects are capable of assuming other embodiments and of being practiced or of being carried out in various ways. Examples of specific implementations are provided herein for illustrative purposes only and are not intended to be limiting. In particular, acts, elements and features discussed in connection with any one or more embodiments are not intended to be excluded from a similar role in any other embodiments.

For example, according to one embodiment of the present invention, a computer system is configured to perform any of the functions described herein, including but not limited to, configuring, modeling and presenting information regarding specific data center configurations. Further, computer systems in embodiments may be used to automatically measure environmental parameters in a data center, and control equipment, such as chillers or coolers to optimize performance. Moreover, the systems described herein may be configured to include or exclude any of the functions discussed herein. Thus the invention is not limited to a specific function or set of functions. Also, the phraseology and terminology used herein is for the purpose of description and should not be regarded as limiting. The use herein of "including," "comprising," "having," "containing," "involving," and variations thereof is meant to encompass the items listed thereafter and equivalents thereof as well as additional items.

Computer System

Various aspects and functions described herein in accordance with the present invention may be implemented as hardware or software on one or more computer systems. There are many examples of computer systems currently in use. These examples include, among others, network appliances, personal computers, workstations, mainframes, networked clients, servers, media servers, application servers, database servers and web servers. Other examples of computer systems may include mobile computing devices, such as cellular phones and personal digital assistants, and network equipment, such as load balancers, routers and switches. Further, aspects in accordance with the present invention may be located on a single computer system or may be distributed among a plurality of computer systems connected to one or more communications networks.

For example, various aspects and functions may be distributed among one or more computer systems configured to provide a service to one or more client computers, or to perform an overall task as part of a distributed system. Additionally, aspects may be performed on a client-server or multi-tier system that includes components distributed among one or more server systems that perform various functions. Thus, the invention is not limited to executing on any particular system or group of systems. Further, aspects may be implemented in software, hardware or firmware, or any combination thereof. Thus, aspects in accordance with the present invention may be implemented within methods, acts, systems, system elements and components, using a variety of hardware and software configurations, and the invention is not limited to any particular distributed architecture, network, or communication protocol.

FIG. 1 shows a block diagram of a distributed computer system 100, in which various aspects and functions in accord with the present invention may be practiced. Distributed computer system 100 may include one more computer systems. For example, as illustrated, distributed computer system 100 includes computer systems 102, 104 and 106. As shown, computer systems 102, 104 and 106 are interconnected by, and may exchange data through, communication network 108. Network 108 may include any communication network through which computer systems may exchange data. To exchange data using network 108, computer systems 102, 104 and 106 and network 108 may use various methods, protocols and standards, including, among others, token ring, Ethernet, wireless Ethernet, Bluetooth, TCP/IP, UDP, Http, FTP, SNMP, SMS, MMS, SS7, Json, Soap, and Corba. To ensure data transfer is secure, computer systems 102, 104 and 106 may transmit data via network 108 using a variety of security measures including TSL, SSL or VPN among other security techniques. While distributed computer system 100 illustrates three networked computer systems, distributed computer system 100 may include any number of computer systems and computing devices, networked using any medium and communication protocol.

Various aspects and functions in accordance with the present invention may be performed on a plurality of different types of servers. For example, a server may be a physical server, a dedicated server, or a virtual server (or a cloud computing server). A physical server generally includes hardware where an operating system is run. A dedicated server generally includes a service application running on a physical server. For example, a dedicated server may include a web service or file transfer protocol (FTP) service on an operating system, where the service application can be coupled to the physical server. A virtual server can include a service that is independent of physical server hardware. For example, a virtual server may include a partitioning of a physical server into multiple servers, each having the appearance and capabilities as if they were running on their own dedicated server. In one embodiment, there can be one dedicated server operating system per physical server and multiple virtual servers per physical server. A virtual server can run concurrent with (e.g., on top of) a dedicated server.

Various aspects and functions in accordance with the present invention may be implemented as specialized hardware or software executing in one or more computer systems including computer system 102 shown in FIG. 1. As depicted, computer system 102 includes processor 110, memory 112, bus 114, interface 116 and storage 118. Processor 110 may perform a series of instructions that result in manipulated data. Processor 110 may be a commercially available processor such as an Intel Pentium, Motorola PowerPC, SGI MIPS, Sun UltraSPARC, or Hewlett-Packard PA-RISC processor, but may be any type of processor or controller as many other processors and controllers are available. Processor 110 is connected to other system elements, including one or more memory devices 112, by bus 114.

Memory 112 may be used for storing programs and data during operation of computer system 102. Thus, memory 112 may be a relatively high performance, volatile, random access memory such as a dynamic random access memory (DRAM) or static memory (SRAM). However, memory 112 may include any device for storing data, such as a disk drive or other non-volatile storage device. Various embodiments in accordance with the present invention may organize memory 112 into particularized and, in some cases, unique structures to perform the aspects and functions disclosed herein.

Components of computer system 102 may be coupled by an interconnection element such as bus 114. Bus 114 may include one or more physical busses, for example, busses between components that are integrated within a same machine, but may include any communication coupling between system elements including specialized or standard computing bus technologies such as IDE, SCSI, PCI and InfiniBand. Thus, bus 114 enables communications, for example, data and instructions, to be exchanged between system components of computer system 102.

Computer system 102 also includes one or more interface devices 116 such as input devices, output devices and combination input/output devices. Interface devices may receive input or provide output. More particularly, output devices may render information for external presentation. Input devices may accept information from external sources. Examples of interface devices include keyboards, mouse devices, trackballs, microphones, touch screens, printing devices, display screens, speakers, network interface cards, etc. Interface devices allow computer system 102 to exchange information and communicate with external entities, such as users and other systems.

Storage system 118 may include a computer readable and writeable nonvolatile storage medium in which instructions are stored that define a program to be executed by the processor. Storage system 118 also may include information that is recorded, on or in, the medium, and this information may be processed by the program. More specifically, the information may be stored in one or more data structures specifically configured to conserve storage space or increase data exchange performance. The instructions may be persistently stored as encoded signals, and the instructions may cause a processor to perform any of the functions described herein. The medium may, for example, be optical disk, magnetic disk or flash memory, among others. In operation, the processor or some other controller may cause data to be read from the nonvolatile recording medium into another memory, such as memory 112, that allows for faster access to the information by the processor than does the storage medium included in storage system 118. The memory may be located in storage system 118 or in memory 112, however, processor 110 may manipulate the data within the memory 112, and then copies the data to the medium associated with storage system 118 after processing is completed. A variety of components may manage data movement between the medium and integrated circuit memory element and the invention is not limited thereto. Further, the invention is not limited to a particular memory system or storage system.

Although computer system 102 is shown by way of example as one type of computer system upon which various aspects and functions in accordance with the present invention may be practiced, aspects of the invention are not limited to being implemented on the computer system as shown in FIG. 1. Various aspects and functions in accord with the present invention may be practiced on one or more computers having a different architectures or components than that shown in FIG. 1. For instance, computer system 102 may include specially-programmed, special-purpose hardware, such as for example, an application-specific integrated circuit (ASIC) tailored to perform a particular operation disclosed herein. While another embodiment may perform the same function using several general-purpose computing devices running MAC OS System X with Motorola PowerPC processors and several specialized computing devices running proprietary hardware and operating systems.

Computer system 102 may be a computer system including an operating system that manages at least a portion of the hardware elements included in computer system 102. Usually, a processor or controller, such as processor 110, executes an operating system which may be, for example, a Windows-based operating system, such as, Windows NT, Windows 2000 (Windows ME), Windows XP or Windows Vista operating systems, available from the Microsoft Corporation, a MAC OS System X operating system available from Apple Computer, one of many Linux-based operating system distributions, for example, the Enterprise Linux operating system available from Red Hat Inc., a Solaris operating system available from Sun Microsystems, or a UNIX operating system available from various sources. Many other operating systems may be used, and embodiments are not limited to any particular implementation.

The processor and operating system together define a computer platform for which application programs in high-level programming languages may be written. These component applications may be executable, intermediate, for example, C–, bytecode or interpreted code which communicates over a communication network, for example, the Internet, using a communication protocol, for example, TCP/IP. Similarly, aspects in accord with the present invention may be implemented using an object-oriented programming language, such as .Net, SmallTalk, Java, C++, Ada, or C# (C-Sharp). Other object-oriented programming languages may also be used. Alternatively, functional, scripting, or logical programming languages may be used.

Additionally, various aspects and functions in accordance with the present invention may be implemented in a non-programmed environment, for example, documents created in HTML, XML or other format that, when viewed in a window of a browser program, render aspects of a graphical-user interface or perform other functions. Further, various embodiments in accord with the present invention may be implemented as programmed or non-programmed elements, or any combination thereof. For example, a web page may be implemented using HTML while a data object called from within the web page may be written in C++. Thus, the invention is not limited to a specific programming language and any suitable programming language could also be used. Further, in at least one embodiment, the tool may be implemented using VBA Excel.

A computer system included within an embodiment may perform additional functions outside the scope of the invention. For instance, aspects of the system may be implemented using an existing commercial product, such as, for example, Database Management Systems such as SQL Server available from Microsoft of Seattle Wash., Oracle Database from Oracle of Redwood Shores, Calif., and MySQL from MySQL AB of Uppsala, Sweden or integration software such as Web Sphere middleware from IBM of Armonk, N.Y. However, a computer system running, for example, SQL Server may be able to support both aspects in accord with the present invention and databases for sundry applications not within the scope of the invention.

Example System Architecture

Figure 2:
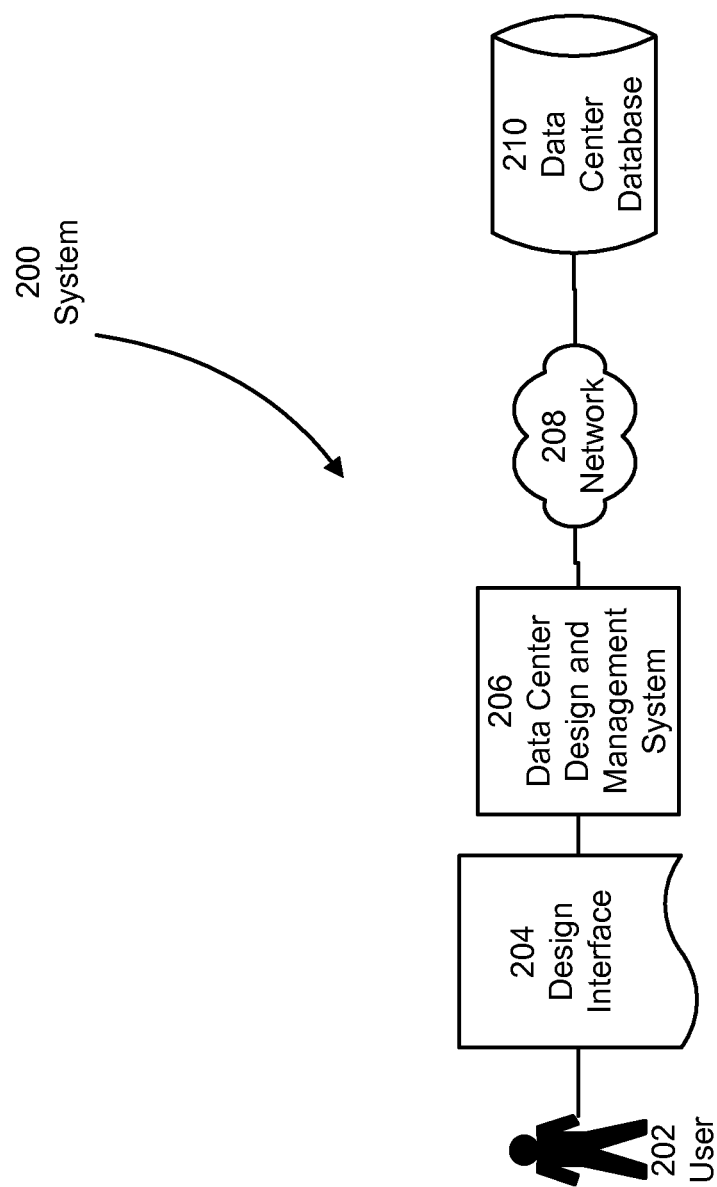
FIG. 2 is a schematic of one example of a distributed system including a data center management system.

FIG. 2 presents a context diagram including physical and logical elements of distributed system 200. As shown, distributed system 200 is specially configured in accordance with the present invention. The system structure and content recited with regard to FIG. 2 is for exemplary purposes only and is not intended to limit the invention to the specific structure shown in FIG. 2. As will be apparent to one of ordinary skill in the art, many variant system structures can be architected without deviating from the scope of the present invention. The particular arrangement presented in FIG. 2 was chosen to promote clarity.

Information may flow between the elements, components and subsystems depicted in FIG. 2 using any technique. Such techniques include, for example, passing the information over the network via TCP/IP, passing the information between modules in memory and passing the information by writing to a file, database, or some other non-volatile storage device. Other techniques and protocols may be used without departing from the scope of the invention.

Referring to FIG. 2, system 200 includes user 202, a design interface 204, a data center design and management system 206, a communications network 208 and a data center database 210. System 200 may allow user 202, such as a data center architect or other data center personnel, to interact with interface 204 to create or modify a model of one or more data center configurations. According to one embodiment, interface 204 may include aspects of the floor editor and the rack editor as disclosed in Patent Cooperation Treaty Application No. PCT/US08/63675, entitled METHODS AND SYSTEMS FOR MANAGING FACILITY POWER AND COOLING, filed on May 15, 2008, which is incorporated herein by reference in its entirety and is hereinafter referred to as PCT/US08/63675. In other embodiments, the design interface 204 may be implemented with specialized facilities that enable user 202 to design, in a drag and drop fashion, a model that includes a representation of the physical layout of a data center or any subset thereof. This layout may include representations of data center structural components as well as data center equipment. The features of the design interface 204, as may be found in various embodiments in accordance with the present invention, are discussed further below. In at least one embodiment, information regarding a data center is entered into system 200 through the interface, and assessments and recommendations for the data center are provided to the user. Further, in at least one embodiment, optimization processes may be performed to optimize cooling performance and energy usage of the data center.

As shown in FIG. 2, data center design and management system 206 presents the design interface 204 to the user 202. According to one embodiment, the data center design and management system 206 may include the data center design and management system as disclosed in PCT/US08/63675. In this embodiment, the design interface 204 may incorporate functionality of the input module, the display module and the builder module included in PCT/US08/63675 and may use the database module to store and retrieve data.

As illustrated, the data center design and management system 206 may exchange information with the data center database 210 via the network 208. This information may include any information required to support the features and functions of the data center design and management system 206. For example, in one embodiment, data center database 210 may include at least some portion of the data stored in the data center equipment database described in PCT/US08/63675. In another embodiment, this information may include any information required to support the design interface 204, such as, among other data, the physical layout of one or more data center model configurations, the production and distribution characteristics of the cooling providers included in the model configurations, the consumption characteristics of the cooling consumers in the model configurations, and a listing of equipment racks and cooling providers to be included in a cluster.

Data center database 210 may take the form of any logical construction capable of storing information on a computer readable medium including, among other structures, flat files, indexed files, hierarchical databases, relational databases or object oriented databases. The data may be modeled using unique and foreign key relationships and indexes. The unique and foreign key relationships and indexes may be established between the various fields and tables to ensure both data integrity and data interchange performance.

The computer systems shown in FIG. 2, which include data center design and management system 206, network 208 and data center equipment database 210, each may include one or more computer systems. As discussed above with regard to FIG. 1, computer systems may have one or more processors or controllers, memory and interface devices. The particular configuration of system 200 depicted in FIG. 2 is used for illustration purposes only and embodiments of the invention may be practiced in other contexts.

Thus, embodiments of the invention are not limited to a specific number of users or systems.

Co-Location Architecture

As discussed above, an operator of a critical building, such as a data center, needs to balance multiple variables such as reliability, performance, risk profile, and cost. In systems and methods provided herein, these variables may be measured and displayed as a metric or performance indicator and can be changed independently. However, a change of one variable may have an impact on the remaining variables. For example, each of the three variables may be important to the critical building operator or owner. By offering high reliability of uptime, the critical building owner may need more capital equipment to support increased uptime, which in turn results in increased costs to the user. The measurement and management of this cost is important to the owner, as this allows the owner to accurately charge users of the critical building for the equipment usage.

Another important variable to consider is the building operator's risk profile. The risk profile is an intangible value that the building operator uses in making decisions in changing the remaining variables. In one example, the risk profile informs the operator of the amount of risk the operator can take in decreasing the reliability at the expense of lowering cost for the end use customer. The risk profile may be based on the user or customer knowledge of the architecture, which drives the operator's decision-making process regarding reliability and cost. In one example, a downtime event for a co-location facility can have a serious impact on business operations and potential loss of revenue. For example, a customer company in the Energy and Telecommunications sector, as a result of a downtime, may lose $2 million per hour in revenue and may suffer additional losses due to damage caused to the company's reputation or brand. Hence, in this example, almost any downtime is unacceptable for the customer, and the risk profile for a building (or selected portion of the building) having this company as a customer is low.

Further, users of co-location architecture management systems and methods provided herein may have varying roles and may change variables differently based on individual needs. For example, users having IT management roles may request additional capacity to be added to the critical building to sustain the current demand for services. In turn, users having building management roles may manage the physical addition of equipment to satisfy the additional capacity. In this example, both users may influence reliability and cost in different ways and both can manage and monitor the effects on the variables of reliability, performance, risk profile, and cost.

Figure 3:
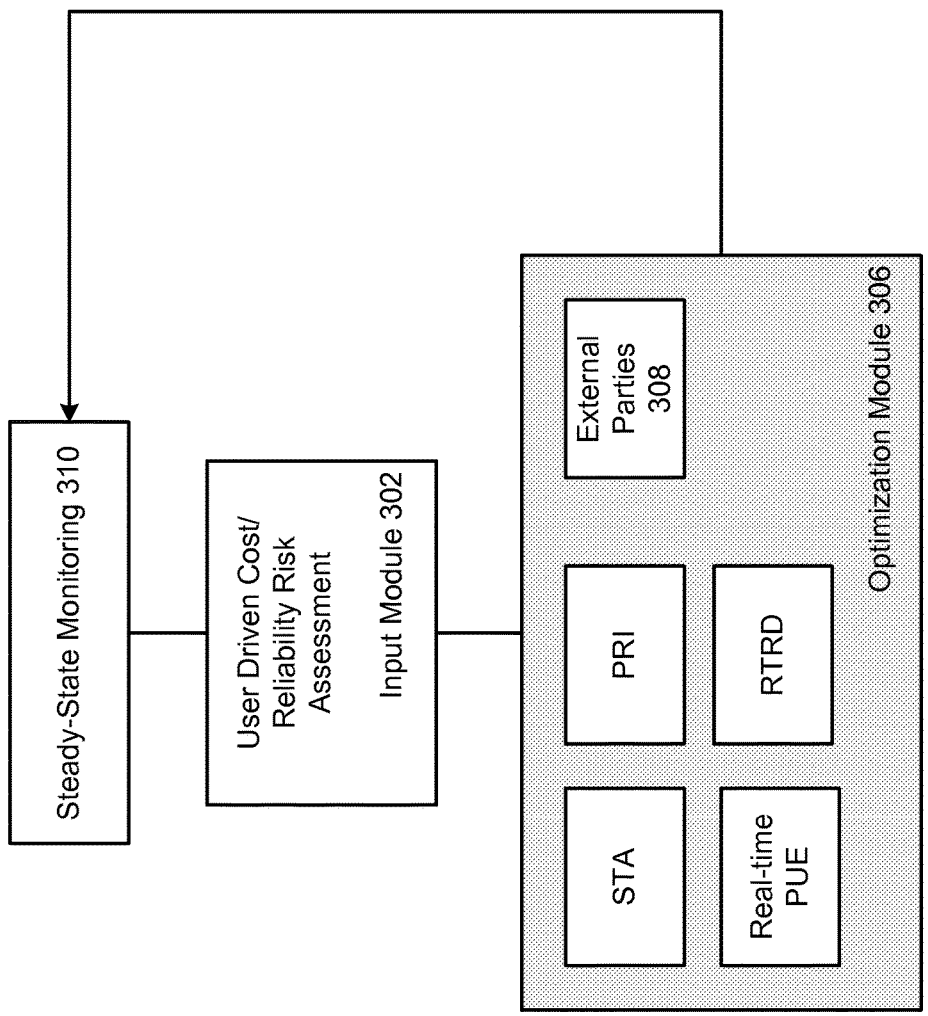
FIG. 3 is a block diagram of one example of an optimization system in accordance with one embodiment.

FIG. 3 shows a block diagram of an example of a co-location architecture optimization system 300, in which various aspects and functions in accord with the present invention may be practiced. The optimization system includes an input module 302, an optimization module 306, an output module 308, and a steady-state monitoring module 310.

The input module 302 allows a user to input a risk profile, reliability needs, and cost targets for a critical building, as well as data describing the physical layout and electrical and cooling systems in the facility. The optimization module 306 may receive a request from the user to perform an analysis on the input variables. The input module 302 provides the user input to the optimization module 306.

In one example, the optimization module 306 can calculate a Power Reliability Index (PRI) metric, a Power Usage Effectiveness (PUE) metric, a Real Time Redundancy (RTRD) metric, a Sweating The Assets (STA) metric and a cost analysis report. The PRI metric provides data center operators with a real-time metric that summarizes the overall risk or performance of their electrical systems reliability. Methods of calculating a new PRI metric, are described further below with reference to FIGS. 32-36. In one embodiment, the new PRI metric is a measure of instantaneous power reliability, determined based on a vector of power quality values. In another embodiment, the optimization module 306 uses the vector of power quality values to determine a PRI summary value by combining the power quality values with other information such as the redundancy of electrical network and the severity of power quality deterioration. In an alternative embodiment, the PRI metric may be determined using existing methods that predict the number of hours of total power failure at one or more critical loads. In yet another embodiment, the power quality values can be used to complement the existing PRI metric by providing additional insight into the causes of potential failures.

RTRD metric is focused on determining reliability and analyzes changes in the electrical system in real-time to ensure redundancy will not be impacted. RTRD metrics are determined using a method described further below with reference to FIGS. 15-22C. PUE is a measure of energy efficiency of a data center following industry-adopted recommendations. A modified PUE metric may also provide adjusted values that take into account differences in redundancy architectures and weather profiles between data centers. PUE metrics are determined using a method described further below with reference to FIGS. 10-14. The STA metrics provide a measure of reliability and cost/energy savings to the end user. STA metrics are determined using a method as described further below with reference to FIGS. 23-31. As described further below, the metrics of STA, PRI, PUE are configured to work together to fully optimize the electrical system and to give the user the best solution for their electrical needs, as balanced by both reliability and cost.

The optimization module 306 analyzes the change provided by the user in the electrical system using the STA, PRI, PUE and RTRD metrics and determines the impact of the change to the electrical network. In one example, the impact on the electrical network may be displayed to the user and the user may be prompted for further input. In addition, the optimization module 306 may optimize the electrical network based on optimal measures of the STA, PUE, PRI and RTRD and provide an updated electrical system to the user.

The location analysis 304, may adjust the analysis provided by the optimization module 306 to accommodate for specific weather profiles, country specific environments, as well as other location specific issues. For example, as further described below, the PUE metric may be adjusted by the differences in weather profiles for data centers in different locations. In one example, different weather profiles may factor in different HVAC equipment energy consumption values in warm or cold environments.

In one example, the impact on the electrical network, as well as the updated electrical network can be provided to one or more external parties via the output module 308. The external parties can review and implement any changes recommended by the optimization module 306. In at least one example, one or more external entities can be prompted for input, such as authorization before one or more of the changes can be implemented. In one example, some of the implementation or authorization functions can be automated removing the need for input from a user or external entities, for example by preset logic or set-points.

The steady-state monitoring module 310 may monitor the electrical system at steady state. The steady-state monitoring module 310 may receive one or more alerts from the electrical system if any variables fall below and/or increase above a threshold. The steady-state monitoring module may continually monitor for changes to the electrical system and the impact of those changes to each of the metrics STA, PRI, PUE to ensure the metrics comply with user requirements. In one example, if errors are reported by the steady-state monitoring module 310 the user and/or external parties are alerted so appropriate action can be taken.

In one example, the co-location architecture optimization system 300 operates using an iterative feedback loop. For example, the optimization module may calculate a change that needs to be implemented in the electrical system. The steady-state monitoring module 310 monitors the impact of the changes and provides feedback to either the optimization module 306 or provides notification to a user in the form of an alarm or alert (e.g. maintenance personnel, third party services, product manufacturer, customer, etc.). As the result of the notification, the user may provide new or additional inputs to the optimization module or request an intervention to make a change in the electrical system.

Figure 4:
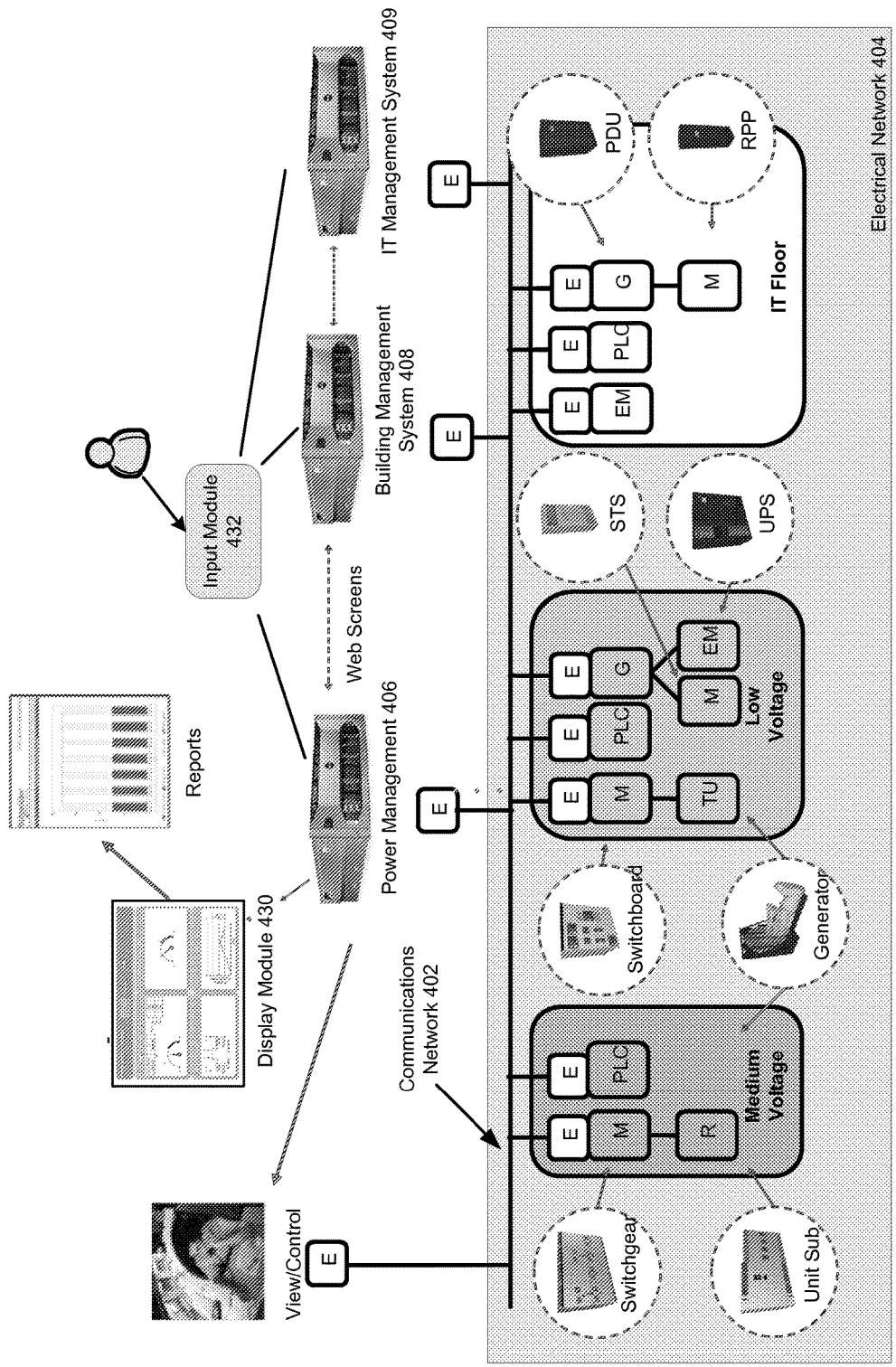
FIG. 4 is a block diagram of co-location electrical architecture including a monitoring and control systems in accordance with one embodiment.

FIG. 4 shows one example of distributed co-location architecture 400. The distributed co-location architecture may include a communications network 402, an electrical network 404, one or more monitoring and control systems including a power management system 406, a building management system (BMS) 408 and a IT management system 409. The electrical network 404 may be monitored by one of the monitoring and control systems, such as the power management system 406, which may enable a user to monitor and store data/information from distribution points and assets. The co-location architecture optimization system 300, as described in more details below, may be incorporated into one or more of the monitoring and control systems. Alternatively, the optimization system 300 may be a stand-alone system and may produce one or more outputs to the power management system 406 which may be provided to the building management system 408 and/or the IT management system 409 and/or displayed on the display module 430.

The user, via one of the monitoring and control systems, may also control and manage various assets, run reports on using information received, setup alarms, as well as perform other functions. The monitoring and control system such as the building management system (BMS) 408 may control and monitor the mechanical and electrical equipment for an IT floor, such as cooling, lighting, power systems, fire systems, and security systems. The monitoring and control system may be a closed building system, or connected to the internet for remote access. The electrical network 404, the building management system 408, the IT management system 409 and the power management system 406 may communicate via the communications network 402. In addition, the communications network 402 may be configured to transmit any data, information, commands, alerts or any other forms of communications between users, components and equipment included in the co-location architecture.

Figure 5:
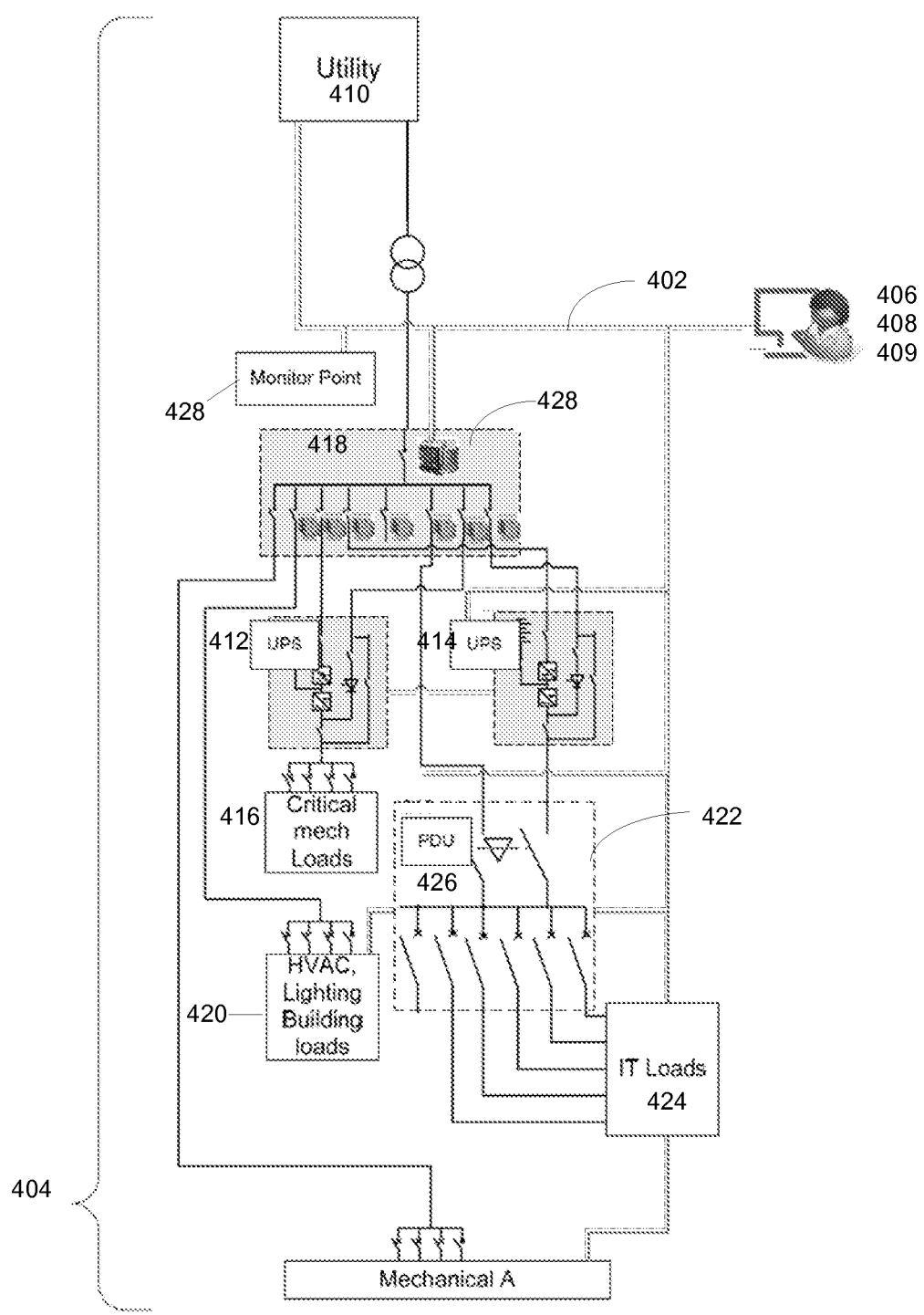
FIG. 5 is a block diagram of an electrical network system in accordance with one embodiment.

FIG. 5 shows one example of the electrical network 404 for a co-location critical building, such as a data center. The electrical network 404 is coupled to a utility 410, which provides power through a medium-voltage (MV) network loop to all of the critical and non-critical components of the data center. The electrical network 404 includes a variety of different types of electrical equipment, including one or more Uninterruptible Power Supply (UPS) systems 412 and 414, with critical mechanical loads 416, electric switchboards 418, Heating, Ventilation, and Air conditioning (HVAC) systems, lighting and building loads 420, a remote power panel (RPP) 422 and its associated IT loads 424 and Power Distribution Units (PDU) 426 with monitoring points 428 distributed throughout. Additionally, the electrical space is outfitted with mechanical equipment to maintain optimal ambient operating conditions. Systems and elements of the data center are integrated to provide a high level of availability without compromising on efficiency.

The UPS 412 may provide support for critical mechanical loads 416. One example of a UPS that can be used in the electrical network is the MGE Galaxy 5000 UPS, manufactured by Schneider Electric. The UPS 412 may provide reliable and conditioned power to downstream PDU 426. The PDU 426 may power the RPP 422 and the associated IT loads 424. One example of the PDU 426 that can be used in the electrical network is the APC InfraStruXure PDU manufactured by Schneider Electric. A separate UPS may allow assets and equipment, such as the chilled water pumps, to have an extended ride-through time for the cooling system. The switchboards 418 may divide the main current provided to the switchboard 418 from the utility 410 into smaller currents for further distribution to the data center and to provide switching, current protection and metering for these various currents.

A network of intelligent devices and power meters, shown in FIG. 5 as the monitoring points 428, may be included throughout the electrical network 404, which may be connected together by the communication network 402. The entire electrical network 404 may be monitored by one of the monitoring and control systems, via the monitoring points 428. In one embodiment, the monitoring and control systems comprise software programs, communication gateways, metering, and digital protection devices, and can also interface with external monitoring devices. Also, the monitoring and control systems may receive data or information directly from equipment with embedded metering, such as UPS modules, generator controllers, PDUs, rack PDUs as well as other equipment. Other management systems, such as a building management system or IT management system, can connect to the monitoring and control system using various methods. In one example, management systems have direct data access via the monitoring points 428 received via the communication network 402. In another example, management systems included embedded web pages, which are included into other monitoring or management systems, such as the power management system 406. The monitoring and control system may include a combination of software and hardware. The data center can also have redundant utility feeds along with a dedicated set of redundant generators and associated Automatic Transfer Switch.

The monitoring and control system can monitor utility feeds, including surge protectors, trip units, and transformers and can detect ground faults, voltage sags, voltage swells, momentary interruptions and oscillatory transients, as well as fan failure, temperature, and harmonic distortions in the output. The monitoring and control system can also monitor generators, including outputs, protective relays, battery chargers, and sensors (for example, water, and fuel sensors). The monitoring and control system can further detect generator conditions including reverse power, temperature, over voltage and under voltage conditions, over speed, ambient temperature. The monitoring and control system can further monitor Transfer Switches (TS) including parallel switch gear, and Static Transfer Switches (STS) and can detect status change in the TS, as well as Silicon Controlled Rectifier (SCR) status, summary alarms, alarm condition, and test positions, among other information.

In addition, the monitoring and control system can monitor UPS units, and batteries and can detect ambient temperature, output voltage and current and can further detect various alarms such as those relating to the battery, bypass alarms, summary alarms, online alarms, Even Harmonics Input alarms, Total Harmonic Distortion (MD) output alarms, voltage sag and voltage swell alarms, among other alarms. Further, the monitoring and control system can monitor cooling systems such as various chillers, HVAC and cooling systems and can determine status, input power, input THD, and temperature, among other information. The monitoring and control system can also monitor PDUs and can determine transformer over-temperature, emergency power off conditions, input power, input THD, circuit loading, and overload limits. Finally, the monitoring and control system can monitor facilities and equipment racks and can determine cost analysis metrics in real time, such as watts/sq. ft, benchmark performance, and per-circuit kilowatt (kW)/kilowatt-hour (kWh) billing.

The monitoring and control system, via the input module 432, may accept input from different users having different roles. For example, the IT manager may request changes to the system, such as additional loads or capacity to the system, while building operators or facility managers may be responsible for implementing the changes and have additional requirements such as reliability or cost. The monitoring and control system accepts input from the building operators and IT managers reflecting the desired changes to the electrical system via the power management system 406 or the respective other management systems such as the building management system 408, or the IT management systems 409.

The monitoring and control system, via the display module 430, may display various display screens to the user relating to the electrical network 404. In one example, the display screens may include a dashboard screen, an electrical one-line screen; a power flow screen, a equipment detail screen and alarm summary screen. The monitoring and control system may also produce various reports and may display them to the user via the display screen. For example, the reports may include power capacity, power incidents, power quality (PQ) events, and various trending statistics.

Figure 6:
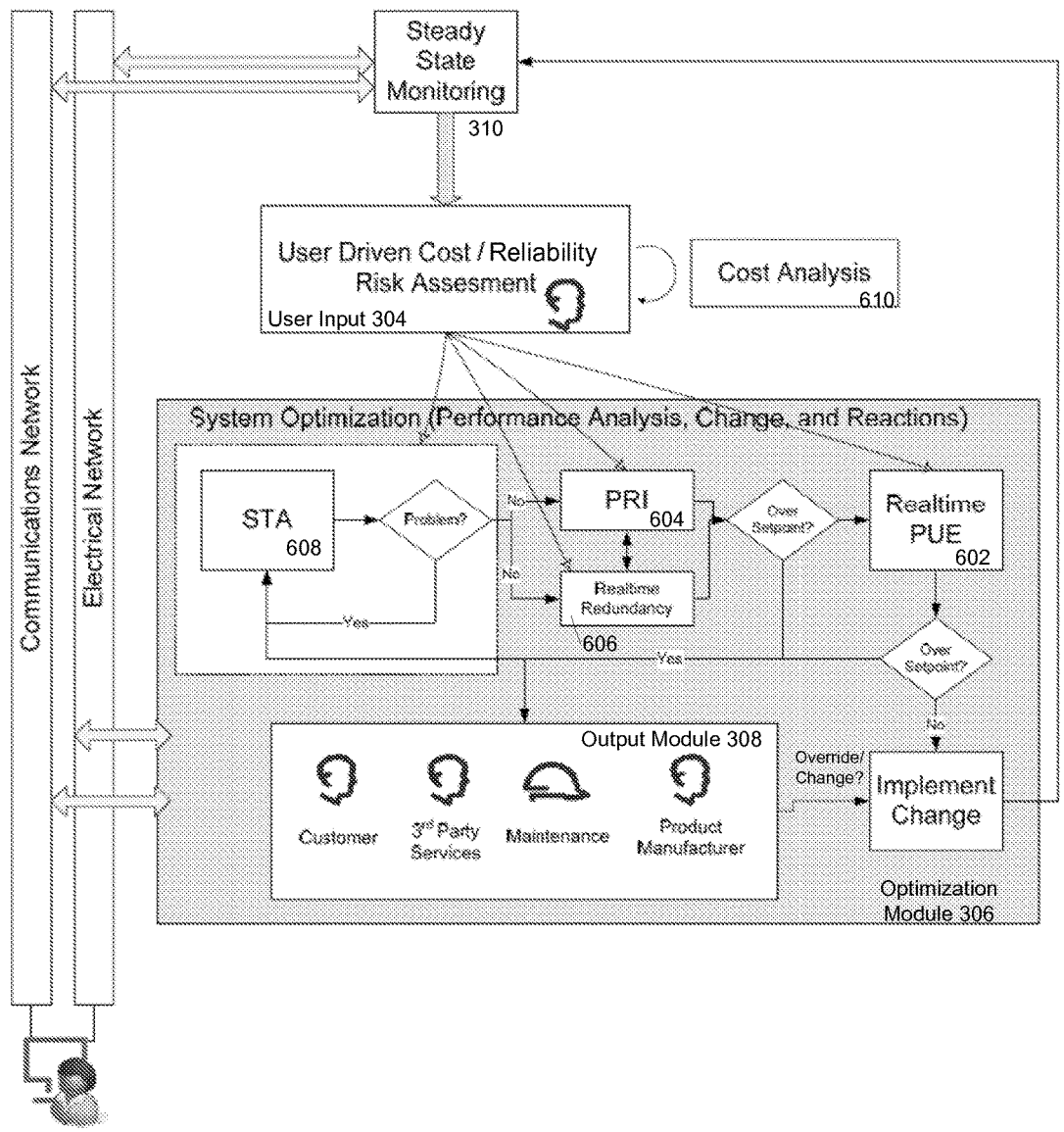
FIG. 6 is a block diagram of an optimization system in accordance with one embodiment.

As noted above, the co-location architecture optimization system 300 may be incorporated into the monitoring and control system. FIG. 6 shows the co-location architecture optimization system 300 in further detail. The optimization system 300 in addition to the input module 304, the optimization module 306, the output module 308 and the steady-state monitoring module 310, may include a PUE component 602, a PRI component 604, a RTRD component 606, a STA component 608 and a Cost Analysis component 610.

Figure 7:
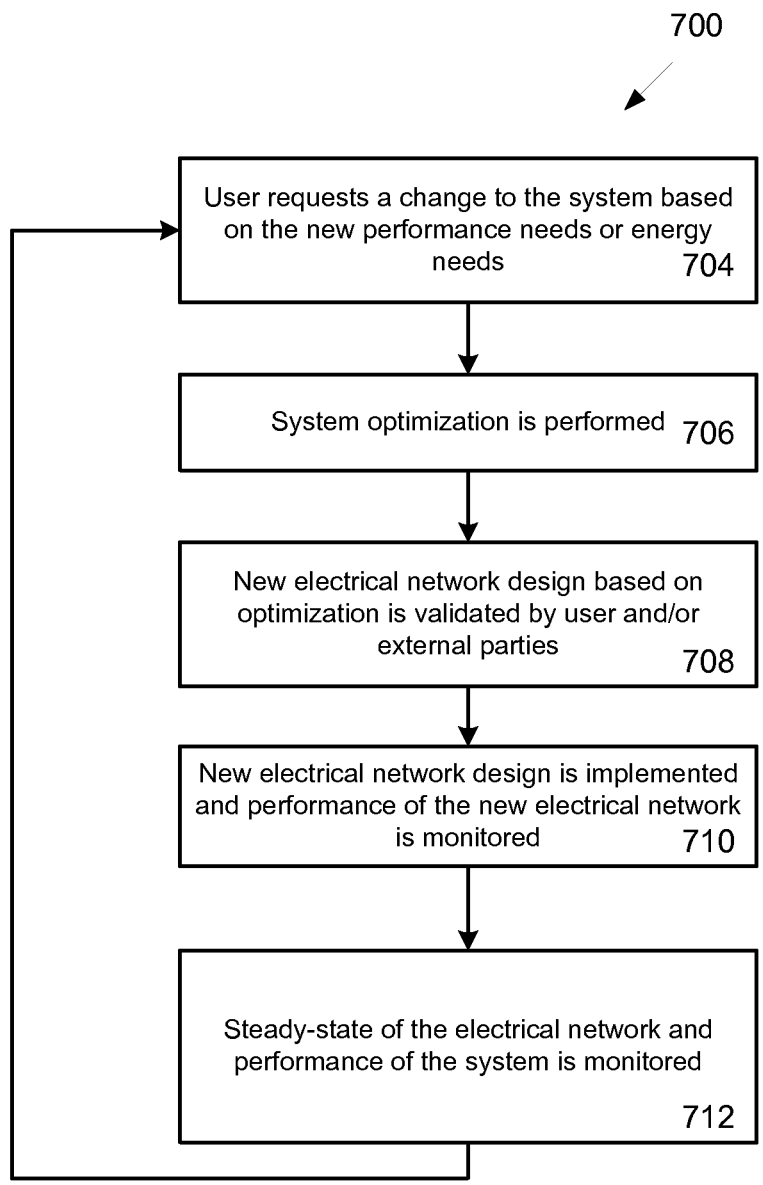
FIG. 7 is a flowchart of a method of optimizing an electrical network system in accordance with one embodiment.
Figure 8A:
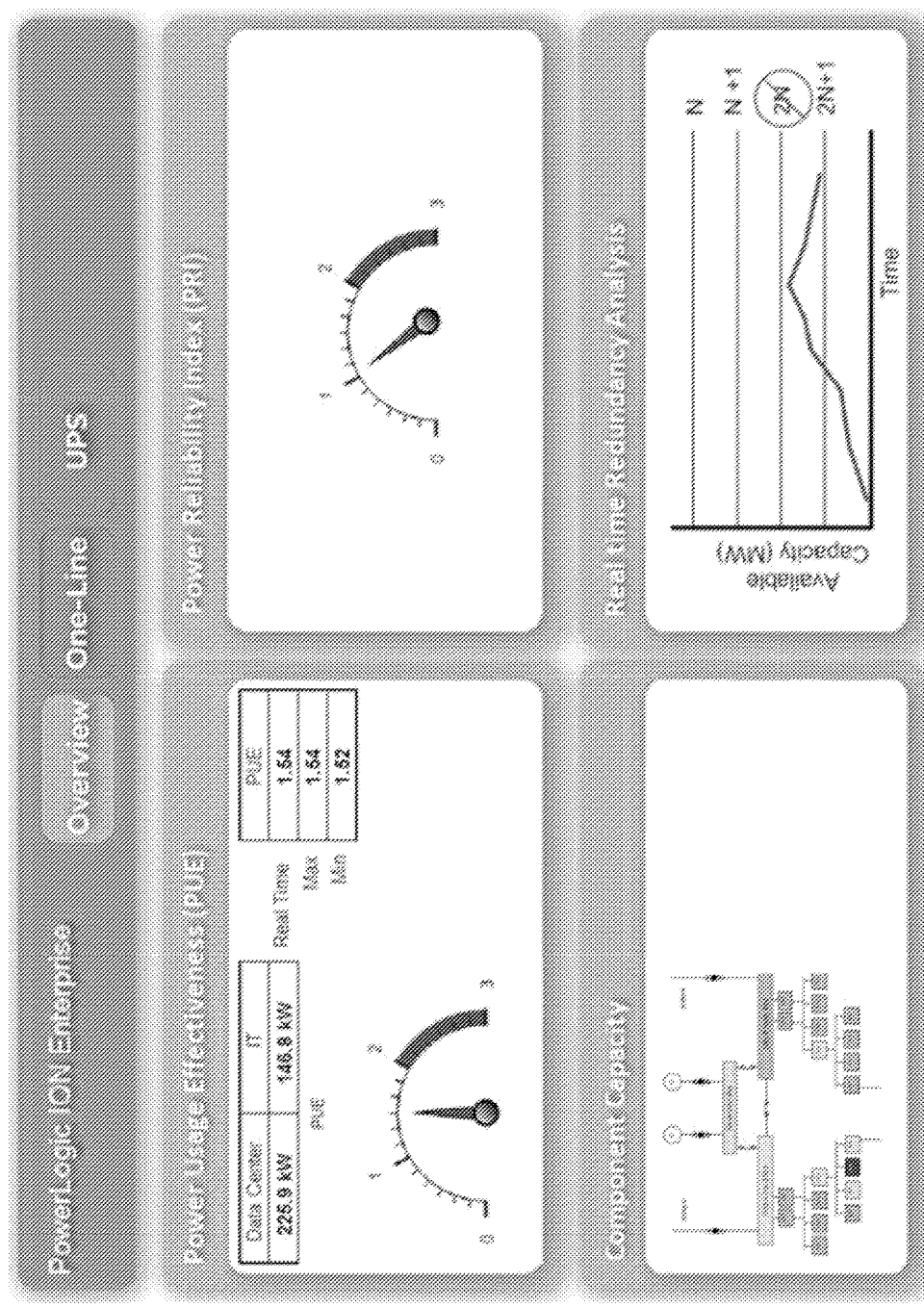
FIG. 8A is a diagram of a graphical interface in accordance with one embodiment.

FIG. 7 illustrates one embodiment of a method of optimizing the co-location architecture using for example the optimization system 300 and/or the monitoring and control system. In step 704, a user may request a change to the electrical network 404. The user may make this request via any monitoring and control system, such as the power management system 406, the building management system 408 or the IT management system 409 via the input module 432 or the input module 302. The change to the electrical network 404 may be based on changed needs of the user such as additional performance or energy needs. For example, a user may request to add a rack to increase capacity. FIG. 8A shows one example of displaying the PRI, PUE and RTRD analysis to a user. Any change requested by the user can be simulated in real time and displayed to the user on one of the displays. If any changes to the building operators key variables (PRI, PUE, $/kwh) go beyond the alarm set points, the output module can alert on the error and the appropriate parties (operator, user, external party, etc) can take corrective action.

In step 706, the optimization module 306 in the co-location architecture optimization system 300 performs an analysis of the requested change and of the electrical network 404 to provide an optimization analysis and implement the requested change in the electrical network 404. The optimization analysis may include a number of steps as further described below. As a result of the optimization analysis an updated electrical network 404 is generated.

A visual representation of the analysis may be generated by the optimization system 306 and provided to the user via the display 430. For example, the optimization module 306 determines a location in the electrical network 404 where an additional load can be safely added. The optimization module 306, via the display 430, may show to the user a visual representation of the additional load within a visual representation of the electrical network. In addition, the optimization module 306 may simulate the capacity of the updated electrical network with the additional load and provide to the user, via the display, an updated metric.

The optimization module 306 may perform one or more steps relating to one or more components including the PUE component 602, the PRI component 604, the RTRD component 606 and the STA component 608. In one example, the optimization module 306 invokes one or more of the components based on the change request of the user and the associated impact of the request to the electrical network 404. In one example, the user can request or simulate a change to the electrical network and the optimization module 306 can invoke the real-time PUE component 602. The real-time PUE component 602 may determine an updated and reliability-adjusted value of PUE to the optimization module 306 or the user. The optimization module and/or the user may determine if the reliability-adjusted PUE metric is over a predetermined set point. The PUE component 602 and associated calculations will be described in more detail below with reference to FIGS. 10-14.

In another example, the user can request or simulate a change to the electrical network 404, and the optimization module can invoke the RTRD component 606. The RTRD component 606 can determine a value relating to the updated redundancy of the electrical network 404. The updated redundancy value is compared to a redundancy limit set for the electrical network. The redundancy component can provide the optimization module and/or the user with an output relating to whether the updated system is within the set redundancy limits for the electronic network. The RTRD component 606 and associated calculations will be described in more detail below with reference to FIGS. 15-22C.

In another example, the user requests or simulates a change to the electrical network 404, and the optimization module can invoke the STA component 608. The STA component 608 may be invoked if the requested change to the electrical network 404 is found to be exceeding design capacity. In this example, the STA component 608 provides an analysis of the system and suggests to the user a location in the electrical network where increased capacity can be added without exceeding design capacity or safe capacity of the system. The STA component 608 and associated calculations will be described in more detail below with reference to FIGS. 23-31.

In another example, the user can request or simulate a change to the electrical network 404, and the optimization module 306 can invoke the PRI component 604. The PRI component 604 can provide the optimization module and/or the user with a real-time metric summarizing the overall risk or performance of their electrical systems reliability. The PRI component 604 and associated calculations will be described in more detail below with reference to FIGS. 32-36. As noted above, in one embodiment, the PRI component 604 determines a new PRI metric, which includes a vector of power quality values determined and estimated from power quality events, and which further provides a measure of instantaneous power reliability. In another embodiment, the PRI component 604 uses the vector of power quality values, determined using the methods described below, to determine a PRI summary value by combining the power quality values with other information such as the redundancy of electrical network and the severity of power quality deterioration. The PRI summary value may be specific to the electrical network architecture, specific components of the electrical network architecture, and/or the desired level of redundancy in the electrical network. Alternatively, the PRI metric may be determined using existing methods of Mean Time Between Failure (MTBF), Mean Time to Maintain (MTM), Mean Time to Repair (MTR), and inherent Availability (Ai). These average metrics can be used to determine the existing PRI metric that is based on a prediction of the number of hours of total power failure at one or more critical loads.

Each of the components (PUE component 602, the PRI component 604, the RTRD component 606 and the STA component 608) may interact with, and have an effect on, each other component, respectively, regardless of how the user selects to measure the impacts of the system change. For example, the design change made by the STA component 608 and associated system changes can trigger the PRI component 604 and/or Real-time PUE component 602 to calculate an updated PRI metric and an updated PUE metric.

In another example, the RTRD component 606 and PRI component 604 can operate in unison. For example, if the PRI metric is within a defined threshold but the redundancy metric is not, the optimization module 306 can indicate or output an error and reconfigure the electrical network 404 that results in both the PRI metrics and the redundancy metrics meeting the set point. In each case, if the PRI or PUE metrics are above a set point, the information is fed back to the STA component and a new design is created.

Figure 8B:
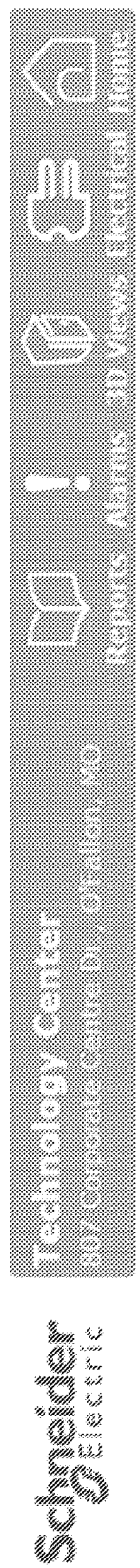
FIG. 8B is a diagram of a cost analysis report in accordance with one embodiment.

In another example, a cost analysis report is also generated for the user by the cost analysis component 610. It is appreciated that there is a cost trade-off associated with a user's decision to make changes to the electrical network. For example, as the user adds assets (such as UPS units or PDUs), efficiency of the data center may decrease, but reliability and redundancy may increase. The cost analysis component 610 may generate a cost report which may provide to the user a practical approach for making physical changes to the assets or the electrical network. The cost report may help the user to determine the type of expenditure to make, for example, a capital expenditure, a fixed cost expense, or a one time maintenance change. To provide the report, the cost analysis component 610 can simulate the injection of a system change, and complete the optimization calculation by the optimization module 306, and then display the cost change as a result of the injected system change. One example of a cost analysis report for a given data center configuration is shown in FIG. 8B. The report shows IT load costs, non-IT load Costs and overall data center load costs. In this example, the costs are shown in dollars per hour.

For example, a data center with a 1 MW design capacity having a 2N redundancy design may need two UPS units of 1 MW each to provide sufficient power to the data center. In this example, if one UPS fails, the other UPS takes over, keeping the data center operational. An alternate design may include three UPS units of 0.5 MW each. Similar to above, if one UPS fails, two other UPS units remain operational and can support the 1 MW load of the data center. The cost analysis component 610 can provide a report for the user that allows the user to consider the changes in the capital and other associated maintenance expenses associated with the two designs. The cost analysis can also account for the real-life influences on the electrical network (breaker changes, maintenance cost reductions, environmental setpoint changes, etc.). In some examples, there can be cases where the maintenance costs of keeping the desired redundancy level for an existing electrical system outweigh the capital cost to change the system to an alternative design and continue with the same redundancy level.

In step 708, the updated electrical network 404 is validated. In one example, the updated electrical network 404 is validated automatically, by using one or more set points. In another example, the updated electrical network 404 is validated manually by users or external parties. During the validation step 708, the optimization module 306 may provide a number of safeguards or error checks on the updated co-location architecture. For example, the comparative checks such as the "Over set-point?" check, may warn the user or stop the user from making a change if the user selected values exceeding a predefined threshold value. The optimization module 306 also provides a feedback loop, which prompts the user through a selection of multiple values until the co-location architecture is fully optimized based on the needs of the user. In one example, the set point checks can be automated by having the checks preset with limits and other logic tasks. The automation of the set point checks may remove the need for user interaction.

In one embodiment, the validation step 708 may need input from one or more external parties. The optimization module 306 may provide an output to the external parties, via the output module 308. In one example, the output may be in the form of visual display of one or more components including the PUE component 602, the PRI component 604, the RTRD component 606 and the STA component 608.

In another example, the output may be in the form of one or more prompts requesting a selection before implementing a change decision. The external parties may interact with the optimization module 306 or with the monitoring and control system either through automated steps or manually. For example, to ensure reliability, the STA component 608 may determine that to increase capacity of the electronic network a larger load may need to be placed on the UPS. An external party, such as maintenance personnel, may need to authorize this increase because increased capacity may cause an increase in UPS testing and maintenance. In one example, the authorization can be performed manually by a user. In another example, the authorization can be performed automatically by performing a check against a preset authorization set point. As a result of approving the increased capacity and associated increased maintenance needs, there may be additional operational costs to be taken into account.

In another example, to compensate for increased capacity, the optimization module 306 may suggest upgrading a circuit breaker to modify one or more of the set points (making wider or narrower). The external party, such as maintenance staff or original vendor service team, may need to authorize the upgrade before it can be scheduled and performed. In yet another example, the increased capacity may impact an end user customer. For example, a change to the electrical network 404 may result in a shut down of power. The external party, such as the end user customer, may need to confirm that a scheduled downtime of services is acceptable.

In step 710, the updated electrical network design is implemented with the changes requested by the user together with the optimization analysis performed by the optimization module 306. The implementation of the updated electrical network design may be performed by a building operator, and/or other parties. The implementation may include a physical change to the electrical network, such as installing additional equipment. The electrical network 404 is monitored to make sure that actual performance complies with the estimated optimization analysis.

In step 712, the steady-state of the electrical network and performance of the system is monitored using the steady-state monitoring component 310. It is appreciated that while an electrical system change can be simulated and validated, once a physical change is made, the electrical network can be monitored in real time to ensure that it maintains the required level of reliability and cost. For example, while the optimization module 306 may output a simulated PRI metric that is within range of the true PRI metric, in practice, operating conditions of the equipment may cause the PRI metric to deviate from the simulated values. Operating conditions may cause the equipment in the electrical network to be operating at a sub-standard level or not to the manufacturer's specifications. In addition, external factors may not be accounted for in the simulated model. One example of an external factor may be unaccounted additional loads on the electrical network, such as a personal portable heaters or coolers.

In one example, the steady-state monitoring component 310 may perform ongoing monitoring of the electrical network 404 to ensure that the PRI metric and the PUE metric maintain the required levels of reliability and cost. In this example, the PRI component 604 performs the functions of "safety backup" while the STA component 608 and the PUE component 602 are analyzed. The PRI metric can be simulated using a virtual system. The system can do this by adding in a rack and running a virtual system, allowing a user to test out an implementation of new loads in their building before turning them on in the physical data center. In practice, this estimated vs. actual PRI metric may be part of the user's failsafe calculation to ensure the steady state of the system is within the required boundaries of safe capacity and design capacity.

Figure 9:
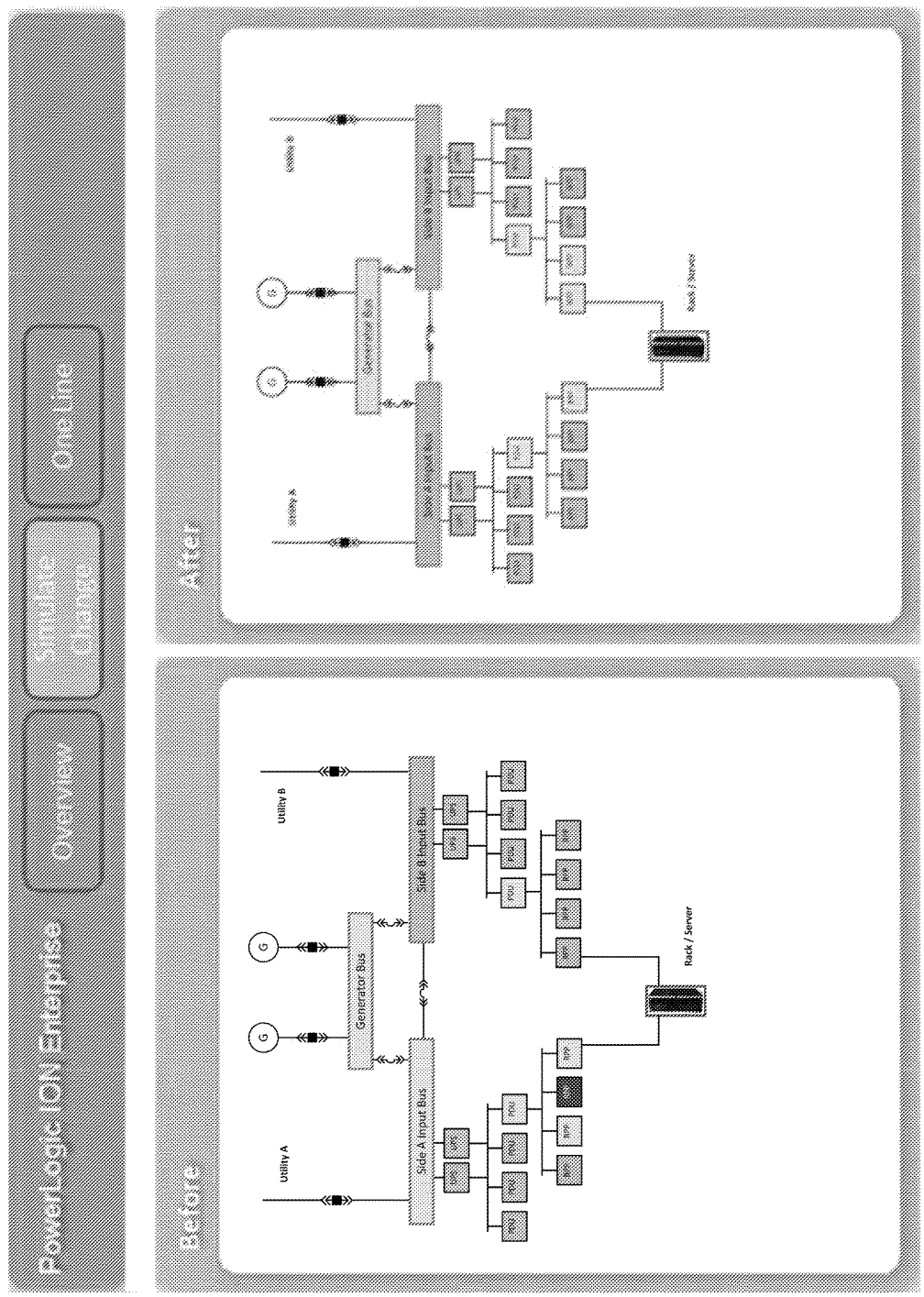
FIG. 9 is a diagram of a graphical interface in accordance with one embodiment.

FIG. 9 shows one display comparing the electrical network before and after the optimization module 306 performs the optimization on the change requested by the user. The requested change may be a load in the form of an additional server or rack. Before optimization is performed the rack draws from Side A resulting in Side A exceeding acceptable levels of reliability and cost. After the optimization is performed, the electronic network is rearranged so that Side B receives some of the load from the server rack. As a result both Side A and Side B are within acceptable levels of reliability and cost.

Determining Power Usage Efficiency (PUE)

Typical measurements of energy efficiency, such as the Power Usage Efficiency (PUE) metric and the Data Center Infrastructure Efficiency (DCIE), are industry-adapted performance metrics used to calculate the energy efficiency of a data center. These typical metrics suffer from a number of short comings as described below. According, the embodiments described herein provide adjusted PUE metrics and energy models that take into account different configurations of electrical system, differences in redundancy of the electrical systems and weather profiles between data centers in different locations. Energy models that calculate energy efficiency metrics, such as the PUE metric, may allow users to accurately compare energy efficiencies of various data centers with different electrical configurations, and to accurately detect changes in energy metrics over time.

In one embodiment, the PUE component 602 generates both adjusted and predicted energy efficiency metric values by gathering energy usage from different points in the electrical network, factoring in various conditions such as configuration, redundancy and weather profiles, generating an energy model to predict energy usage and monitoring the system continually to adjust the energy model to account for real-time operating conditions and allow the user to compare predicted and current energy usage.

In one example, the PUE component 602 may track the operation of the UPS units within a data center and build a model describing total energy use in both N+1 and N redundant architecture configurations. Even though the data center may normally operate at a redundancy level of N+1, the PUE component 602 can use this model to generate an adjusted energy efficiency metric for operation at an N redundancy level. In another example, the PUE component 602 may create a model of total HVAC energy use versus outdoor and server room temperature. Operational staff can compare model predictions of the energy efficiency metric versus actual measurements to more accurately track data center performance.

Figure 10:
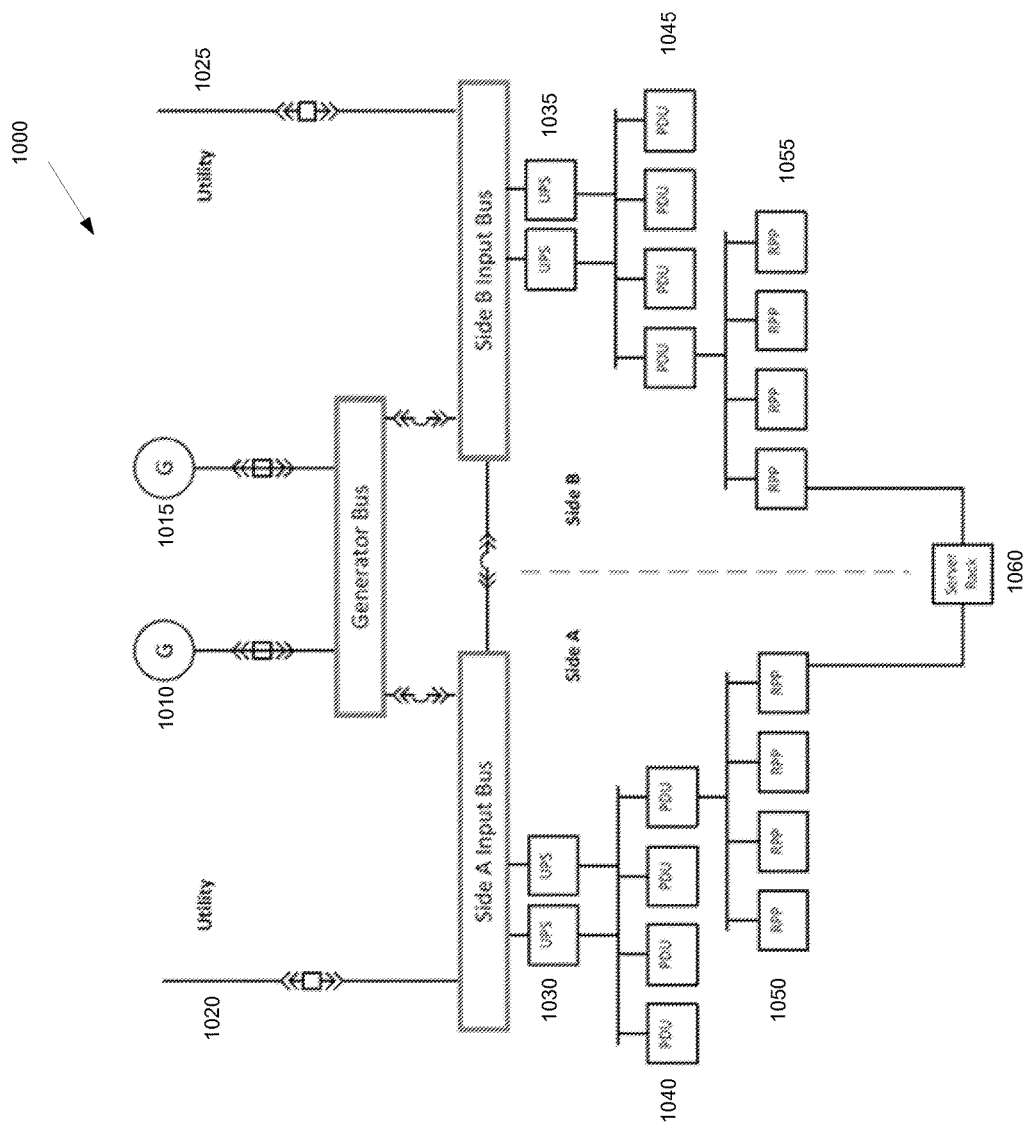
FIG. 10 is a block diagram of an electrical network in accordance with one embodiment.

FIG. 10 provides an overview of the main components in a data center electrical system with a 2N level of redundancy. With this level of redundancy, energy sources and electrical equipment on two "mirrored" sides of the electrical system (side A and side B) provide power to a piece of equipment, such as a server rack, with any one side capable of supplying all of the power needed by the rack. Various data center redundancy architectures can be used.

Electrical system 1000 shown in FIG. 10 includes primary energy sources (utility 1020, 1025), secondary energy sources (generator 1010, 1015), electrical distribution and backup equipment that provides redundancy (UPS units 1030, 1035; PDUs 1040, 1045; and Remote Power Panels (RPP) 1050, 1055) and server rack 1060. The energy sources utility 1020, 1025 and generators 1010, 1015 are interconnected with breakers such that any one of these sources can be connected to equipment and loads on side A or side B of electrical system 1000. Any one of the electrical sources is sized to carry the entire IT load in the data center, and the breakers may be used to connect active energy sources and disconnect failed energy sources. In addition to the equipment shown in electrical system 1000, various Heating, Ventilation, and Air Conditioning (HVAC) units can be installed at the data center to provide heating and cooling to IT loads and space within the data center. Other types of energy sources may be in use at the data center, including natural gas, steam, chilled water, solar and wind energy. Energy from the other energy sources may be converted to electricity and used to power loads connected to electrical system 1000, or may be used directly to provide non-electrical energy to equipment such as HVAC units.

Energy monitoring devices may be deployed at points in the electrical system 1000 in accordance with the guidelines found in the "Recommendations for Measuring and Reporting Overall Data Center Efficiency" report published by The Green Grid organization. These recommendations state that non-electrical energy is to be included in energy efficiency metrics, and energy monitoring devices are also deployed to non-electrical energy sources. The recommendations define the PUE metric, as follows:

$$PUE = \frac{\text{total } datacenter \text{ energy consumption or power}}{IT \text{ energy consumption or power}} \quad \text{Equation (1)}$$

The recommendations provide formal definitions for IT equipment, data center supporting infrastructure and physical boundaries within the data center to be included in energy use measurements. The recommendations also define four PUE measurement categories that vary from one another in both (a) the type of energy measurement used; and (b) the location within the data center energy systems in which the measurements take place. As an example, PUE category 1 notes that the IT energy consumption element of Equation (1) is the 12-month total kWh consumption measured at the UPS system output (i.e. the sum of the output of all UPS units). The total data center energy consumption is the 12-month total kWh consumption, and must include all energy types that enter the data center boundary.

To determine PUE category 1 for the data center electrical system shown in FIG. 10, in one example, the IT energy consumption is measured as the cumulative output of UPS units 1030 and UPS units 1035. The total data center electrical consumption can be measured as the cumulative input from utilities 1020 and 1025. The fuel consumed by generators 1010 and 1015 can be measured by one or more energy monitoring devices and included in the total data center energy consumption figure after conversion to kWh units and application of the weighting factors described in The Green Grid recommendations. In one example, if chilled water cooling providers were included in the data center to provide cooling energy to HVAC units, this energy can be measured by one or more energy monitoring devices and included in the total data center energy consumption figure after conversion to kWh units.

The goal of The Green Grid recommendations is to provide a common methodology for data center operators to calculate and report the energy efficiency of their data centers, presumably to facilitate comparisons between different data centers. As noted above, the methodology described by the recommendations, however, falls short of this goal in several aspects. First, the recommendations do not take into account the balance between energy efficiency and other desirable data center goals, such as redundancy and reliability. A data center employing electrical system architecture with greater redundancy, for example, is typically less energy efficient than one that does not, but this greater redundancy is not reflected in the PUE metric.

Second, the energy consumed by HVAC equipment in a data center depends not only on the efficiency of the units themselves, but also upon the weather profile of the data center location. A data center HVAC system is typically configured to maintain a constant temperature around IT equipment, but the energy required to do so depends on weather profile factors such as outdoor temperature. The impact of the weather profile of a data center location is also not reflected in the PUE metric described in the recommendations.

Finally, the Green Grid recommendations further fall short of their goal, by failing to measure energy consumption within a shorter time range. The time range for formal PUE metric calculations is 12 months. This time range, however, is too long for data center operators wanting to monitor and manage PUE levels within predefined targets.

PUE Metric Adjusted for Redundancy Architecture

Figure 11:
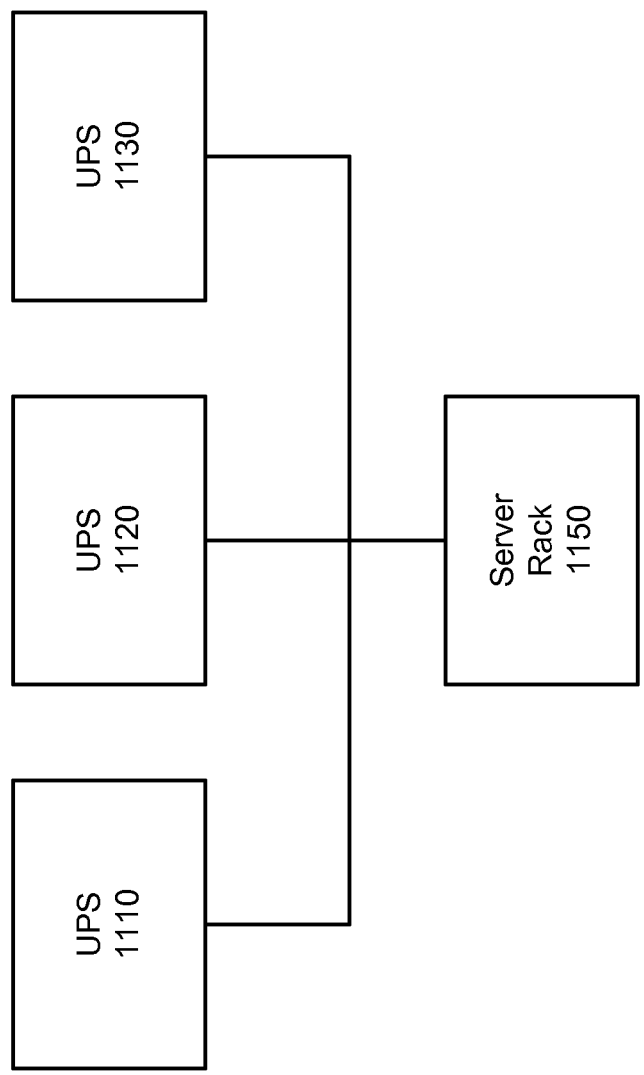
FIG. 11 is a block diagram of an electrical system used to demonstrate redundancy network in accordance with one embodiment.

FIG. 11 shows one example of an electrical system 1100 used to demonstrate an adjusted PUE metric that balances between energy efficiency and level of redundancy. The electrical system 1100 includes UPS units 1100, 1120 and 1130 that provide the energy needed by server rack 1150. The amount of power delivered to the UPS units 1100, 1120 and 1130 impacts the redundancy this arrangement of UPS units can provide to server rack 1150. For example, the server rack 1150 has a power demand of 200 kW and each UPS unit 1100, 1120 and 1130 delivers 100 kW. In this example, only two of the three UPS units are needed to meet the power demand of the server rack 1150. Hence, this electrical system provides N+1 redundancy. In another example, the server rack 1150 has a power demand of 300 kW. In this example, all three UPS units 1100, 1120 and 1130 need be in operation to meet the demand of the server rack 1150. Hence, this electrical system provides N redundancy.

Figure 12:
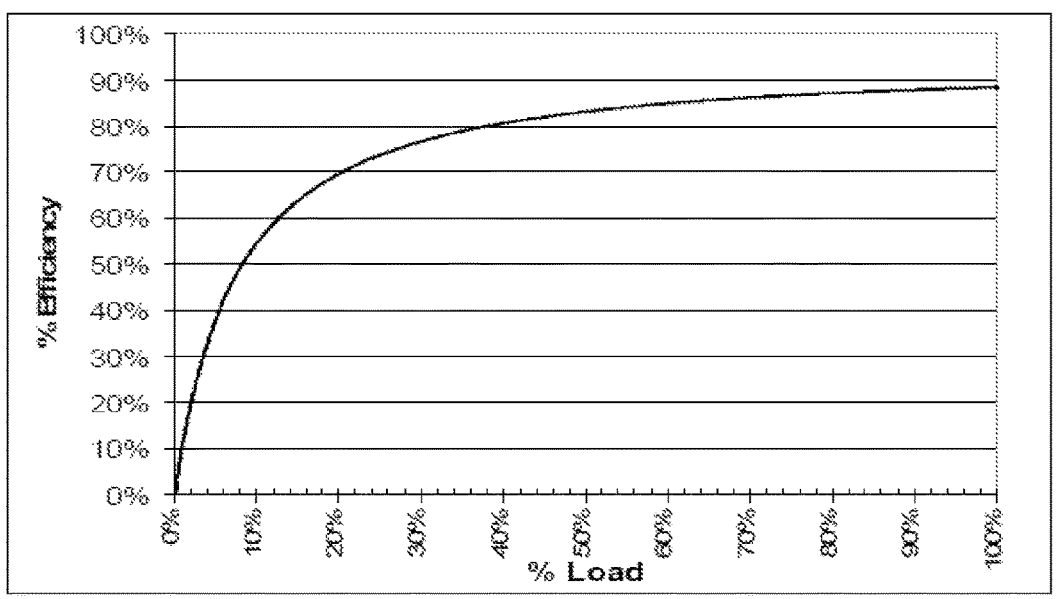
FIG. 12 is a graph of a UPS efficiency curve in accordance with one embodiment.

It can be appreciated that different redundancy architectures push UPS units to operate in different efficiency zones of operation, impacting contribution of the UPS units to the energy efficiency of the data center. UPS operating efficiency can be described as a UPS efficiency curve showing percent of efficiency versus percent of UPS load. FIG. 12 shows one example of a UPS efficiency curve. As readily apparent from FIG. 12 operation of a UPS at low power results in lower efficiency with higher UPS energy losses and operating costs.

Referring again to the example of FIG. 11, assuming server rack 1150 has a power demand of 300 kW and each UPS unit 1110, 1120, and 1130 delivers a maximum of 300 kW. The UPS and server rack arrangement of FIG. 11 provides a redundancy level of N+2 because, this example, only one of the three UPS units need to be operational to meet the power demand of rack 1150. When all three UPS units are operating, each provides a third of the power required by server rack 1150 (300 kW/3=100 kW). Each UPS unit is operating at 30% of its rated output power (100 kW/300 kW=30%), which is not an optimal point on its efficiency curve. If only UPS units 210 and 220 are operational, then each delivers half of the power required by server rack 250 and operates at 50% of its rated output power (150 kW/300 kW=50%). This is a more optimal point on the efficiency curve for each UPS unit, but the level of redundancy has dropped to N+1.

To more accurately account for the redundancy architecture when calculating the energy efficiency metric for a data center, the metric can be adjusted by accounting for the difference in redundancy equipment energy losses between levels of redundancy, as shown in Equation (2) below. This adjustment in redundancy equipment energy losses can be negative when considering levels less redundant than the current data center architecture, and can be positive when considering levels that are more redundant than the current data center architecture. Stated another way, the total data center energy consumption can be reduced when considering architectures with less redundancy, and can be increased when considering architectures with more redundancy.

$$PUE_{adjusted} = \frac{\text{(Total data center energy consumption)} + \text{(Adjusted redundancy equipment energy losses)}}{\text{IT energy consumption}} \quad \text{Equation (2)}$$

The redundancy equipment included in the energy loss calculation can depend on the point in the electrical system at which IT energy consumption is measured. PUE category 1, for example, specifies that IT energy consumption can be measured at the output of the UPS units. For the electrical system shown in FIG. 10, redundancy equipment energy losses can include those of UPS units 1030, 1035, as well as equipment between the UPS units 1030, 1035 and energy sources 1010, 1015, 1020, 1025. PUE category 3, on the other hand, specifies that IT energy consumption can be measured at the IT equipment input. The redundancy equipment energy losses, in the electrical system shown in FIG. 10, include those of RPPs 1050, 1055, PDUs 1040, 1045; UPS units 1030, 1035 as well as equipment between UPS units 1030, 1035 and energy sources 1010, 1015, 1020, 1025. In one example, when considering the differences in energy losses between redundant architectures, the contributions of some equipment (such as the UPS units) may form the majority of energy losses, and calculations of redundancy equipment energy losses may focus on just this equipment.

Figure 13:
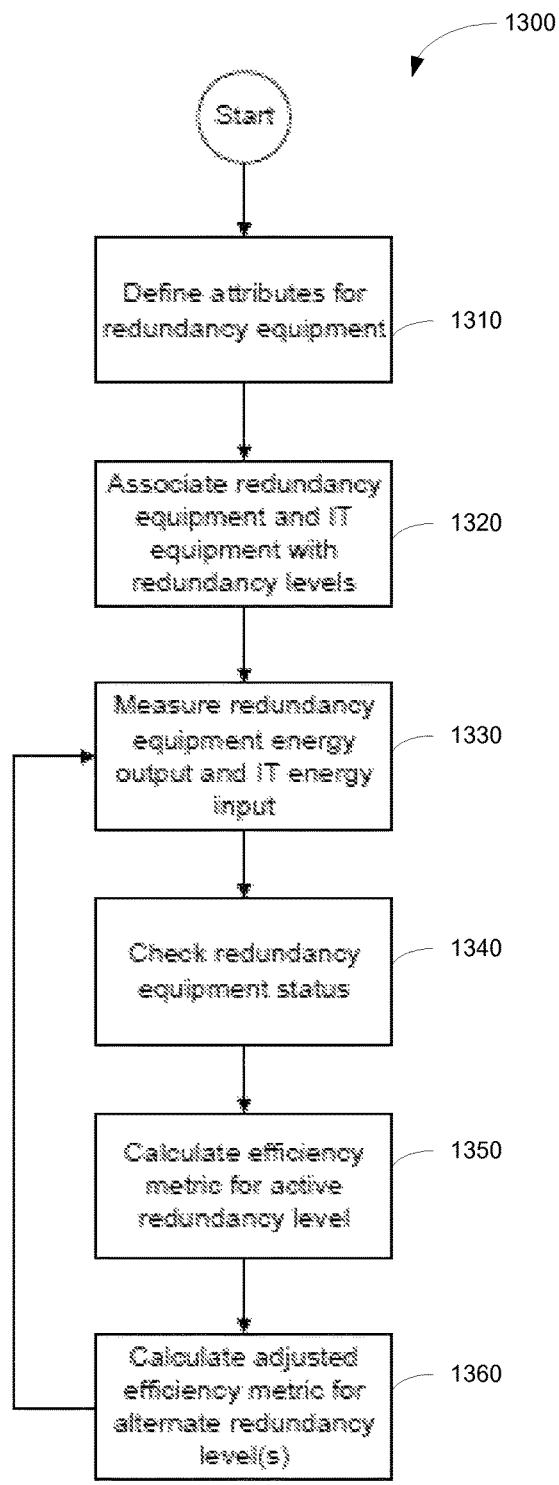
FIG. 13 is a flowchart of a method of calculating both adjusted and non-adjusted PUE metrics in accordance with one embodiment.

FIG. 13 is a flowchart illustrating a method 1300 of calculating both adjusted and non-adjusted PUE metrics, where the adjusted PUE metric accommodates for differences in redundancy architecture. In step 1310, the PUE component 602 assigns attributes to redundancy equipment to be used in energy efficiency calculations. For example, one such attribute may be the rated power output of the equipment.

In step 1320, the PUE component 602 associates redundancy equipment and IT equipment with one or more redundancy levels. The PUE component 602 uses these associations to determine which pieces of equipment to include when calculating an adjusted energy efficiency metric for alternate redundancy levels. For example, the UPS units shown in FIG. 11 may be sized to operate at a redundancy level of N+2, and the active operation of all three UPS units may be associated with this level of redundancy. An alternate redundancy level of N+1 may be defined to be the active operation of any two of the three UPS units.

In step 1330, the PUE component 602 measures the output of all redundancy equipment included in adjusted energy efficiency metric calculations and associated with defined redundancy levels. For metrics such as PUE and DCiE the output is measured in units of energy consumption (such as kWh). The PUE component 602 also measures the energy input of IT equipment associated with defined redundancy levels (for use in later steps).

In step 1340, the PUE component 602 checks the operating status of all redundancy equipment included in adjusted energy efficiency metric calculations. This check is performed to determine the level of redundancy for the current operation of a defined group of equipment. This check may be performed by reading a status contact or interrogating equipment via communications, or may simply be determined by evaluating the present equipment output (e.g. an output level below some threshold near 0 may indicate the equipment is offline).

In step 1350, the PUE component 602 may calculate the energy efficiency metric for the data center using an industry standard methodology, as described above with reference to the Green Grid recommendations. By way of example, the efficiency metric may be PUE category 1, and the PUE component 602 may calculate this metric by using measured values as outlined in Equation (1). This metric value is associated with the active level of redundancy, which under normal operation will be the specified level of redundancy for the data center.

In step 1360, the PUE component 602 may calculate the adjusted energy efficiency metric for one or more alternate redundancy levels as shown in Equation (2). To calculate this metric, the PUE component 602 may first calculate the adjusted redundancy equipment energy losses term for each alternate redundancy level. This may be accomplished by assuming the redundancy equipment operating scenario of an alternate redundancy level, dividing the measured IT equipment energy input amongst the operating redundancy equipment, and using the energy efficiency curves for the redundancy equipment to estimate the adjusted redundancy equipment energy losses. Alternately, the PUE component 602 may directly measure the energy input and output of redundancy equipment to determine the adjusted redundancy equipment energy losses. The PUE component 602 may also draw upon measured and logged redundancy equipment input and output energy values from the past when the electrical system operated at one or more alternate redundancy levels. The PUE component 602 may use measured values for select alternate redundancy levels when IT equipment operated within an expected operational range and enough measured data was captured for a statistically significant determination of redundancy equipment efficiency.

The PUE component 602 may use the results of the check described in step 1340 to determine if the redundancy equipment is operating at the expected redundancy level for the data center, or operating at one of the alternate redundancy levels. In one example, if the equipment is operating at one of the alternate redundancy levels defined, the PUE component 602 does not calculate an adjusted energy efficiency metric value for the present interval. In this example, because the alternate redundancy level has become the active redundancy level for the data center, the non-adjusted energy efficiency metric value for the present interval is the correct value.

One example of the adjusted PUE metric is described with reference to the exemplary arrangement of UPS units and the server rack as shown in FIG. 11. Assuming the UPS units 1110, 1120, and 1130, in this example, are sized to operate with a redundancy level of N+2, each having a rated output of 300 kW, and server rack 250 is currently drawing 300 kW at a steady rate. Each UPS unit may have the same characteristic efficiency curve, with an efficiency of 85% at 30% of rated output and an efficiency of 92% at 50% of rated output. The redundancy equipment energy losses for a redundancy level of N+1 are calculated by first dividing the IT energy consumption (300 kW at a steady rate) up between two of the UPS units, resulting in an increased energy output of 150 kW at a steady rate for each unit. In normal operation, all three UPS units operate at 30% of their rated output (100 kW/300 kW=30%). At an alternate redundancy level of N+1, two of the UPS units would operate at 50% of their rated output (150 kW/300 kW=50%).

In this example, the PUE component 602 calculates the redundancy equipment energy losses by determining the difference in losses incurred by moving along the efficiency curve from 30% of rated output (efficiency of 85%) to 50% of rated output (efficiency of 92%), using the present value of IT equipment energy consumption of 300 kW at a steady rate. The PUE component 602 then applies the calculated value of redundancy equipment energy losses to Equation (2) to determine the adjusted PUE value for a redundancy level of N+1. In this example, since the UPS units would operate at a more efficient point on their efficiency curves, the redundancy equipment energy losses term has a negative value, and the adjusted PUE metric value will be lower than the unadjusted PUE metric value.

Referring again to FIG. 13, the process outlined in step 1360 may be repeated for each alternate redundancy level that has been defined. After the adjusted energy efficiency metric for each alternate redundancy level has been calculated, the PUE component 602 may return to step 1330 to gather additional energy measurements. The steps 1330, 1340, 1350, and 1360 may be repeated to generate a series of adjusted and non-adjusted energy efficiency metric values over time.

In one embodiment, these steps are executed at a time interval that matches the most granular time interval desired for energy efficiency metric values (e.g. daily, weekly, monthly), and the PUE component 602 accumulates the required energy measurements between energy efficiency metric calculation intervals. In an alternate embodiment, the PUE component 602 gathers and stores interval energy measurements at time intervals that are a particular integer multiple of the energy efficiency time interval, and sums these interval energy measurements to calculate the desired adjusted and non-adjusted energy efficiency metric values.

An indication can be provided when the PUE component 602 reports values of the adjusted energy efficiency metric. As an example, the PUE component 602 may include a subscript next to the metric name or use a simple footnote reference pointing the reader to a note containing the appropriate details.

PUE Metric Adjusted for Weather Profile

As noted above, typical energy efficiency metrics, such as PUE or DCIE are influenced by the energy consumed by HVAC equipment. However, currently these metrics do not take into account the differences in weather profiles for different data center locations. An HVAC system in a data center is typically configured to maintain a constant temperature around IT equipment, but the energy required to do so will depend on weather profile factors such as temperature and insulation. Data centers are typically configured to maintain different constant temperatures near IT equipment (e.g. server inlet temperatures of 70 degrees F. versus 80 degrees F.), and this will also impact HVAC equipment energy consumption between data centers.

To more accurately account for these differences in weather profiles, the HVAC equipment energy consumption can be modeled versus weather profile parameters (such as outdoor temperature). The energy consumption model can be used to predict HVAC equipment energy consumption for one or more alternate weather profiles. The HVAC energy consumption model can also be designed to take into account differences in IT equipment space temperature set-points. The data center energy efficiency metric can then be adjusted to use the adjusted HVAC equipment energy consumption for the one or more weather profiles. The adjusted PUE is described by Equation (3) as:

$$PUE_{adjusted} = \frac{(\text{Total } nonHVAC \text{ data center energy consumption}) + (\text{Adjusted } HVAC \text{ equipment energy losses})}{IT \text{ energy consumption}} \quad \text{Equation (3)}$$

Figure 14:
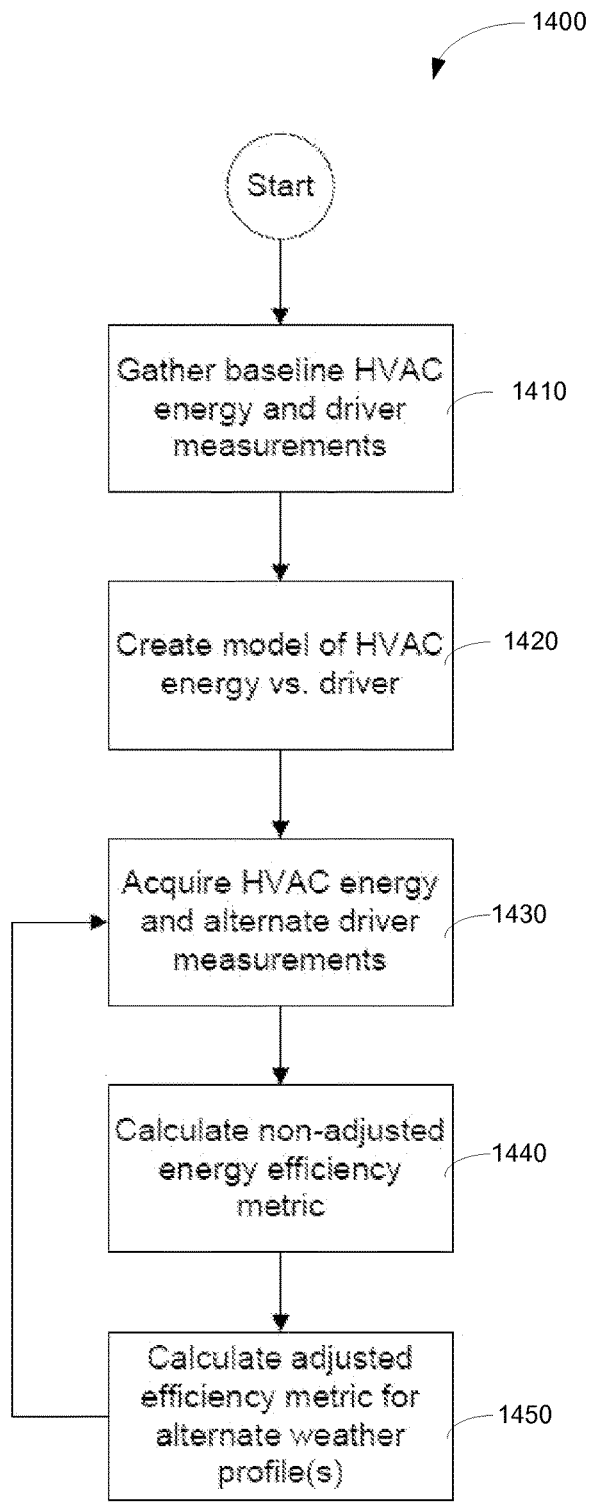
FIG. 14 is a flowchart of a method of determining both an adjusted and non-adjusted energy efficiency metric in accordance with one embodiment.

FIG. 14 is a flowchart illustrating a method 1400 of determining both an adjusted and non-adjusted energy efficiency metric, where the adjusted energy efficiency metric is adjusted for differences in HVAC energy consumption. In step 1410, the energy PUE component 602 gathers both energy consumption data for all HVAC equipment as well as data for a selected weather profile parameter (such as outdoor temperature) that influences (or drives) the energy consumption of the HVAC equipment. This baseline data set captures as much of the full range of operation of the HVAC equipment as possible (e.g. HVAC equipment energy consumption data and outdoor temperature data for both warm and cool seasons). Some data center energy efficiency metrics (such as typical PUE) specify that energy consumption includes both electrical and non-electrical energy types, and all energy types defined by the energy efficiency metric should be included in total HVAC equipment energy consumption.

In step 1420, the PUE component 602 creates a model of HVAC equipment energy consumption versus the selected weather profile parameter using the baseline data set. US patent application 2011/0066299, titled "System and Method of Modeling and Monitoring an Energy Load," published on Mar. 17, 2011, which is incorporated herein by reference in its entirety and is hereinafter referred to the '299 application, provides one example method for building an energy model. The '299 application, in addition to describing the creation of models that include both dependent and independent variables, such as energy consumption and outdoor temperature, respectively, the '299 application also describes the use of partition variables, which represent discrete operating conditions of the dependent variable. In one example, the energy model including the weather profile parameter, as described in Equation (3) may exclude this partition variable and use energy consumption as the dependent variable and the weather profile parameter as the independent variable. Alternately, the energy model described in Equation (3) may incorporate a discrete variable indicating different HVAC equipment operating conditions as the partition variable, for example, IT equipment space temperature set-points.

In step 1430, the PUE component 602 acquires coincident HVAC equipment energy and selected alternate weather profile parameter measurements. If the energy model has been configured to use a partition variable, the PUE component 602 also acquires alternate partition variable values. In step 1440, the PUE component 602 calculates the energy efficiency metric for the data center using an industry standard methodology, as described above. In one example, the efficiency metric may be PUE category 1, and the PUE component 602 calculates the PUE metric using measured values as outlined in Equation (1).

In step 1450, the PUE component 602 calculates the adjusted energy efficiency metric for one or more alternate weather profiles as shown in Equation (3). To calculate this metric, the PUE component 602 may first calculates the adjusted HVAC equipment energy consumption term for each alternate weather profile. This is accomplished by submitting a value from the selected alternate weather profile parameter (such as outdoor temperature) to the energy model and calculating the resulting adjusted HVAC equipment energy consumption value for that selected alternate weather profile parameter. If the model incorporates HVAC equipment operating conditions as a partition variable, one or more values of the partition variable are submitted to the energy model to calculate one or more adjusted HVAC equipment energy consumption values. The PUE component 602 then uses the one or more adjusted HVAC equipment energy consumption values in Equation (3) to calculate one or more adjusted PUE values.

In one example, if a data center is located in a warm climate, a user may generate an adjusted PUE metric comparing the data center efficiency if the data center is relocated to a selected cooler climate. The PUE component 602 may select an average daily temperature as the weather profile parameter, and select IT equipment space temperature set-point as the partition variable (to reflect the fact that IT equipment space temperature set-points may switch from 70 degrees F. to 80 degrees F.). Baseline measurements of daily HVAC equipment energy consumption, daily average outdoor temperature and partition variable values may be acquired over a duration of one year. These measurements may capture the full range of operation of the HVAC equipment in response to outdoor temperature and IT equipment space temperature set-point configuration.

In one example, this baseline data set is used to create a model of HVAC equipment energy consumption versus average outdoor temperature and may incorporate IT equipment space temperature set-point configuration. The PUE component 602 may then acquire all measurements required to calculate the non-adjusted data energy efficiency metric, including HVAC equipment energy consumption. The PUE component 602 may also acquire the daily average outdoor temperature for the cooler climate and vary the IT equipment space temperature set-point partition variable to generate two adjusted HVAC equipment energy consumption values: one for an IT equipment space temperature of 70 degrees F., and one for an IT equipment space temperature of 80 degrees F. The PUE component 602 can then apply the two calculated values of adjusted HVAC equipment energy consumption to Equation (3) to determine two values of adjusted PUE for the cooler climate. In one example, one adjusted PUE value is for an IT equipment space temperature of 70 degrees F. and the other adjusted PUE value is for an IT equipment space temperature of 80 degrees F.

After the adjusted energy efficiency metric for each alternate weather profile has been calculated, the PUE component 602 may return to step 1430 to gather additional energy, driver parameter and (optionally) partition variable measurements. The steps 1430, 1440, and 1450 are repeated to generate a series of adjusted and non-adjusted energy efficiency metric values over time. In one embodiment, these steps are executed at a time interval that matches the most granular time interval desired for energy efficiency metric values (e.g. daily, weekly, monthly), and the PUE component 602 accumulates the required energy, driver and partition variable measurements between energy efficiency metric calculation intervals. In an alternate embodiment, the energy monitoring and control system gathers and stores interval energy, driver and partition variable measurements at time intervals that are some integer multiple of the energy efficiency time interval, and sums these interval energy measurements to calculate the desired adjusted and non-adjusted energy efficiency metric values. If conditions change and impact the assumptions built into the energy model, the PUE component 602 may be directed to jump back to step 410 and build a new energy model.

In addition to calculating the adjusted energy efficiency metric as new energy consumption and driver measurements are received, the PUE component 602 may also submit a set of stored measurements through the energy model to generate a set of adjusted energy efficiency metric values. As an example, the PUE component 602 may have a set of daily average outdoor temperatures over the course of a year for multiple cities, and may run these data through the energy model to generate a set of adjusted energy efficiency metric values for each city.

An indication can be provided when the PUE component 602 reports values of the adjusted energy efficiency metric. As an example, the PUE component 602 may include a subscript next to the metric name or use a simple footnote reference pointing the reader to a note containing the appropriate details.

Examples of Managing Data Center Energy Efficiency

The adjusted energy efficiency metrics described above can be used for an accurate comparison of data centers with differing redundancy architectures and weather profiles. The adjusted energy efficiency metrics, as further described below, can be used to detect unexpected changes in a single data center as they occur in real-time and take action to manage energy efficiency within defined target goals.

Typical industry-wide data center energy efficiency metrics, such as PUE and DCIE, typically specify a long measurement period for the energy measurements used to calculate the metric. All categories of the PUE metric, for example, specify energy consumption values for a 12-month period. Such a long time period, however, makes it difficult to manage data center energy efficiency. Therefore, the PUE component 602 provides updated values which are calculated much more frequently to provide data center staff with the information they need to manage energy efficiency.

In addition to more frequent updates, the PUE component 602 can assist in detecting unexpected changes in energy efficiency by using the adjusted PUE with a baseline. According to some examples, the methods for calculating adjusted energy efficiency metrics described above can be used to form a baseline understanding of how data center energy efficiency varies with measured aspects of data center operation. Any subsequently performed measurements of energy efficiency can be compared against this baseline understanding to highlight unexpected variations. In one embodiment, the energy monitoring and control system tracks the adjusted redundancy equipment losses measured over time for defined redundancy levels, and highlights variations outside of predetermined bounds. In another embodiment, the energy monitoring and control system may use an energy model to compare the current non-adjusted energy efficient metric values against the energy efficiency metric values predicted by the model, and highlight variations outside of predetermined bounds.

For example, consider a data center with an energy monitoring and control system that has implemented an energy model of HVAC equipment energy consumption versus daily average outdoor temperature, as described above. Given a particular value of daily average outdoor temperature outside of the data center, the energy model and the measurements in Equation (3) can be used to calculate the expected daily energy efficiency metric value for that temperature. Using this approach, the energy monitoring and control system can be configured to compare the calculated non-adjusted energy efficiency metric value against the energy efficiency metric value predicted by the model and highlight any variations from this expected value.

Determining Real Time Redundancy (RTRD)

According to embodiments described herein, the Real Time Redundancy (RTRD) metric is focused on reliability and analyzes changes in the electrical system in real-time to ensure redundancy will not be impacted. In the method, the RTRD component 606 analyzes an unexpected or simulated change in the electrical system, and produces a report for the user regarding the impact the change may have on the electrical network or system reliability. The real time redundancy functionality described here extends the current redundancy analysis by allowing both the system and users to identify the areas within their data center that can support additional power loads without impacting the redundancy of the system.

In some embodiments, the RTRD analysis performed by the RTRD component 606 examines each level of the electrical network 404 and recommends areas where additional load could safely be added to the system. The RTRD analysis allows data center managers to maximize the power system utilization of the existing assets. Users can make use of the output functionality in two ways. First, administrators can run reports on their system to see the capacity of each component. The report provides more that just a statement of capacity. Instead, the report shows the facility team the available power capacity at each point in the electrical network without impacting any level of redundancy in the facility.

According to embodiments described herein, the RTRD component 606 automatically detects in real-time when redundancy of the electrical system is at risk. Given the breaker ratings and real-time load at each point in the system, the real-time power system redundancy model validates that the system's redundancy is sufficient to keep the data center operational if a particular piece of equipment fails and the redundant circuit is forced to pick up an additional load. In a typical co-location center there are five levels of electrical hierarchy. The real time redundancy functionality extends the redundancy analysis, which is manually done by allowing both system and users to identify the areas within their data center that can support additional power loads without impacting the redundancy of the system. This analysis examines each level in the electrical distribution system and recommends areas where additional load could be safely added to the system. Using this analysis allows data center managers to maximize the power system utilization of the existing assets.

"N" redundancy is a type of backup that ensures the availability of assets in the event of a power failure. There are several types of electrical system architectures: N, N+1, N+2, 2N, 2(N+1) and 2(N+2). For all systems the components (N) are indicated to have backup components (+1). Various examples of "N" redundancy system configuration may include one or more UPS modules or one or more groups of UPS modules that work together to supply power to the IT load. Other examples of redundant system configurations can include "2N" system configuration, such that two or three groups of UPS modules supply power to two different power supplies in each IT load. The "2N" redundancy allows an entire group of UPS modules to fail or be taken off-line and while the IT equipment may be still be supplied with power. Finally, the "2(N+1)" system configuration provides for two or three groups of UPS modules to supply power to two different power supplies in each IT load. The "2(N+1)" redundancy allows an entire group of UPS modules plus one more module from the remaining groups to fail or be taken off-line and the IT equipment will still be supplied with power.

Figure 15:
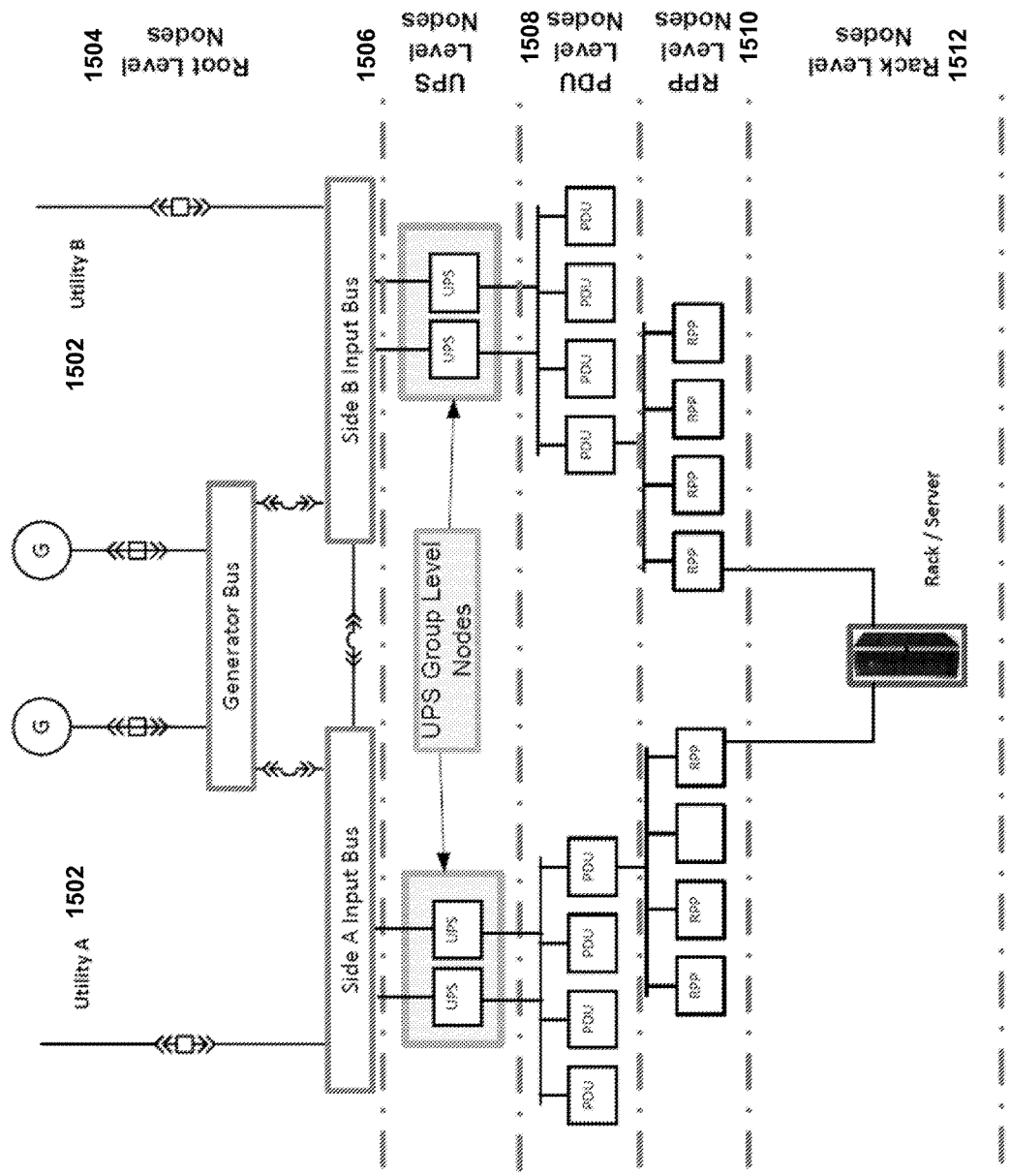
FIG. 15 is a block diagram of hierarchical levels in an electrical system in accordance with one embodiment.

In one example, there is an electrical hierarchy for the assets in a redundant electrical architecture design. The hierarchy includes one or more electrical assets that are grouped together in a top-down manner to cover one or more feeds and provide redundancy. FIG. 15 shows hierarchical levels in an electrical system, including utility feed level nodes 1502, which include Root Level Nodes 1504, followed by UPS level nodes 1506, followed by PDU level nodes 1508, then RPP level notes 1510 and finally Rack level nodes 1512. The RTRD component 606 may be configured to continually analyze the electrical system and send an alarm when it detects a potential redundancy issue.

Figure 16:
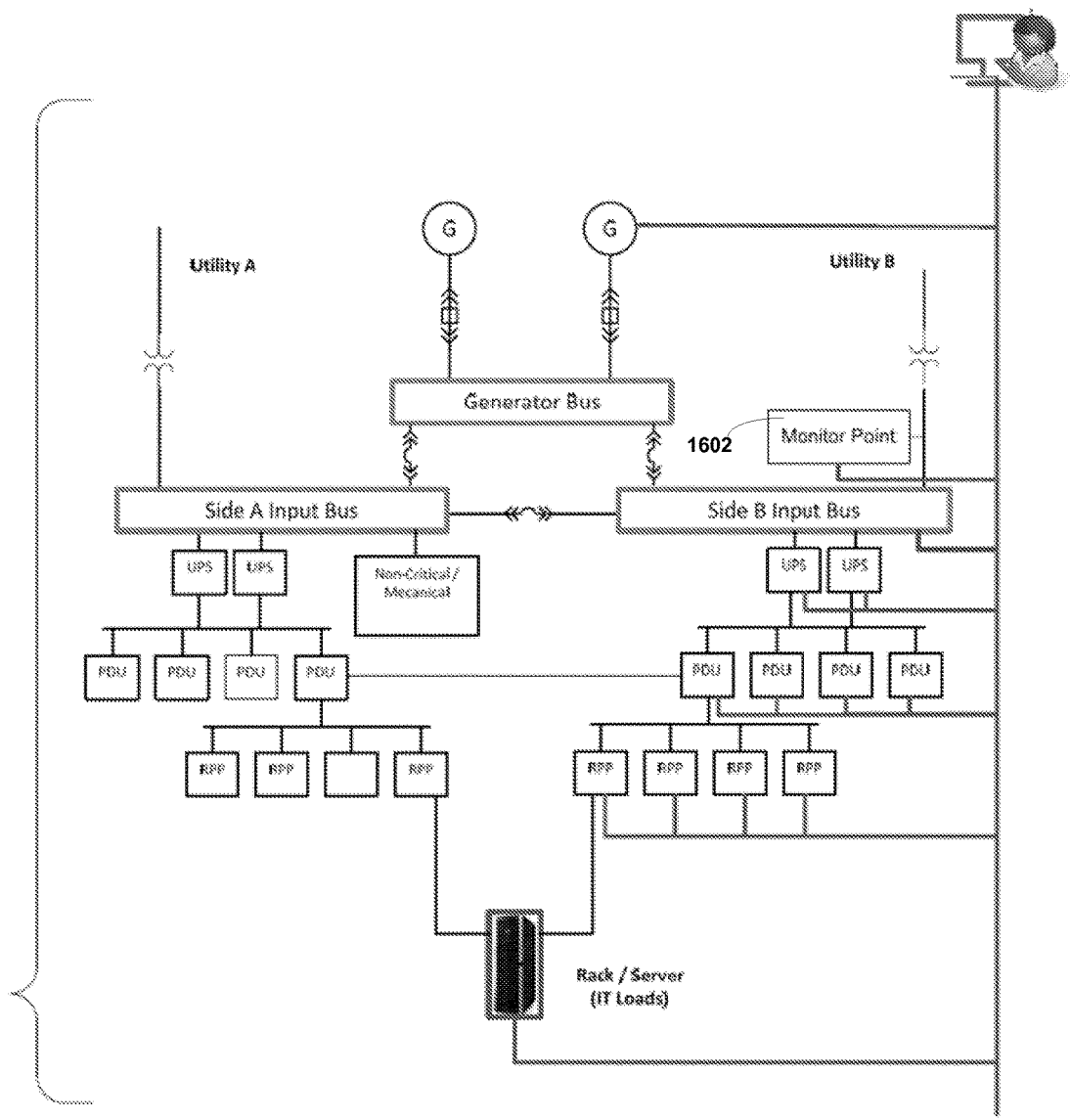
FIG. 16 is a block diagram of a redundant electrical network for a critical building in accordance with one embodiment.

FIG. 16 illustrates one example of a redundant electrical network for a critical building that is monitored by a user using a monitoring and control system, or a power management system. The power management system enables a user to monitor and store data/information from distribution points and assets and allows the user to control assets, run reports on the information, and setup alarms.

Referring to FIG. 16, the electrical system architecture shown therein is similar to the electrical system architecture described above with reference to FIGS. 4 and 5, and may be monitored by a user over a monitoring and control system 1602. The monitoring and control system may be connected to the monitoring points 1604 and associated assets via a communication network. The monitoring points 1604 may be located at key distribution points measuring power and energy usage with specific monitoring equipment, or embedded in various assets of the system. In one example, monitoring can be done by Intelligent Electronic Devices (IED), such as the PowerLogic ION series meters or the Sepam Protection Relays, both manufactured by Schneider Electric. Monitoring can also be done by the assets located in the electrical network by various measuring components embedded into the asset such as intelligent circuit breakers or UPS units.

As noted above, different users of the system may have different needs and responsibilities for the electrical system. For example, some users (e.g. IT Management) may need the redundancy to operate as promised and other users (e.g. Building Management) may need to manage the promised redundancy. The monitoring and control system displays to both types of users the final impacts of decisions to change the electrical network (adding more racks, performing maintenance on equipment, etc.).

Figure 17:
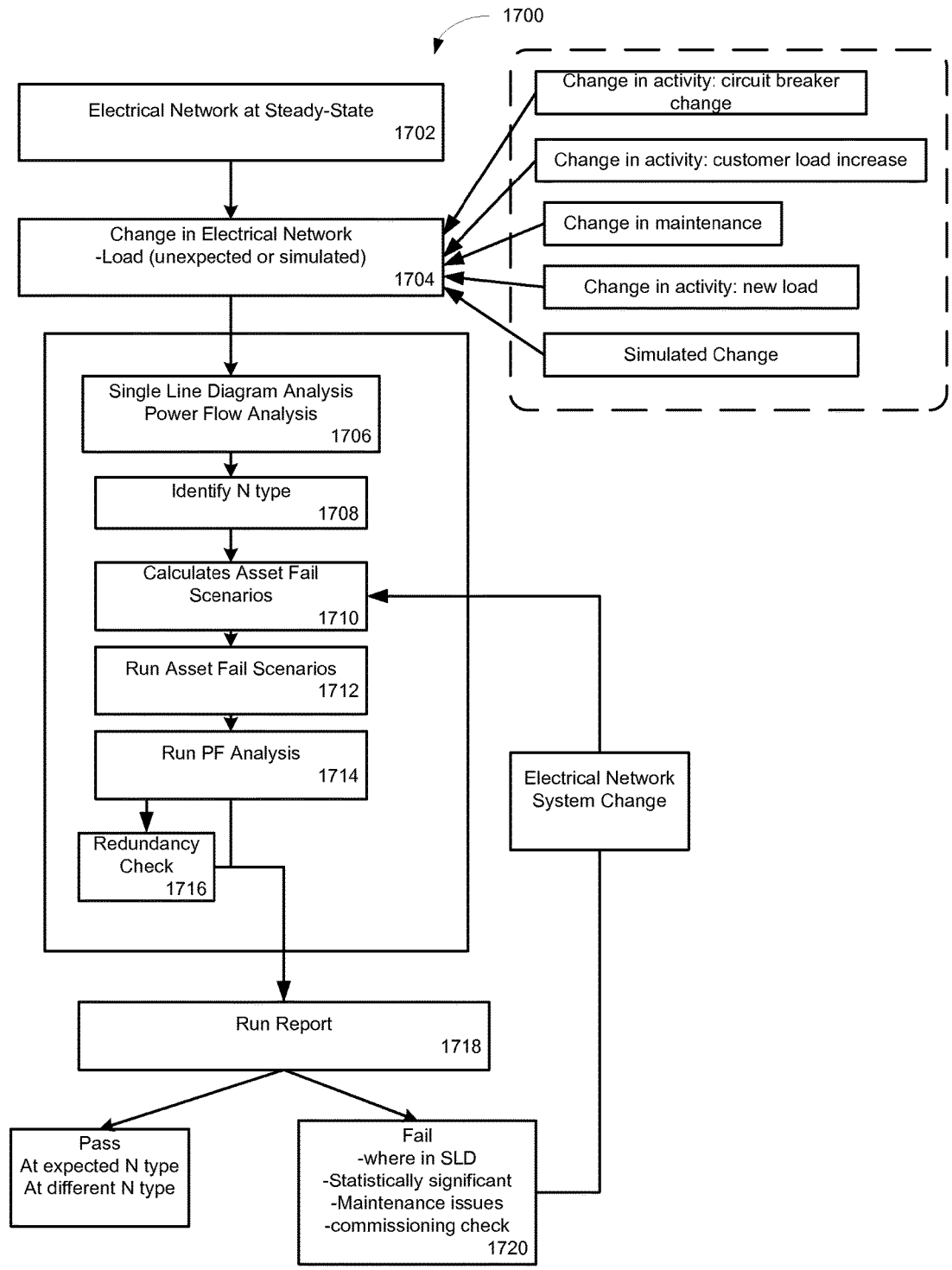
FIG. 17 is a flowchart of a method of determining the RTRD metric in accordance with one embodiment.

FIG. 17 illustrates a flowchart for a method 1700 of determining the RTRD metric. In step 1702, the electrical network operates at "steady state." In one example, the electric system operating in steady state is providing the energy to the assets, as designed, in a continual manner. At this example of steady state operation, the monitoring and control system monitors, retrieves and stores all the relevant electrical data (kWh, volts, amps, harmonics, etc. or any other power quality or power reliability data). In step 1704, a change in the electrical network is identified. The change may be a detected real-time change or the change may be simulated. For example, a user can simulate changing a load for an asset.

Changes in the electrical network can come from several sources. One example of a change is a change in activity, such as a change in a breaker settings or a set-point. A breaker change can occur as a result of maintenance (e.g. new trip curves set, or reset to factory settings). Such a change in the system can modify the coordination settings of the network and cause a portion of, or the entire network, to shut-down when different loads, spikes or sags enter the network.

Another example relates to a change in tenant activity. In this example, a spike in the data requirements by the tenant servers can accompany a spike in the CPU processing. The spike in CPU processing can translate to more heat and load put on the servers and racks and can result in certain racks reaching their maximum load. For example, the spike may occur during a peak data transfer time, such as new release of an anticipated product, major news event for a new hosting company, holiday related online shopping spike. Another example relates to a change in the IT tenant. In this example, an increase in load can occur by the IT tenant energizing a new server or rack without the building's authorization.

Yet another example relates to a change resulting from maintenance. In this example, facility management personnel can make a change in the system by performing scheduled or unscheduled maintenance. Such maintenance of a system can cause a UPS to shut down for maintenance or replacement.

Further, a maintenance change can be caused by testing of the electrical system redundancy. In one example, testing of redundancy can occur while testing the equipment either for government regulation needs or for facility testing needs. The testing may have the facility run 100% off generators without utility feeds. Such a change in the system can allow the facility managers to test the redundancy in a controlled environment, instead of during a real-life power outage. In the event that the maintenance test does not meet testing parameters, the facility can shift non-critical clients to another data center. Similarly, maintenance can be performed on a portion of the data center, such as shutting down one feeder to do maintenance. Selective shut-down can be performed physically or can be simulated. In either physical or simulated shut-down, the monitoring and control system can run the redundancy calculations to measure the impact of the change.

In addition, a change in maintenance can be caused by a scenario test based on upcoming maintenance. For example, maintenance personnel may need to shut down one feeder for maintenance purposes. A user can simulate the shutdown of equipment before physical shut-down occurs. Another maintenance change can be a change in the scheduled maintenance of the equipment, which may need weekly or monthly scheduled tests. For example, certain electrical assets, such as a generator, may need scheduled maintenance to keep levels of transfer time to a minimum. Extending such tests to have longer times between them may cause unexpected startup delays in the generators, which would also impact the redundancy of the system.

In step 1706, the RTRD component 606 performs a single-line diagram (SLD) analysis (also called the One-Line Diagram). The single-line diagram analysis is a simplified representation of the electrical network, and allows the user to perform a power flow (PF) analysis. The power flow analysis evaluates the entire electrical network and determines if the network meets designed criteria. The power flow analysis may further allow the user to see the real and reactive power losses and perform component testing to ensure the assets and their loads are performing within their ratings, both at steady state and in emergency conditions.

According to one embodiment, the power flow analysis is performed with four data sets. The first data set may include nameplate or historical data. Nameplate or historical data are industry standard data sets used in the power flow analysis. The second data set may be based on the design capacity of the assets. The third data set may be a statistically significant set of real data from the electrical network. The third data set may be a statistically significant data set determined from obtaining measured values from monitoring points over a period of time. The measured values may allow the power management system to generate an average set of data for the assets (volts, amps, harmonics, etc.) that can be used for the analysis with confidence. In one example, analysis of the recorded values may allow an IT user to eliminate anomalies, such as an unauthorized load (such as a heater, or new server) energized for only a short period of testing time. In this example, the "spike" or "blip" in the load usage of a circuit can be removed from the overall power flow analysis. The fourth type of data set may be maximums of real loads, which may be determined from measured values from monitoring points and based on the maximum load measured during a preset time period.

The third and fourth data sets may be based on measured values obtained from monitoring points 1604 and associated assets via a communication network as described above. In embodiments described herein, power flow analysis can be maximized by ensuring that the measuring devices have high accuracy of measurement. For example, high accuracy may include ensuring that measurement devices have up to at least 1% accuracy, or even up to 0.1% accuracy. Because many of the assets utilized in the system may have a high margin of error in the manufactured specifications, to further improve accuracy, high accuracy monitoring can be added to the individual assets. This high margin of error may preclude a typical system from accurately calculating RTRD. For example, typical manufactured specifications of a PDU may state that the PDU is 5% accurate. By taking this 5% margin into consideration the user can only load the PDU up to 95% capacity to ensure PDU maintains its safety buffer.

In step 1708, based on the single-line diagram analysis, the RTRD component 606 analyzes the electrical network and calculates the redundancy N type. In one example, the redundancy may be calculated by having each of the nodes in the hierarchy labeled with a tag, such as UPS1, UPS2, and PDU1.1, PDU1.2. The power management system may store the tags associated with the assets as well as which assets are upstream and downstream of each other. This tagging convention, combined with the asset loads and capacities, can be used to determine the redundancy level of the system, or a sub-section of a system. In another example, the N type redundancy can be also input by the user, as the system N design will typically be known by the user. The N type redundancy rarely changes. Hence, once calculated or input, the N type redundancy may be stored in the power management system.

In steps 1710-1714, the RTRD component 606 calculates all the asset failure scenarios (step 1710) and runs each failure scenario (step 1712), via the power flow analysis (step 1714), to see the impact on the electrical system. The automated calculation of the asset failure scenarios may allow the user to have thousands of failure scenarios calculated efficiently and in real-time. In one example, the monitoring and control system compiles and analyzes all of the failure scenarios by using logic rules.

In one example, there may be two types of failure scenarios: system failure and component failure scenarios. System failure scenarios may impact each aspect that is considered in N type redundancy classification, such as generators, UPSs, utility. The 2(N+2) redundancy system may need to be specifically considered to determine the possible permutations of the failure modes. Component failure scenarios may include failure of components that are not factored into the N type considerations, such as PDUs and RPPs. These components are generally redundant, but may not always match the N type classification. In one example, there are two failure conditions for each component: Side A failed or Side B failed. Hence, the resulting redundancy calculation may be localized, determining whether one side can handle the load if the other side has failed.

In step 1716, a redundancy check is performed on the electrical network. The redundancy check is first performed at a lowest level of the hierarchy, for example, at the rack level node. The check is subsequently performed on each subsequent level of the hierarchy to confirm the redundancy of a larger portion of the system. The redundancy check is very useful for the user of the power management system, as the check provides to the user an indication of which asset in the electrical network is the weak point in the redundancy design.

Figure 18:
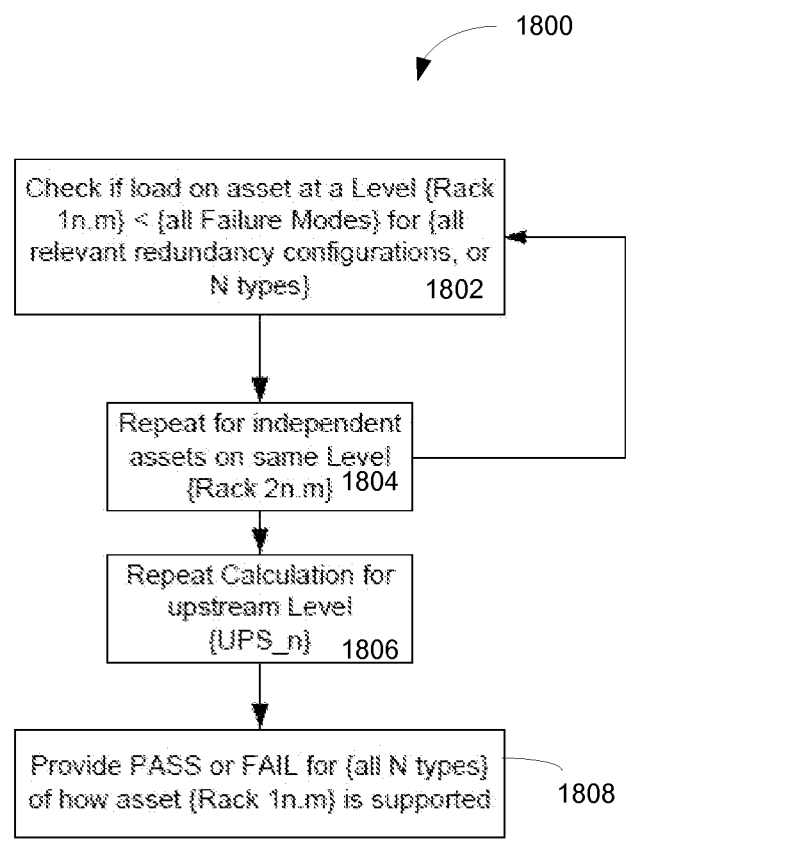
FIG. 18 is a flowchart of a method of performing the redundancy check in accordance with one embodiment.

FIG. 18 illustrates one example of a method 1800 of performing the redundancy check. The check is performed by first determining whether the load on an asset at the lowest hierarchy level is less than the limits calculated when all the failure modes of the redundant system are considered (step 1802). In step 1804, the limit check is performed on the assets in the same hierarchal level. In step 1806, the limit check is repeated for the assets on higher levels of the hierarchy. In step 1808, the check confirms that the asset group at one hierarchy level meets the redundancy levels, as well as that the upstream assets and the levels above meet the redundancy levels and delivers either a "pass" or a "fail" report.

Figure 19C:
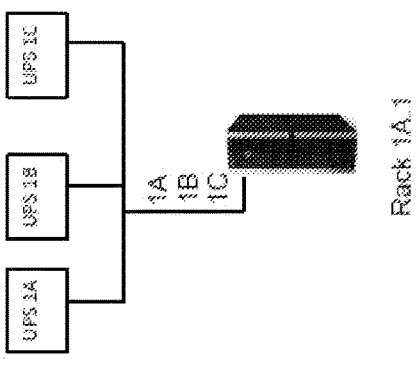
FIG. 19C is a block diagram of an N type redundancy, in accordance with another embodiment.
Figure 19B:
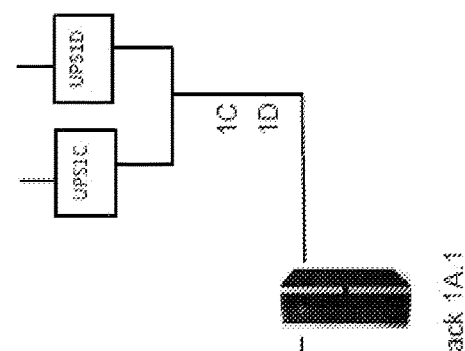
FIG. 19B is a block diagram of an N type redundancy in accordance with another embodiment.
Figure 19A:
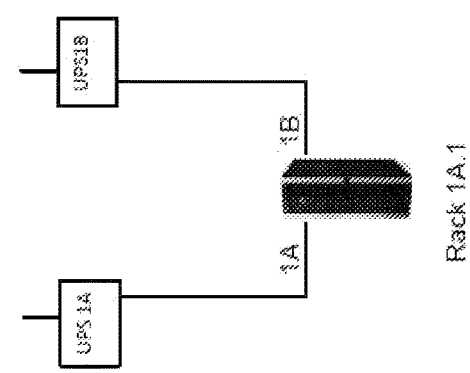
FIG. 19A is a block diagram of an N type redundancy, in accordance with one embodiment.

FIGS. 19A-19C illustrate examples of how the check can be automatically performed on different N type redundancies. In FIG. 19A, Rack 1A.1 is fed by two UPS units, UPS1A and UPS1B. For this system to confirm or test that the 2N redundancy level exists, the following logic is applied:

if the Load on Rack 1A.1≤(Capacity of UPS1A) AND≤ (Capacity of UPS1B), then 2N redundancy exists; however
if the Load on Rack 1A.1≤(Capacity UPS1A+Capacity UPS1B), then only N redundancy exists.

For example, if capacity values for UPS 1A AND UPS 1B pass the 2N redundancy level then the capacity values pass the N redundancy level as well.

In FIG. 19B, Rack 1A.1 is fed by four UPS units, UPS1A, UPS1B, UPS1C and UPS1D. For this 2N+1 system, to confirm or test the redundancy level exists, or if it is actually a lower redundancy level than expected, the following test logic is applied:

if the Load on Rack 1A.1≤((UPS1A+UPS1B)/2) AND≤ ((UPS1C+UPS1D)/2)) then 2N+1 redundancy exists; however
if the Load on Rack 1A.1≤(sum(UPS1A,UPS1B) AND sum(UPS1C,UPS1D) then only 2N redundancy exists; however
if the Load on Rack 1A.1≤(sum (UPS1A, UPS1B, UPS1C, UPS1D) then only N redundancy exists.

In FIG. 19C, Rack 1A.1 is fed by three UPS units, UPS1A, UPS1B and UPS1C. For this N+1 system, to confirm or test the redundancy level exists, or if it is actually a lower redundancy level than expected, the following test logic is applied:

if the Load on Rack 1A.1≤sum of any 2 of (UPS1A, UPS1B, or UPS1C) then N+1 redundancy exists; however
if the Load on Rack 1A.1≤sum of (UPS1A, UPS1B, UPS1C) then only N redundancy exists.

It can be appreciated that only certain redundancy schemes can "default" to a certain lower redundancy schemes when one of the assets becomes overloaded, such as from N+1 to N, or from 2N to N, or from 2N+1 to 2N. It may not be possible, for example, to go from a 2N+1 level to a N+1 level without a physical change in the wiring of the electrical system.

Referring again to FIG. 17, in step 1718, as the result of the analysis, the monitoring and control system generates a report, for example a redundancy and capacity report, and visually presents the report to the user. The report may indicate a "pass" (step 1722) or a "fail" (step 1720). In one example, the "fail" report may allow for either the system to atomically initiate a suggested electrical network change, or the user to manually change the electrical network to bring it into compliance (step 1720). The method then returns to step 1710.

The report may further indicate whether the system would "pass" or "fail" at a different redundancy level (e.g. from 2N to N). In addition, if a failure is indicated in the report, the report may highlight which asset or assets are the fail point in the single-line diagram, and at what hierarchy level or in which cluster of assets in the hierarchy the failure is occurring.

In another example, the RTRD component 606 may determine and recommend a change to the electrical network and provide the suggestion to the user. This suggestion is calculated by identifying where the weak assets (from a capacity view) are in the system, as described above, and simulating movement of loads from one asset to a different asset to better balance the loads. For example, in one electrical network, UPS A may have one Rack connected to it for redundancy, however UPS B located elsewhere in the network may have three Racks connected to it. The RTRD component 606 may identify this unbalance at a particular hierarchy level, the RTRD component 606 can provide the suggestion identifying ways to optimize the loads.

Figure 20:
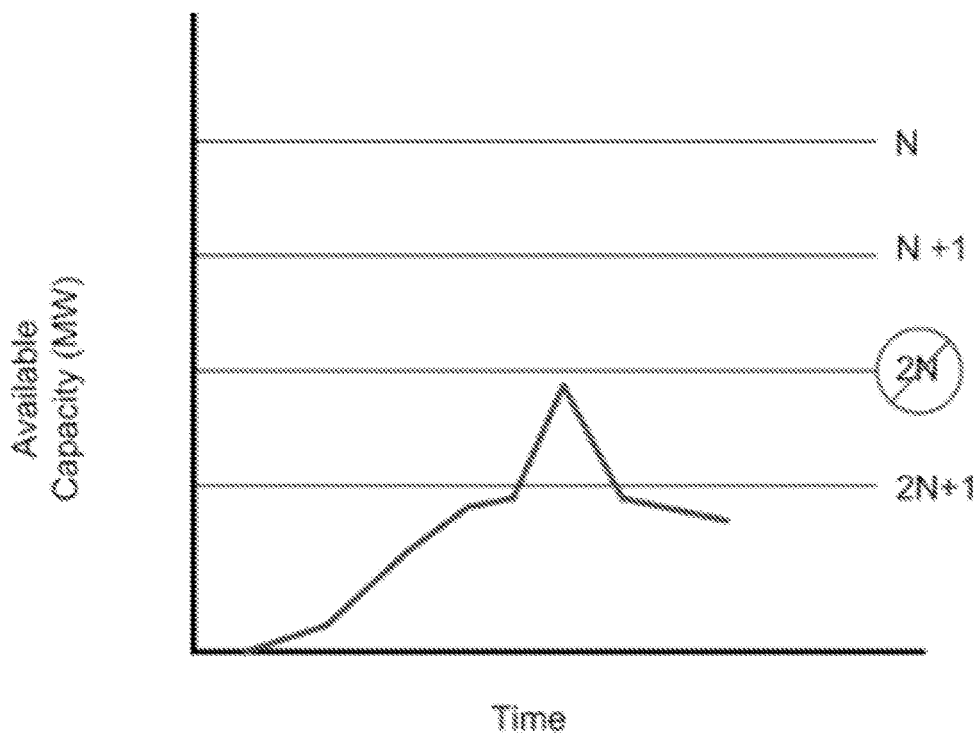
FIG. 20 is a graph of a redundancy and capacity report in accordance with another embodiment.

FIGS. 20-23 illustrate various examples of reports provided to a user. FIG. 20 illustrates one example of a redundancy and capacity report, which is a graph comparing the available capacity to the redundancy level of the system. As shown in FIG. 20, the actual capacity over time shows that the facility is operating under 2N+1 and has a spike in capacity, which has altered the system from a 2N+1 to a N+1 redundant system. The "deselecting" of the 2N redundancy levels indicates that this system cannot be reduced to such a level without physical changes in the assets or wiring of the system. While the response shown in FIG. 20 is not specific to a hierarchy level, the redundancy and capacity report can be generated for any portion of the electrical hierarchy (i.e., System Node Level, Module Node Level, etc.) or the entire electrical system.

Figures 21A, 21B:
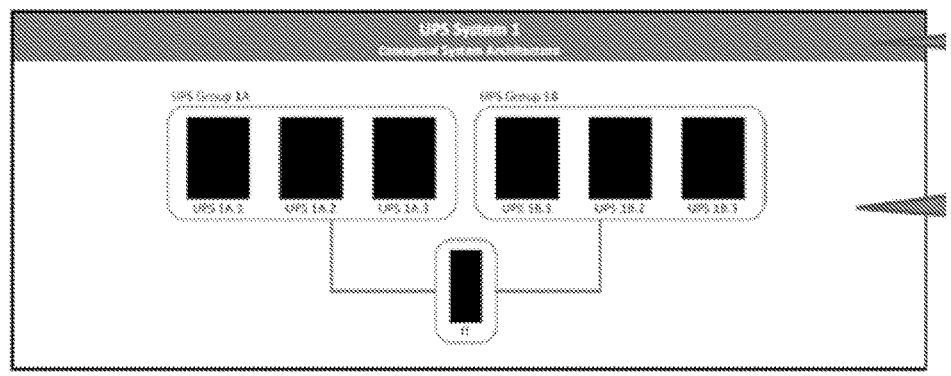
FIG. 21A is a block diagram of a report showing UPS redundancy check status in accordance with one embodiment.
FIG. 21B is a block diagram of a report showing a graphical representation of the redundancy architecture in accordance with one embodiment.

FIGS. 21A and 21B illustrate examples of a report showing UPS redundancy check status. As shown in FIG. 21A, the report may show names of various assets, their hierarchal location, such as UPS system, group and module, as well as the associated capacity, such as oversubscribed, or available capacity and the result of redundancy check. FIG. 21B illustrates one example of the report showing a graphical representation of the redundancy architecture.

Figure 22A:
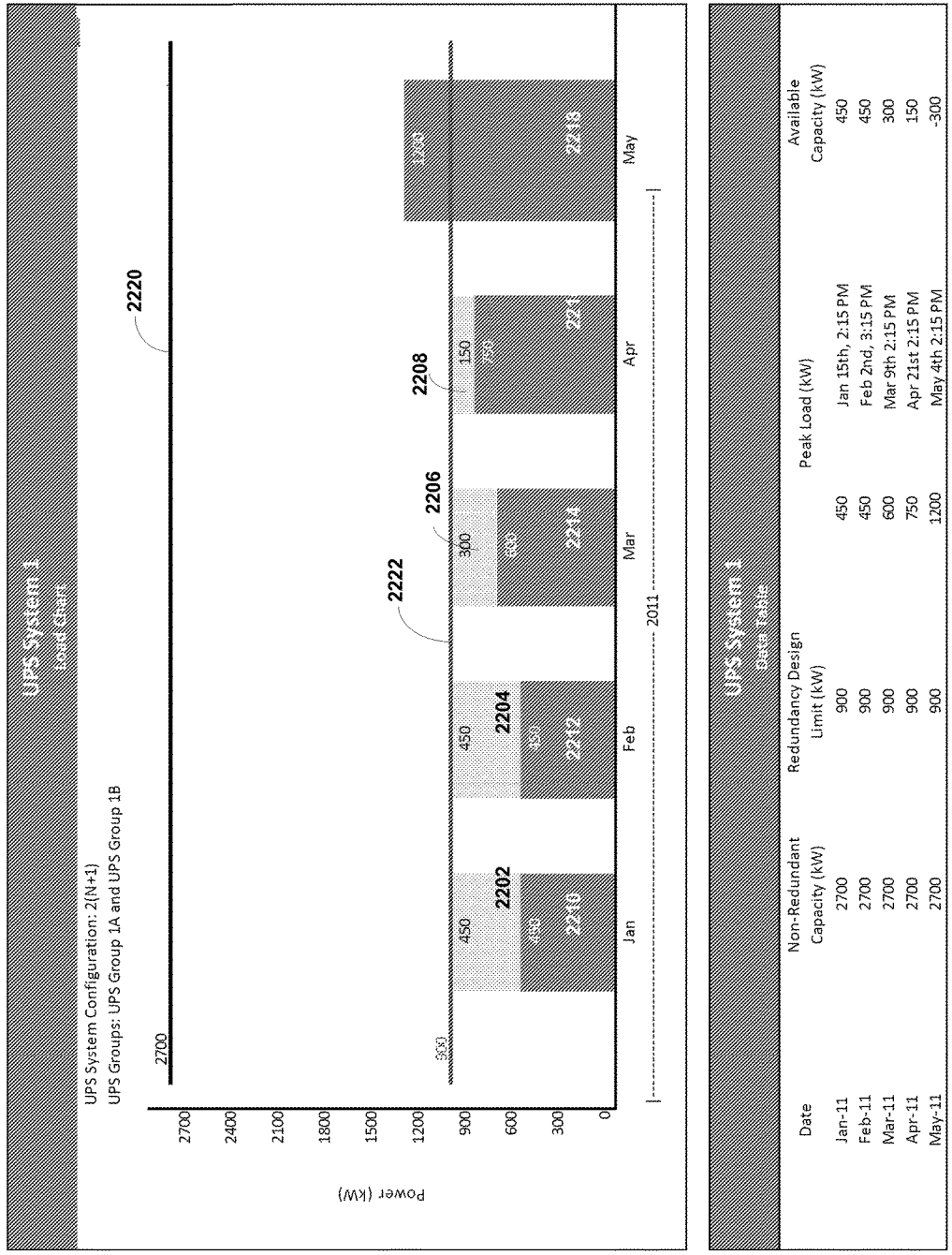
FIG. 22A is a block diagram of a report showing a load graph and a corresponding data table in accordance with one embodiment.

FIG. 22A illustrates one example of a report showing a load graph and a corresponding data table for UPS System 1. The UPS system 1 includes a UPS Group 1A and UPS Group 1B in a redundancy configuration 2(N+1). The load graph plots power in kW versus time (shown for January through May). Bar portions 2202-2208 represent the available power capacity of the system in kW. Bar portions 2210-2218 represent peak load of the system in kW. Line 2220 represents non-redundant power capacity of the system in kW. Line 2222 represents redundancy design limit of the system in kW, representing a threshold after which the UPS system design redundancy may be lost. As shown in FIG. 22A, peak load power of the system in May exceeds the redundancy safe threshold. Hence, the redundancy of the system may be compromised. In the example shown, the design redundancy may indicate the complete loss of a UPS group (UPS A1 or UPS B1) plus the loss of the +1 UPS module in the group that remains online. As a result, two UPS modules need to be able to carry the entire IT load if required).

Figure 22B:
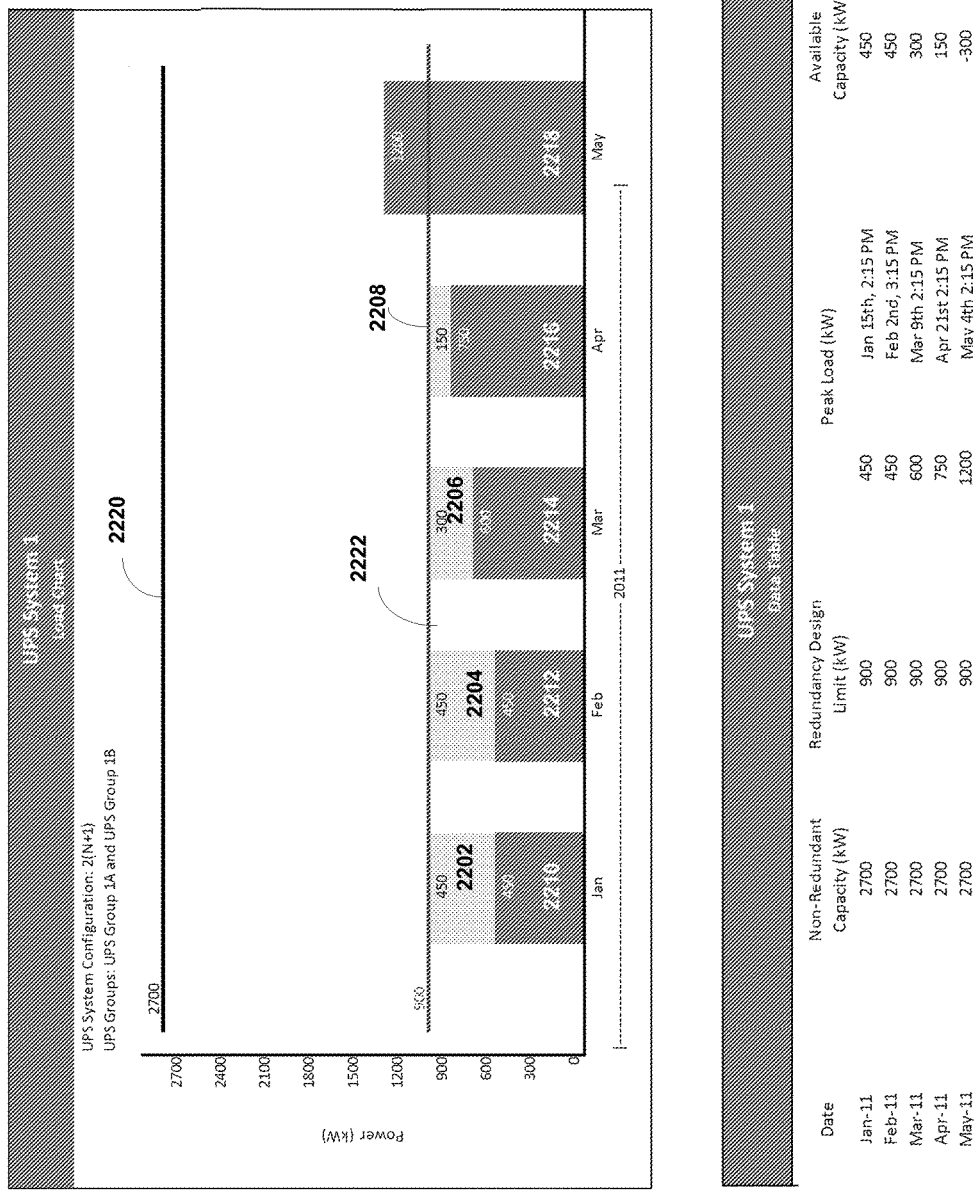
FIG. 22B is a block diagram of a report showing a load graph and a corresponding data table in accordance with one embodiment.

FIG. 22B illustrates an example of a report showing a load graph and a corresponding data table for UPS Group 1A. The UPS Group 1A includes UPS Module 1A.1, UPS Module 1A.2, and UPS Module 1A.3. Similar to the above described load graph, line 2220 represents non-redundant power capacity of the UPS Group 1A and line 2222 represents redundancy design limit of the UPS Group 1A. Bar portions 2202-2208 represent available power capacity of the UPS Group 1A and bar portions 2210-2218 represent load coincident with system peak load of the UPS Group 1A. In this example, the UPS A1 group is more loaded than the UPS B1 group because of single corded IT loads being plugged into the A side only.

Figure 22C:
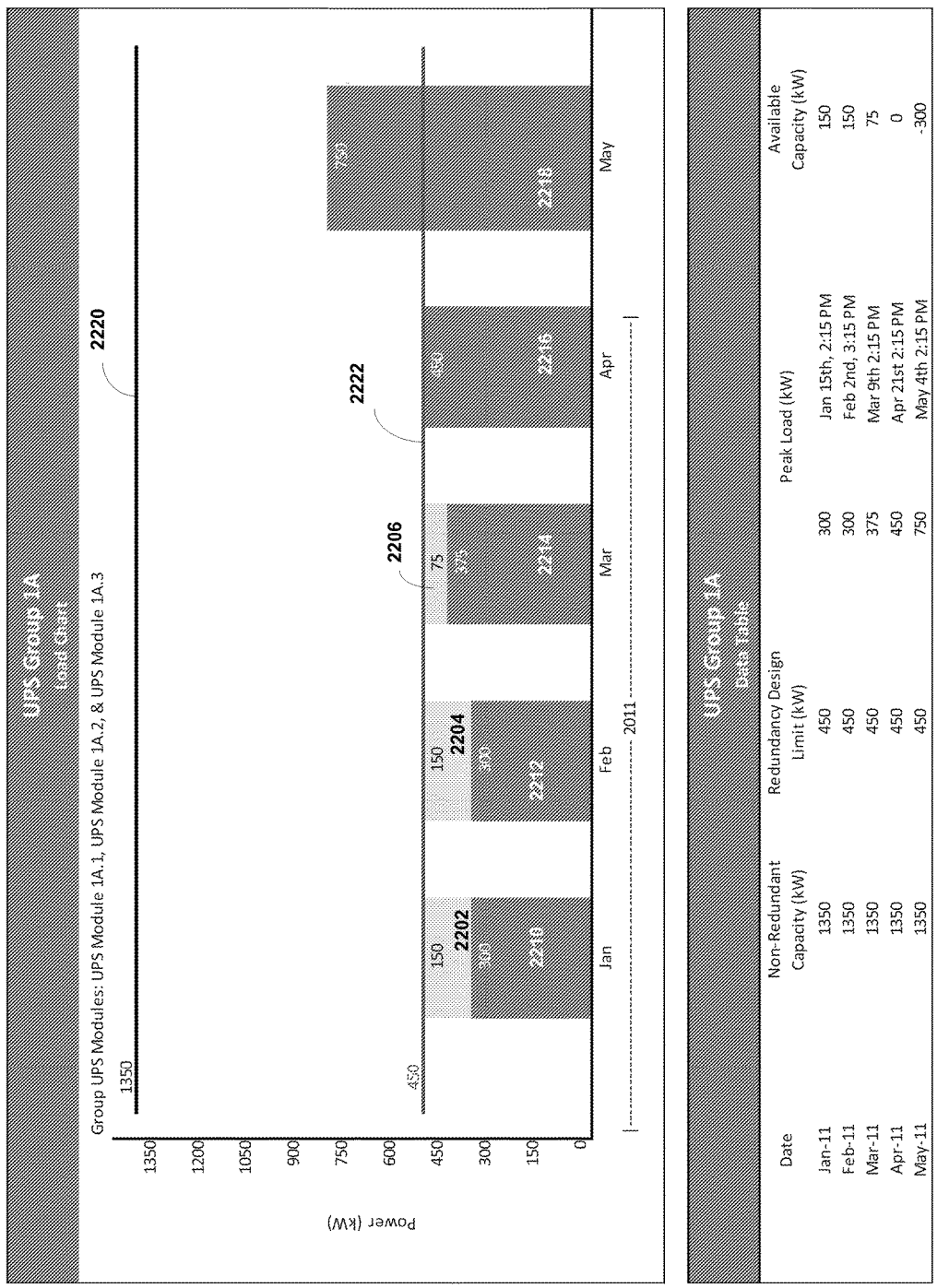
FIG. 22C is a block diagram of a report showing a load graph and a corresponding data table in accordance with one embodiment.

FIG. 22C illustrates an example of a report showing a load graph and a corresponding data table for UPS module 1A.1. The rating of the UPS module is 500 kVA. Similar to the above described load graphs, line 2220 represents non-redundant power capacity of the UPS module 1A.1 and line 2222 represents redundancy design limit of the UPS module 1A.1. Bar portions 2202, 2204 and 2206 represent available power capacity of the UPS module 1A.1 and bar portions 2210 to 2218 represent load coincident with system peak load of the UPS module 1A.1.

Determining Sweating the Assets (STA)

The STA analysis, further described below, gives a mix of reliability and cost/energy savings to the end user. The STA analysis capitalizes on the existing safety buffer, which is the difference between sweated capacity and safe capacity (or freed capacity), by allowing the user to minimize the safety buffer size while still providing safe and reliable power within the data center. According to embodiments described herein, freed capacity is determined by combining accurate metering, user knowledge of load location and intelligent capacity management. In some examples, STA analysis can provide the user with approximately 4%-10% more power in the data center that can be safely used, reducing the need to add new capital equipment to manage power.

In existing systems, when co-location data centers are nearing capacity, users may need to make real-time decisions regarding allocation of resources. In these existing systems, without exact power usage numbers, data center operators approximate the power usage accuracy within 5-10%. As a result, a load in a particular location can typically be "maxed out" at 90% to 95% of the load's rated capacity. In addition, without accurate power usage, data center operators cannot always monitor the direct impact of new loads added to the system. Instead, operators typically add the new load into any physically available circuit, which may or may not be the best place to energize the new equipment.

It is appreciated that managing additional power needs can be extremely costly when building new data centers or adding new capital equipment. Before a user takes on this large cost, it is desirable for them to ensure that the equipment currently located in the data center is utilized to the maximum potential. One example of utilizing the data center to its maximum potential includes utilizing all PDUs, racks, circuit breakers to their capacity before adding new ones. Further, utilizing the data center to its maximum potential can be problematic when users responsible for adding new capacity, for example IT personnel, are not the same users operating the facility and managing the electrical system needs.

According to various embodiments, there is a safety buffer between design capacity and safe capacity, referred to herein as freed capacity. In at least some embodiments, by capitalizing on the freed capacity and by minimizing the safety buffer size, while still providing safe and reliable power within the data center, a user is able to maximize the capacity of the assets in the data center. In some examples, by using methods described herein, the user can maximize the assets up to at least 99% of the available capacity. In other examples, higher levels of capacity can be achieved.

In at least one example, this is accomplished with increased measurement accuracy of devices and assets. For example, accurate measurement up to 1%, or even down to 0.1% can be achieved. In some examples, accurate measurement is accomplished by combining an accurate meter, user knowledge of the location of the loads and intelligent capacity management. These three aspects added together can provide an additional 4-9% buffer to use more power safely, thereby avoiding the need to add new capital equipment to manage power. In some examples, by adding high accuracy metering into the asset equipment itself (i.e., PDUs, breakers, etc.), the system can further increase the safety buffer.

In one example, using the STA calculation for a business customer includes finding a weak link, such as a location with little capacity, and maximizing freed capacity in that location. The business customer can then invest capital expenditures to add capacity to the weak link location, moving the weak link elsewhere. The STA analysis may help the data center operator to make decisions about when to invest capital expenditures in the data center.

The STA analysis may be used as a part of an energy billing solution. For example, existing co-location providers desiring to bill their customers by the rack are prevented from offering this billing practice because of low accuracy of capacity calculations. Using the STA analysis described below, high accuracy monitoring may allow the co-location provider to take advantage of the freed capacity and offer such a service. In addition, the STA analysis can enable faster and more efficient commissioning of a data center. Further, the STA analysis can be used during maintenance to simulate moving or shifting loads, or when a portion of the electrical network needs to be shutdown for maintenance. The STA analysis can also be used for training new staff or simulating failures and ensuring that risk management targets are met.

The STA analysis methods, described below, are described in the context of data center architecture, which is described above with reference to FIG. 16. However, it can be appreciated that the STA analysis can used in any critical building and using other data center architecture designs.

Referring to FIG. 16, the data center architecture provides examples of electrical, mechanical, and other assets that provide a path toward the target availabilities while maintaining recommended best practices in data centre design. This data center architecture is designed to serve four needs that are constant for every type of architecture: complying with international standards, maintaining system uptime, adapting to each criticality level of the different departments, and allowing maintenance operations while continually operating the data center.

Figure 23:
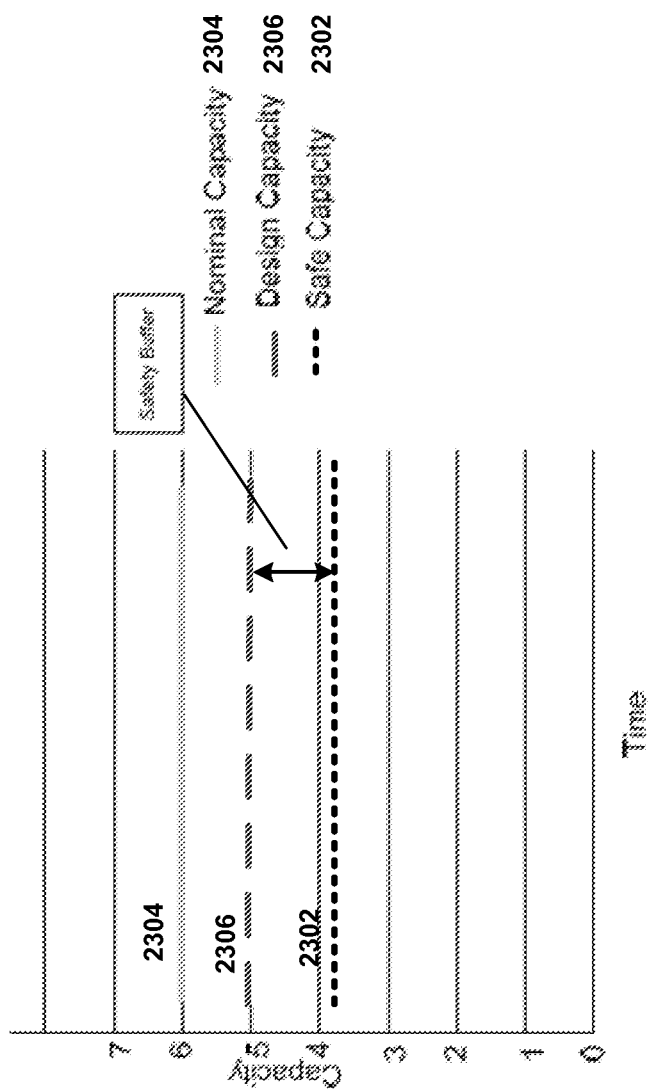
FIG. 23 is a graph of a safety buffer in an electrical network in accordance with one embodiment.

FIGS. 23-26 illustrate some examples of measurements of the STA metric as used in business practice. In practice, because of the potential consequences of a power failure due to the unknown load, it may not be recommended to run the data center near maximum capacity. FIG. 23 illustrates a graph showing one example of a safety buffer that exists between rated capacity and safe capacity of an electrical network. The rated and safe capacity is displayed in capacity (in amps) versus time. Line 2302 represents the safe capacity, line 2304 the nominal capacity, and line 2306 represents design capacity of the system. In one example, the nominal capacity is the capacity of an electrical device as provided by a manufacturer. The design or rated capacity is the operational capacity designated by the local or national building code, which is generally 80% of nominal capacity. For example, if the nominal capacity is 60 amps for a circuit breaker, the design capacity is approximately 50 amps. The safe capacity, in one example, is the actual capacity the building operator can operate the device, by taking into account the installed equipment. The difference between the safety capacity and the design capacity is the safety buffer. Maximum capacity can be reached by capitalizing on the safety buffer and minimizing its size while still providing safe and reliable power within the data center.

Figure 24:
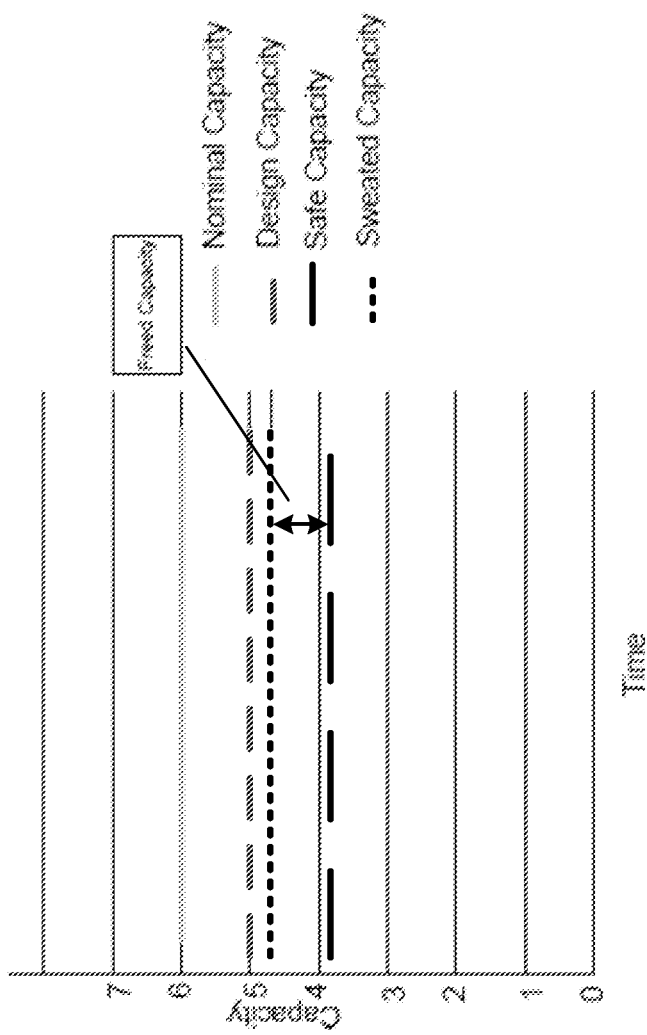
FIG. 24 is a graph of freed capacity in accordance with one embodiment.

FIG. 24 illustrates a graph showing one example of freed capacity. In one example, freed capacity is the difference between the sweated capacity and the safe capacity. In one example, freed capacity is measured by using a monitoring and control system with monitoring points throughout the electrical network. The monitoring and control system can then identify if a user can safely extract more capacity out of the equipment.

Figure 25:
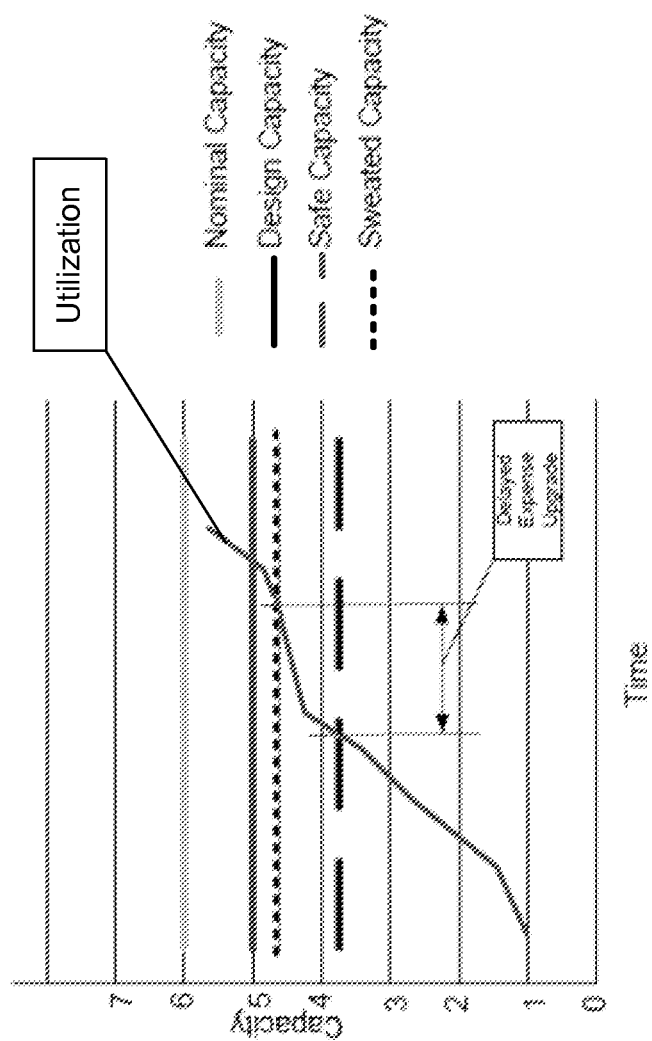
FIG. 25 is a graph of a utilization curve in accordance with one embodiment.

Accurately measuring the freed capacity is the key to accurately "Sweating the Assets." The freed capacity measurement can allow the user to calculate how long a capital expense upgrade can be delayed. FIG. 25 shows a graph illustrating one example of a utilization curve. The time difference between the point where the utilization curve crosses the safe capacity and the sweated capacity represents the time that the capital expense upgrade can be delayed. By determining the capital expense delay, in one example, the user can spread the initial capital cost over a larger number of customers.

Figure 26:
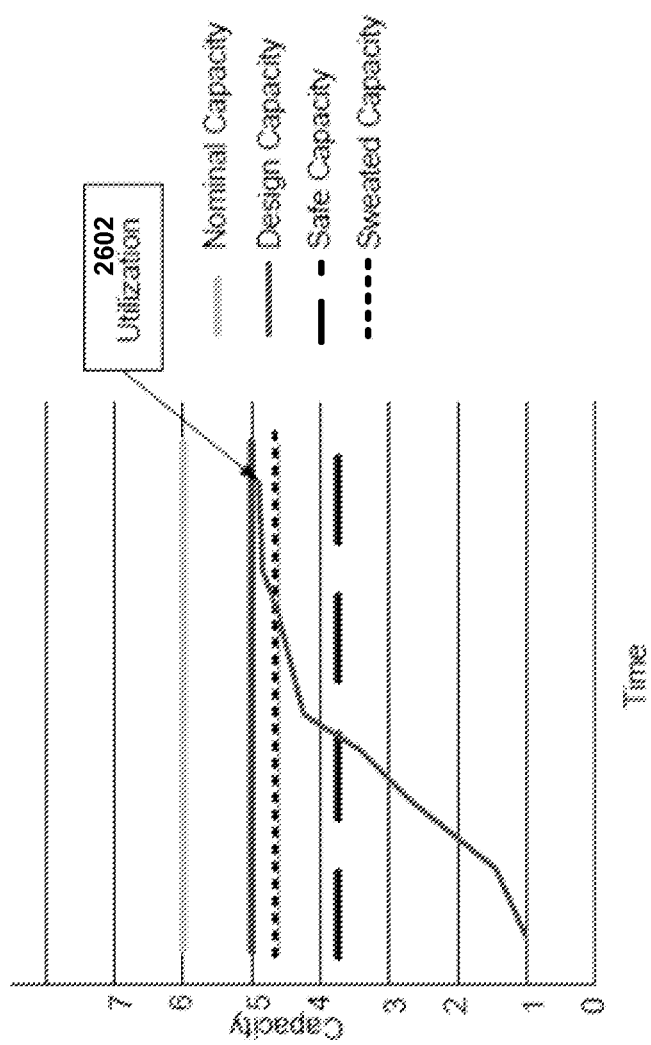
FIG. 26 is a graph of another example of a utilization curve in accordance with one embodiment.

It is appreciated that there may be a risk with a major capital expense because assets that add capacity may not be used. Sweating the assets may minimize this risk as the user is able to see the utilization compared to the capacity and ensure an upgrade is necessary prior to committing the funds as well as which portion of the electrical system to upgrade with the capital expense. FIG. 26 shows a graph illustrating one example of a utilization curve 2602. As shown in FIG. 26, in some examples, the utilization curve may not reach design capacity.

As described above with reference to FIG. 4, monitoring and control systems may include building management systems, power management systems, and the IT Management Systems. The building management systems allow a facility to manage building infrastructure, for example, cooling equipment, heat pumps, HVAC systems as well as other assets. Power management systems typically monitor and control the electrical infrastructure, and the IT Systems typically monitor and control the computer and networking systems. In various embodiments of the STA component 608, the building management and power management systems may be used as the monitoring and control facilities that give operators the relevant monitored information about the data center infrastructure, detect any alarms and make good decision to mitigate any risk, and report the site's events and energy consumption. One example of a monitoring and control system is ION Enterprise, manufactured by Schneider Electric. In one example, the power management system enables a user to monitor and store data/information from distribution points and assets, as well as allowing a user to control the assets, run reports on the information, setup alarming, and perform other management and reporting functions.

In embodiments described herein, the monitoring and control system can be used to analyze the data center energy data to produce reports described in FIGS. 23-26, providing to the user information on the safe capacity, nominal capacity, design capacity, freed capacity, sweated capacity and actual utilization. In some examples, monitoring and control system is networked on an open internet system (with or without security) or on a closed network system.

Referring again to FIG. 16, the monitoring points may be located at key distribution points with specific monitoring equipment, or embedded in various assets of the system. In one example, monitoring can be done by Intelligent Electronic Devices (IED), such as the PowerLogic ION series meters or the Sepam Protection Relays, both manufactured by Schneider Electric. Monitoring can also be done by the assets located in the electrical network by various measuring components embedded into the asset such as intelligent circuit breakers or UPS units. The monitoring points may be connected together using the communication network and may be monitored via the monitoring and control system.

In embodiments described herein, freed capacity can be maximized by ensuring that the IEDs have high accuracy. For example, high accuracy may include ensuring that measurements up to at least 1% accuracy, or even up to 0.1% accuracy. Adding high accuracy monitoring to the individual assets may be needed because many of the assets utilized in the system may have a high margin of error in the manufactured specifications. This high margin of error may preclude a typical system from calculating accurate freed capacity. For example, typical manufactured specifications of a PDU may state that the PDU is 5% accurate. By taking this 5% margin into consideration the user can only load the PDU up to 95% capacity to ensure PDU maintains its safety buffer.

Because there is no industry standard for accuracy, in typical systems facility managers use a rule of thumb, which may be 5 or 10% as the safe estimate of accuracy. In some examples of existing systems, accuracy for a facility manager may be related to equipment nameplate rating, or the manufactures specifications for the devices which will be broad and take into account all factors, such as temperature, humidity, install environment, load types, quality of power as well as other factors.

There is no preset rule of thumb for accuracy in the STA analysis. In some examples of the STA analysis, 1% accuracy may be achieved, while in other examples further accuracy, such as 0.1% may be achieved. However, as the system accuracy goes up, the system operates closer to the actual safety limit. As a result, monitoring the safety limit in "real-time" provides the most accurate calculations.

As used herein, in some embodiments, monitoring in real-time refers to processes that are completed in a matter of a few seconds or less rather than several minutes or longer as can occur with more complex calculations. In at least one embodiment, real-time may refer to the amount of time needed to dynamically react to system changes. For example, to have the monitoring and control system react and shut down one or more pieces of electrical equipment, such as an equipment rack, or a circuit breaker for the IT Loads, as a result of a power failure. In addition, some equipment characteristics may not be accurate to the manufacturer provided specifications or the actual performance may differ from one piece of equipment to the next. Performance of equipment may also dynamically change with use and wear of the equipment. However, it can be appreciated that while advantageous to have as many points monitored as possible, it may be cost prohibitive given the total cost of installing and keeping a monitoring point in place. Thus, in some examples, temporary equipment may be placed at monitoring points.

Increasing the number and accuracy of monitoring points increases the user's ability to more accurately measure the freed capacity. Referring again to FIG. 16, electrical network with four levels of monitoring is shown, where each level increases the accuracy for the system. The first level includes monitoring the output on the UPS units. The second level includes monitoring the first level plus monitoring on the mains of the PDUs. The third level includes monitoring the first and second level plus at each circuit of the RPP, which may include both inputs and outputs of the PDUs. The fourth level includes monitoring the above levels as well as monitoring at each server load of each device, or the individual IT Loads. In all cases the measuring at one level (UPS, PDU, Circuits, or IT Loads) are summed up to give the overall system energy use.

As discussed above with reference to FIGS. 23-26, STA or asset usage maximization is calculated to capitalize on the data center's true capabilities and to ensure that the data center is completely utilized before new equipment is installed or a new data center is built. STA calculations can also be used to identify where the capital expenses need to be spent first to increase the capacity. By calculating STA, a user can maximize the capabilities of the assets at the power component level, as well as assets located in the upstream levels. However, it can be appreciated that downstream assets such as branch circuits can also be included in the asset calculations.

Examples of assets that can be maximized include generators, UPS units, PDUs, RPPs, individual circuit breakers and/or racks. Generators can be evaluated to ensure they are sufficient to cover the new system capacity. Different types of UPS units can be used in embodiments of this system. For example Stand-by and Line Interactive UPS units may monitor the input and when a disturbance or failure is detected, then switch to battery power after a short transfer time (typically less than 10 ms). To ensure various UPS units are fully utilized, the UPS units are monitored at both the input and output of each UPS unit. In one example, the UPS unit may be maximized by ensuring the UPS unit feeds the PDU unit at the maximum level, but does not overload the PDU's designed capacity.

PDUs shown in FIG. 16 operate by distributing power from a larger feed into several smaller feeds. The PDU is maximized by ensuring each panel that is connected downstream is maximized without tripping the PDUs main breaker. For example, if the PDU limit is 800 A, knowing the trip curve characteristics of the PDUs main circuit breaker, the system can run as close to the PDUs trip limits, without relying on the manufacturer's specifications. The actual PDU curve characteristics are used, because the manufacturer's specifications, the trip characteristics configuration the facility manager applies to the PDUs main circuit breaker and the actual characteristics of each specific PDU may all be different.

RPPs shown in FIG. 16 operate by distributing power from a larger feed into smaller feeds and allow a user to locate a power panel on the whitespace floor. Each PDU may have several RPPs connected to it. The RPP is maximized by ensuring that the full numbers of circuits allocated to it are used.

When calculating the STA, various transformers included in the electrical network may not be maximized to minimize the cost impact for the facility. As the load increases on a transformer, the system can have more power to use. However, as addition loads are included, environmental events, such as temperature or harmonics, may negatively impact the life of the transformer. As a result, the facility manager may need to perform addition maintenance on the transformer, ultimately increasing the cost impact for the facility.

Individual circuit breakers or racks can also be maximized by calculating the freed capacity for each power strip or individual circuit breaker and thus determining which circuits can handle additional loads and which ones are near tripping their characteristics. To maximize a rack, in one example, all circuits feeding the rack should be utilized at rates nearing 100%. For example, in the data center shown in FIG. 16, the circuits feeding the rack include circuits connected to two power feeds: an A side and B side, including one or more PDUs, which are fed by redundant UPSs.

Figure 27:
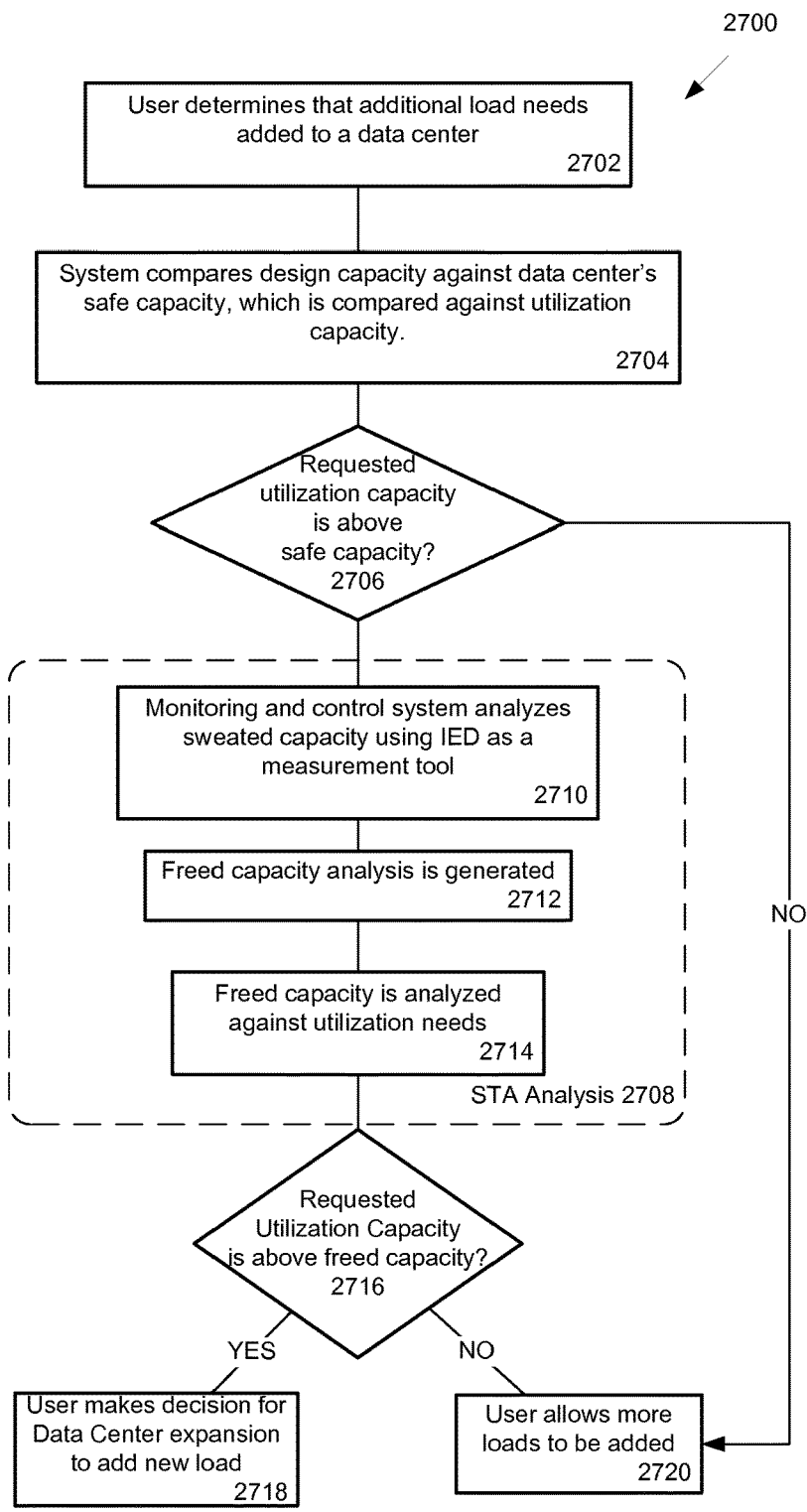
FIG. 27 is a flowchart of a method of determining STA in accordance with one embodiment.

FIG. 27 illustrates one method 2700 of determining STA. In step 2702, a user determines that an additional load needs to be added to the data center. In Step 2704, a capacity check of the data center is performed. In one example, the user or the STA component 608 compares design capacity with the safe capacity of the data center, which is then compared against the utilization capacity. The check can be performed manually by the user or automatically by the STA component 608 on either the entire data center, a sub-component, such as one or more of the assets of the data center, or a downstream IT load.

In step 2706, if the requested utilization capacity is below the safe capacity, then more loads can be added in step 2720. However, if the requested utilization capacity is above safe capacity, then the STA component 608 determines how to proceed in step 2708, by "Sweating the Assets."

In step 2710, the monitoring and control system analyzes sweated capacity associated with the assets using a highly accurate measuring tool, such as the Intelligent Electronic Devices (IED), as described above. As discussed above, the IED may have features such as high accuracy and real-time measurement capability allowing the system to properly maximize the assets. In some embodiments, it be appreciated that nameplate data for the assets, or manufactures specifications can be used. However, the IED connected to the monitoring and control system allows for more accurate measurement and analysis of the data center and the electrical load. The monitoring and control system connected to the IED can measure, record and prepare the data needed for the actual capacity calculations. The data acquired by the monitoring and control system is used to determine sweated capacity, as described in FIGS. 24 and 25.

In step 2712, freed capacity is calculated as the difference between sweated capacity and safe capacity. In step 2714, the user or the STA component 608 compares the freed capacity against the utilization needs. In step 2716, if the requested utilization capacity is below freed capacity, the user of the STA component 608 determines if and where more loads can be added (step 2720). In step 2716, if the requested utilization capacity is above freed capacity the user of the STA component 608 determines if an expansion of the data center is needed before new loads can be added (step 2718).

According to some embodiments, monitoring of the real as-build design and programmed trip settings can be taken into account during the STA analysis described above. For example, optimization of the assets can also be impacted by breaker coordination. A breaker, or trip relay, can be installed between various assets to ensure protection of the system if a localized fault occurs. Without breaker coordination, electrical assets can be damaged or downtime of the system can happen due to nuisance trips. In one example, some electrical network changes may need to be physically made before the freed capacity determined in step 2712 can be used. Improved breaker coordination can increase the accuracy of monitoring and accurate determination of freed capacity.

Figure 28:
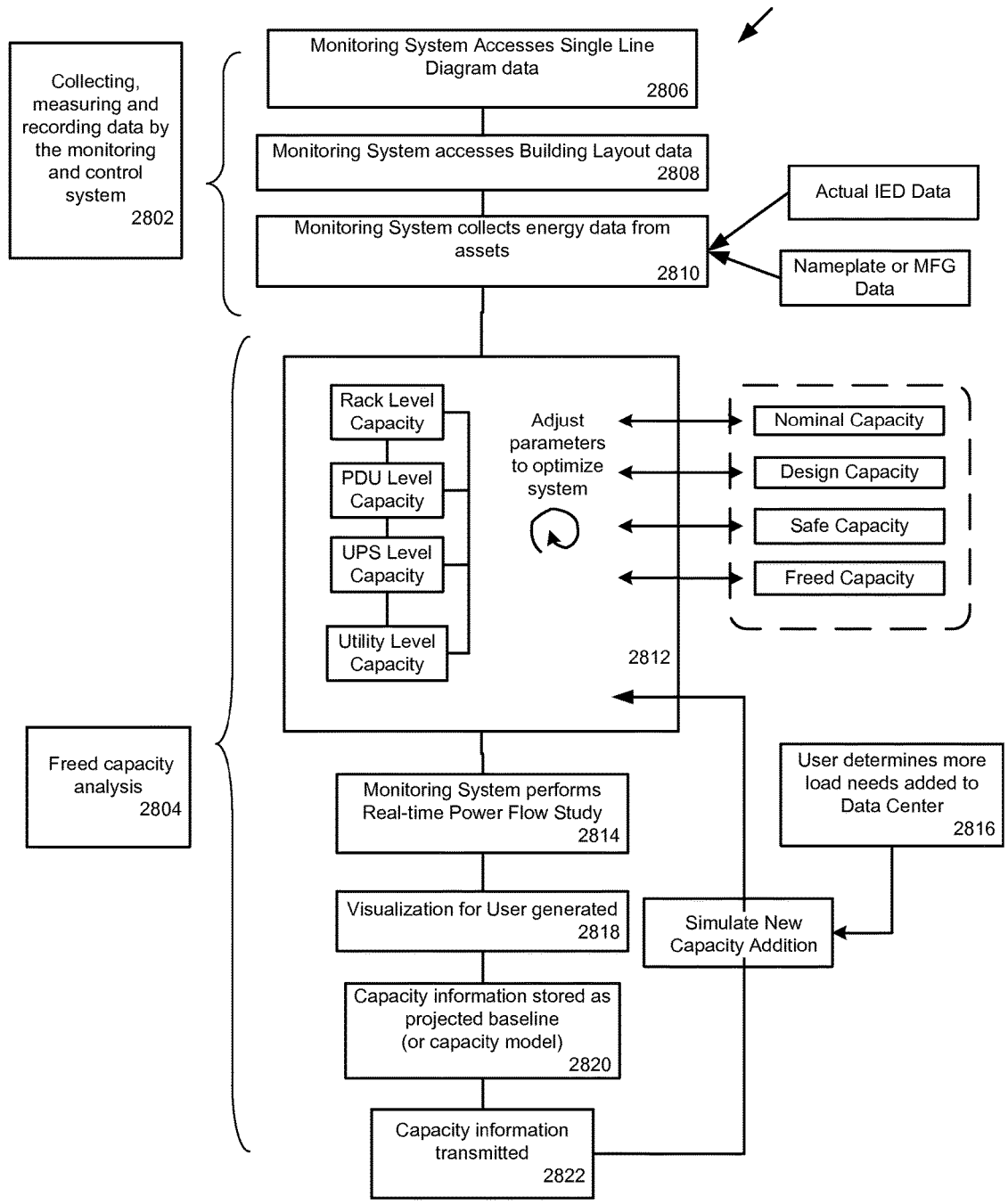
FIG. 28 is a flowchart of a method of generating freed capacity in accordance with one embodiment.

FIG. 28 illustrates one method 2800 for generating freed capacity. In step 2802, the monitoring and control system collects, measures and records the needed data and provides the data as inputs to the freed capacity calculation. In step 2804, the STA component 608 then proceeds with the freed capacity calculations.

In step 2806, the monitoring and control system retrieves a single-line diagram, the building layout data and information from various assets. In some examples, the single-line diagram may be stored in the power management system 406 and may be calculated as part of the power flow analysis as described above with reference to FIG. 17. To obtain the building layout data (step 2808), the monitoring and control system may interface with a data center infrastructure management (DCIM) System or the building management system 408. The building layout data may include information such as building floor plan, visualizations, IT equipment/asset information, and drawings (i.e., where certain assets are located on the floor plan). This information may allow a user to visually overlay the assets with the physical floor layout.

In step 2810, the monitoring and control system collects all the energy related information and data, such as power quality and power reliability information, from assets using various monitoring points. In addition, energy related information can be obtained from the manufacturer's specifications or from industry data.

In step 2812, once all the asset and electrical system information is collected, the monitoring and control system can validate the information against design capacity, which may be a fixed value based on the electrical equipment used. The monitoring and control system can then calculate the design capacity and industry-accepted safe capacity of all the loads at each monitoring point. These system capacity figures can now be used by the STA component 608 to perform the STA analysis or by the optimization component 306 to optimize the system by taking advantage of freed capacity.

In step 2812, the STA component 608 calculates the capacity figures starting at the lowest level in the electrical system, and then generating the figures for the next level up in the electrical system, until the entire electrical system is analyzed. While generating the capacity figures for every level, the STA component 608 continually adjusts the capacity parameters to optimize the system, starting at the lowest level. For the electrical network shown in FIG. 16, the lowest level is the Rack or IT Load level, followed by the PDU, the UPS level and the top followed by the highest level, the utility level. The STA component 608 generates the system capacity figures (nominal capacity, design capacity, safe capacity and freed capacity), as described above, at each level. In addition to generating the figures, the STA component 608 optimizes the system, in one example, by finding the maximum amount of Freed Capacity at the lowest level in the electrical system that when utilized does not cause upstream problems or outages at upstream levels in the electrical system. The calculations in step 2812 are iterative in nature.

In step 2814, after the STA component 608 calculates the electrical systems freed capacity at all levels, the monitoring and control system can perform a real-time power flow study to ensure the assets are in operation within the specified parameters. For example, if the user determine additional loads need to be added to the data center (step 2816), the power flow study information can then be updated with the new load requirement.

A visual representation of the new simulated power flow is generated (step 2818) and can be retained by the monitoring and control system to be referenced later as a projected capacity baseline for comparison (step 2820). Finally, capacity information may be transmitted by the monitoring and control system to another system or to a user, so that the system or user can make a decision regarding freed capacity by comparing the capacity to the required utilization needs (step 2822). The capacity information can be transmitted automatically, by providing one or more alarms to the users, or manually through user intervention.

The method 2800 described above, can also be performed for a specific portion of the electrical network, by generating the capacity figures at the lowest level (i.e., Rack level) and performing the same iterative calculations. By analyzing a specific portion of the electrical network, the system or the user can narrowly examine the freed capacity of a sub-section of the electrical system. By narrowly determining freed capacity, the user can determine whether a single server to a rack can be added to the network and can further determine the best location for the rack.

It can be appreciated that the STA analysis in step 2812 can be performed on request by the user, at a defined point in time, such as when a user requests to add new equipment, during the peak in the loads or dip in the load of the system. In other examples, the STA analysis can be performed in real-time or done over a period of time, such as a rolling analysis. According to some examples, performing the STA analysis at different points in time, for example, during a peak load, gives the user the ability to see if and where any new loads or assets can be added. Generating the analysis at off-peak times may give the user the ability to see where (and when) assets and their loads can be added to maximize the entire data center or sub-section during certain off-peak schedules. Generating the analysis during a long enough statistically significant time periods may generate a confidence level in the data calculation.

According to some embodiments, the user involvement may be reduced or even eliminated by automating the STA analysis in step 2812. In some examples, the monitoring and control system may have enough monitoring points and associated information to generate the actual design capacity of the data center. In addition, with the monitoring points and by using IEDs, the freed capacity analysis in steps 2804 can be done in real-time.

Automation may become important during real-time or near-real time analysis of the system. This is partially because the combination of IEDs and the monitoring and control system gives the ability to turn off non-critical loads or assets during peak loading or other defined times. For example, lighting loads often utilize a large portion of the required power to a building, and keeping in mind that cooling units are a critical load in a data center, the IEDs may be programmed to turn off certain lighting loads to energize more cooling units during peak times, to keep the energy usage constant or not go over a pre-defined limit (often buildings and companies can be penalized financially by their energy provider if they go over a certain defined usage during peak periods). It can be appreciated that if the IEDs are programmed to turn assets on and off, the freed capacity will also fluctuate, thus it becomes very complex for a user to manage an entire system without the help of at minimum partial automation. The monitoring and control system will be required to help the user make decisions if the freed capacity is impacted by changing conditions in the system. In another example, the monitoring and control system can also be used to modify the assets during peak times to allow for more freed capacity, or at least ensure the calculated freed capacity remains available—this would happen by the monitoring and control system raising the HVAC set-point which cools the racks (more cooling equates to less load on racks).

The visual representations generated for the user in step 2818 are performed by the monitoring and control system. In one embodiment, the visual representations include capacity graphs as shown in FIGS. 23-26. The capacity graphs allow the user to be able to compare the utilization to the capacity across time, and aid in planning for when, or if, new capacity for new loads needs to be added. The visual representations can be generated for the entire data center, various sub-components and their downstream loads. Visualizing the capacity for the entire data center provides a macro view to the user, and helps the user to plan for capital expenditure or new critical building needs. Visualizing capacity for the sub-component and the downstream loads gives the user the ability to ensure that an asset is fully maximized in one physical area, for example on one circuit breaker.

Another type of visualization provided to the user includes a visual representation of the loads and assets on the physical floor space of the data center or critical building. This type of visualization allows the user to not only see if more electrical loading can be added, but if there is physical space to add any mechanical, electrical or whitespace asset equipment at the visualized location.

Figure 29:
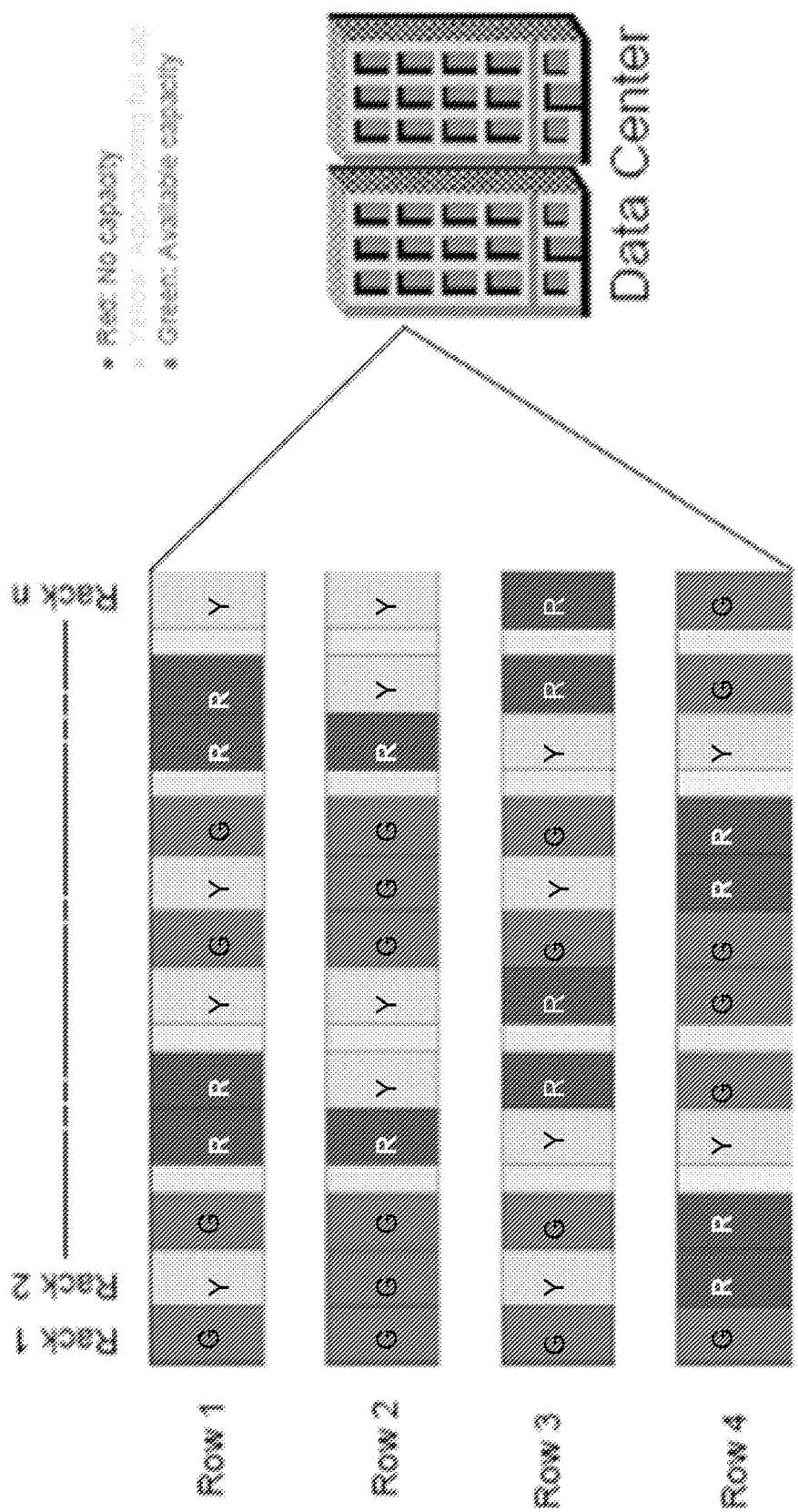
FIG. 29 is a block diagram of an IT-based visualization in accordance with one embodiment.
Figure 30:
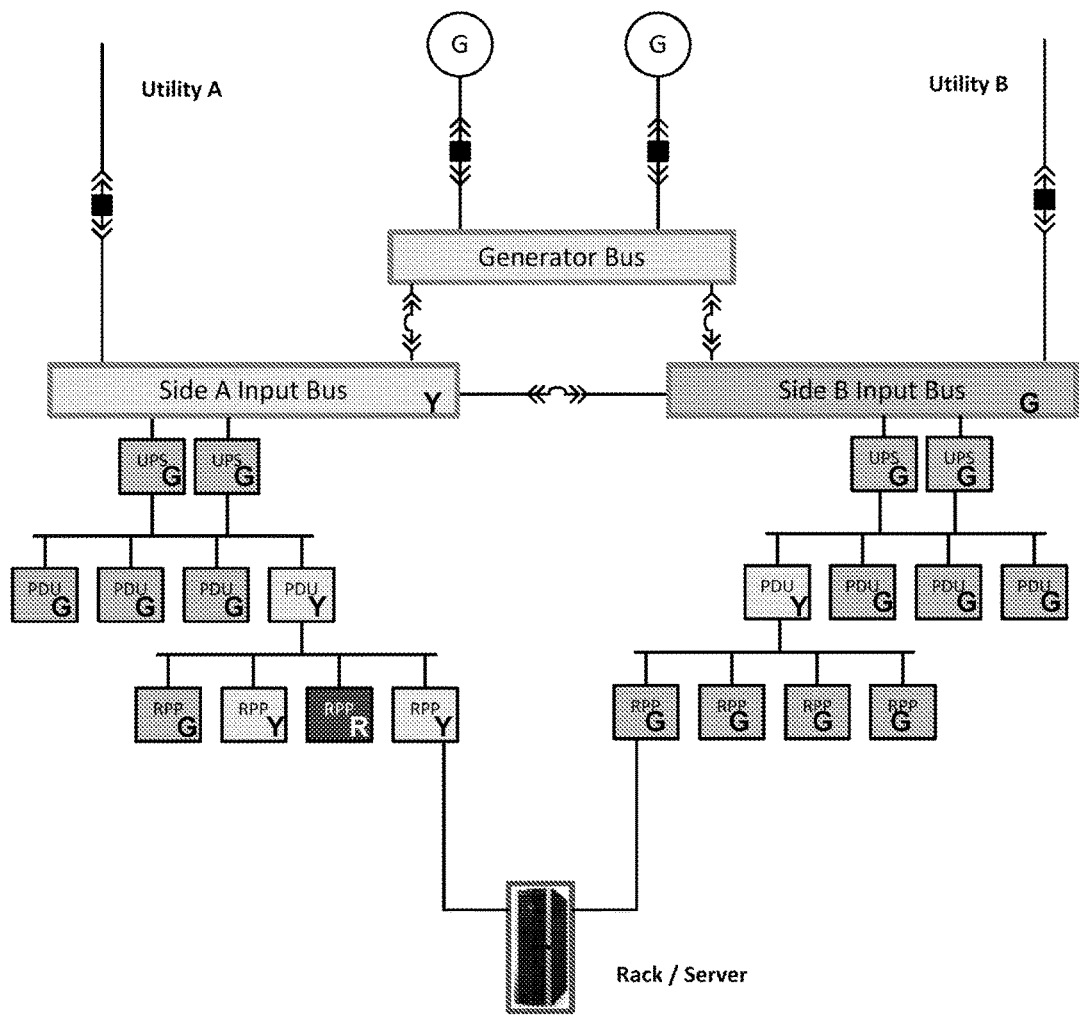
FIG. 30 is a block diagram of a facility-based visualization in accordance with one embodiment.
Figure 31:
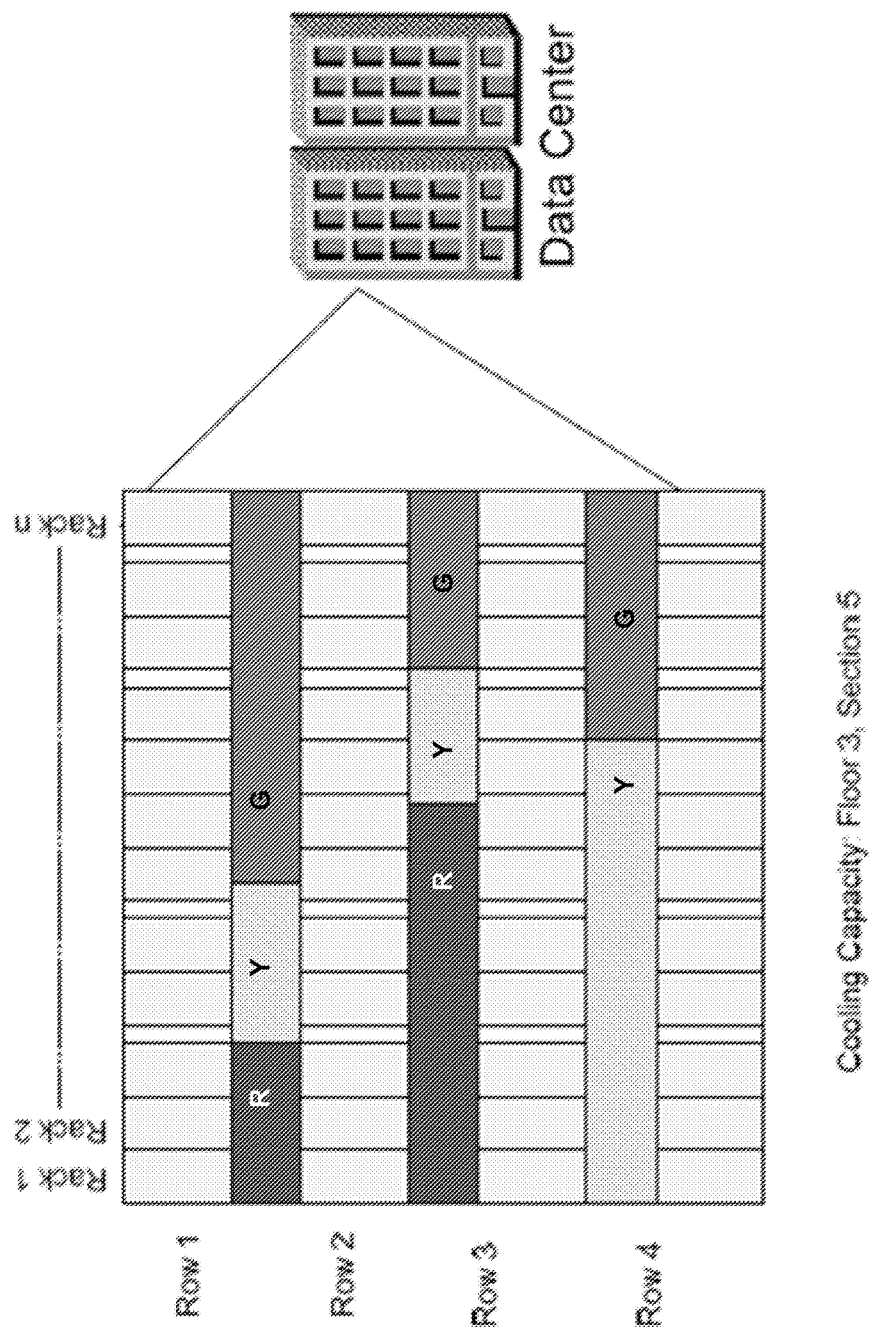
FIG. 31 is a block diagram of a cooling-based visualization in accordance with one embodiment.

FIGS. 29-31 illustrate other types of visualizations including an IT-based view, a facility based view, a cooling based view and a holistic view. The IT-based view, shown in FIG. 29, may indicate where there is capacity to add a new load. The IT-based view shows the electrical capacity from the IT user's perspective. The visual representation allows the IT staff to know where in the data center, down to the row and rack number, to safely add more servers. It is appreciated that IT-based staff may not be concerned with electrical infrastructure, as they typically rely on the facility manager to operate and keep their electrical IT needs supported. Therefore this visualization of the data center floor allows the proper context for the IT staff to determine capacity or to add a new load.

FIG. 29 shows a representation of the physical floor layout of a section of a data center including five rows of server racks, with racks numbered 1 to N. The layout may visually indicate the racks with available capacity, no capacity or approaching full capacity. Utilization of a rack approaching full capacity may need a confirmation from the facility manager. In one example, colors may indicate the different types of capacity, with red (R) indicating no capacity, yellow (Y) indicating approaching full capacity, and green (G) indicating available capacity to add new server equipment. This view can be accessed when an IT user needs to add additional servers to the existing data center. In some cases, this decision may be made independently from the facilities team.

The facility-based view may include a single-line or one-line diagram. FIG. 30 illustrates one example of the single-line diagram typically viewed by the facility manager or building operator. Similarly in this view, colors may indicate capacity, for example red (R) indicates no capacity to add more equipment, yellow (Y) indicates that the equipment is approaching full capacity and may need to be checked before adding loads under that level of equipment, and finally green (G) indicating available capacity to add new server equipment.

The cooling-based or environmental view may show the floor plan and the cooling ability. This view takes into account environment impact of both the suggested change, and the actual change in the electrical system. FIG. 31 illustrates one example of the cooling view. The cooling visualization is similar to the physical floor layout shown in FIG. 29, but offers indications from the building management system which racks and rows can have additional equipment installed without increasing the cooling needs (and hence electrical load), and which are near the limit and would require an increase in cooling to that specific rack, row or even floor. In FIG. 31, colors may indicate whether the inlet temperature at a rack or server is within a targeted range. For example green (G) may indicate that adding additional capacity does not impact the overall area. Yellow (Y) may indicate that the equipment is on the edge of accepted tolerances and red (R) may indicate that adding another server would cause the inlet temperature to exceed tolerances.

The holistic view may be a combination of the power, cooling and IT/layout views combined. By combining the information of electrical loading view (shown in FIGS. 29 and 30) as well as the environmental view (FIG. 31) the monitoring and control system can provide a representation to the users a view that balances the needs of building operators, facility managers and IT managers, on where to add the most optimized load for the electrical system.

Determining Power Reliability Index (PRI)

The Power Reliability Index (PRI) provided by the PRI component 604, provides users, such as co-location system operators, with a real-time metric that summarizes the overall risk or performance of reliability of the electrical system. The reliability evaluation considers the surety of supply risk and the internal risks related to the distribution system design, component characteristics and load types, and factors in additional metrics for the user. PRI is a real-time metric that the monitoring and control system can log. PRI analysis further allows users or the system to produce an alarm if the real-time PRI value crosses a threshold, allowing users or the system to monitor the long-term trends in reliability. In addition, the PRI metric balances efficiency with the reliability risks to give a more nuanced view of the overall data center operations. Further, the PRI metric is calculated in real-time and may factor in the modeled system and equipment, taking into account any new failure rates of equipment as the failures are detected, for example via alerts from the equipment supplier or the facility manager.

According to some embodiments, PRI metric is calculated by the PRI component 604 by estimating the instantaneous electrical network reliability based on measurements from a number of smart meters in the electrical network. The PRI metric is then visually displayed to the user as a status report or in the form of a visual representation of the data center with power quality values (discussed below) represented numerically along with components of the data center or represented relatively using colors (e.g., Red, Yellow, Green) indicative of the power quality and the PRI metric based on power quality. The PRI metric may be part of a user's general daily workflow evaluations and/or as part of a maintenance action.

The PRI analysis can ensure the system has the proper reliability promised to customers. When an increase in capacity is desired, the STA analysis and the RTRD analysis described above, as well as the PRI analysis described below, work together to identify changes in the electrical infrastructure that can maximize space and capacity safely without impacting redundancy or reliability. Because the system reliability is monitored by the PRI component 604, when the change in electrical infrastructure is made, the PRI component 604 analyzes the new electrical system to ensure the STA and RTRD implementations remain operational, while keeping the PRI metric in line with targets or preset limits. The PRI metric can be further combined with the data center's PUE metric, described above, to determine Reliability-Adjusted PUE value or Reliability Enhanced Power Usage Effectiveness (REPUE) metric. This metric balances a data center's efficiency with the reliability risks to give a more nuanced view of the overall data center operations. In one example, if the PRI metric indicates high reliability risk to the data center, efficiency may temporarily be impacted, such that changes in the electrical network may be made that mitigate the reliability risks but decrease efficiency. Similarly, turning off one or more non-critical cooling devices may increase PUE, but may also lower the reliability of the electrical network. The PUE and PRI metrics could be combined where, under high risk, the expected range for a good or excellent PUE value would be adjusted to indicate that while the conversion efficiency may be higher than normal it may still fall within an acceptable range given the high risk state. Further, by evaluating the impact of an operational schedule, the PRI metric may provide real-time reliability assessment to assure both high PUE and reliability of the electrical network.

In one embodiment, PRI errors may be generated for the user as an exception based metric. The PRI component 604 may provide an alarm in real-time notifying the user of an error, for example the PRI trends in wrong direction, or there is a spike in PRI. In one example, the user may only check the PRI metric is there is such an error.

In one example, the PRI metric calculation provides a binary "pass," "fail" or a PRI value for the Key Performance indicators (KPI). However, based on human intervention, the end result PRI metric may not be aligned with a real-time situation and trigger a "failure" or other alert erroneously. To correct for these errors, the KPI value can be applied against a Logic Curve which can work to smooth out a surge or a spike in the PRI without impacting the REPUE metric. The surge or spike can be detected depending on the time the metric holds at the KPI value before dropping back or increasing.

According to some embodiments, PRI metric is calculated by the PRI component 604 by estimating the instantaneous network reliability based on measurements from a number of smart meters in the electrical network. It is appreciated that the PRI metric, as determined herein, may be in the form of a vector comprising a number of power quality values determined at different nodes of the electrical network and for different power classes of equipment. In one embodiment, the vector of the power quality numbers, combined with other information such as the redundancy of electrical network and the severity of power quality deterioration, can define a PRI value for the Key Performance Indicators. System administrator and maintenance personnel can use this PRI value as an index to find more detailed information The methods of calculating PRI, further described below, are different from existing evaluation methods that assume the exponential distribution of time between failures and use theoretical metrics such as mean time between failures (MTBF). Instead, the new PRI methods described herein are data-driven and take advantage of smart meters that are capable of recording various Power Quality (PQ) indicators at selected monitoring points. According to some embodiments, the method of determining power quality estimates the instantaneous network reliability, which describes current network reliability status, based on measurements from a limited number of smart meters in the electrical network. The method solves the technical challenges in the accurate estimation of instantaneous network reliability, using Monte Carlo Expectation Maximization (MCEM).

In addition, the power quality concept can be further used to predict device outages and effectively schedule maintenance. For example, since the PRI metric records the vector of power quality numbers, when one of the power quality values for the KPI triggers an alert, system administrator and maintenance personnel can use the historical records of the power quality vectors to find the critical components that should be maintained to avoid potential power outages.

The existing PRI metric consists of a group of metrics to evaluate the reliability of power systems including, for example, Mean Time Between Failure (MTBF), Mean Time to Maintain (MTM), Mean Time to Repair (MTR), and inherent Availability (Ai). These metrics can be used to make generic predictions about the number of hours of total power failure at critical loads. While the existing PRI can provide important information on system reliability at the planning and design stage, it may not offer the guidance facility operators and maintenance personnel need to maintain high reliability. For instance, the common proclamation that a facility that has achieved 5-9's availability can expect an average downtime of approximately 5 min per year may be dangerous and practically may not be helpful. Similarly, results based on a simplified mathematical model, such as the Poisson assumption on the number of failures, may have the same problem of being impractical.

Accordingly, the new approach described below evaluates power reliability from a more practical perspective by determining a new PRI metric. In one embodiment, the overall network reliability is characterized as a function of power quality, which is measured with smart meters at monitoring points throughout the network. One example of a smart meter is a PowerLogic Energy and Power Quality Meter, provided by Schneider Electric. Because the new PRI looks at the quality of power at those loads over all operating conditions, it provides a better view on the current network reliability condition. Furthermore, in one example, the new PRI estimates the power quality based on historical operating log data, and thus can support more accurate predication on power outage, which is important for effective maintenance scheduling. In this example, the new PRI can be used as a predictive or diagnostic tool, and can complement the existing PRI by providing insight into the causes of potential failures.

To determine the new PRI, the PRI component 604 may need to accurately model the propagation of power quality, based on a limited number of measurement points. Mainly, due to cost constraints, not every electrical component can be monitored. As such, inference of power quality event propagation may be needed, given incomplete monitoring of a power network.

Hence, the PRI approach described below proposes a generic analytical model that is useful for reliability evaluation in real time. A case study illustrates the application of this model in practice. In addition, Expectation Maximization (EM) with Markov Chain Monte Carlo (MCMC) simulation is adopted to estimate and infer the overall network reliability, using partial power quality information. Further, a performance indicator based on cumulative suffer time is proposed. The performance indicator tracks the cumulative time that an electronic component has experienced "poor" power quality. Combined with the specific features of the individual device, this performance indicator may be beneficial in maintenance scheduling.

The PRI metric may further factor a number of internal as well as external factors and even down to which portion of the building. Examples of external factors may be a power quality event tied to an outside factor such as outages, spikes on the grid, lightning at the closest transformer, as well as other power quality events, which may be uncontrollable by the building. Examples of internal events may include a trip due to over-capacity of a circuit. In one example, each power quality event can be tagged with a piece of data, such as geographical position of where the event occurred so the building manager can run the metric based on geography/building sector.

The industry standard practices for electric power quality in networks focus on measures such as Mean Time Between Failure (MTBF), reliability, and availability as defined by the IEEE Gold Book. None of these explicitly account for power quality, although it is known that there exists a relationship between power quality and the lifetime and performance of components. Expectation Maximization (EM) is an iterative technique for determining the maximum likelihood parameters of a model with incomplete data. This technique iteratively calculates the expected log-likelihood of the data and current parameter guess with respect to the incomplete data (E Step) and then updates the parameter guess to maximize the expected log-likelihood (M Step).

Stochastic variations have been developed for cases where a closed-form solution is not available for the expectation calculation. In particular, Markov Chain Expectation Maximization (MCEM) executes the E Step through Markov Chain Monte Carlo (MCMC). Traditional EM can also be called batch EM, because statistics are computed over the entire dataset. An alternative is online EM, where parameters are updated after a subset of examples. This variation can be used to improve the speed of convergence or to update a model as new evidence becomes available. There are several approaches to online EM, including incremental EM and stepwise EM. With a proper choice of step size and mini-batch size, stepwise EM can match the performance of batch EM while increasing the speed of convergence.

Network Model of Power Grid

Because the new PRI approach is based on power quality events, in one example, time is sliced into units of consistent duration, power quality is discretized into events and each time slice is characterized by its most extreme event. We may model a power grid network as a weighted, directed graph $\dot{G}=(V, E, W, Q, F)$, where:

each node $v \in V$ represents an electrical component;

each edge $e_{ij} \in E$ represents the flow of power from component i to j, which is also called an input edge to node j and an output edge from node i;

associated with each edge is a weight value, $w \in W$, which is set to the probability that power flows along that edge, where $\Sigma_j w(e_{ij})=1$;

at each time slice, each edge is assigned a power quality value $q \in Q$, which represents the most extreme power quality event that occurs during that time slice; and at each time slice, each input/output edge pair of a node is associated with a power quality transition function $f \in F$, which describes output power quality as a function of input power quality.

Note that edge weights are likely dominated by planned maintenance and operational activities but are also affected by unplanned events such as power failures. Also note that in some examples, power quality values are time dependent. In these examples, a power quality value may be assigned to an edge only if power flows along the edge during the time slice. The power quality transition function may depend on the power quality of the input edge, the operating condition of the node (i.e., the electrical component), and the load of the output edge. In addition, this power quality transition function may be probabilistic and is potentially dynamic and can evolve over time. In one embodiment, power quality transition function may be impacted by many factors, including the maintenance schedule, age of components, and history of power quality events.

One example of the directed graph is described with reference to the network shown in FIG. 34. The nodes v include the utility feed, four circuit breakers, one transformer, and two UPS's. The edges, for which the weighted value, w, and the power quality, q are calculated are represented by the power lines between the nodes. In one example, assuming that all circuit breakers are on, the weight, w, of each value is 1 and the power quality on each edge is either measured with the smart meters or inferred using the algorithms discussed below. The power quality transition functions can then be obtained using a data-driven approach and can be updated in real-time with operating data and statistical analysis.

Smart Meter Based PRI

In one example, power quality events are disturbances from the nominal voltage that are recorded by smart meters. A power quality event may include an event ID, an event class, and the relevant physical meaning (e.g., min/max voltage, duration, etc.). Many systems may exist to classify power quality events. One such system is shown in Table I.

TABLE I

POWER QUALITY EVENT CLASSIFICATION DEFINED BY IEEE STANDARD 1159 [8]

| ID | Class | Voltage (% nominal) | | Duration (seconds) | |
|----|-------|------|------|------|------|
| | | Min | Max | Min | Max |
| 1 | Microsecond Transient | 0 | unlimited | 0 | 0.001 |
| 2 | Millisecond Transient | 0 | unlimited | >0.001 | 0.008333 |
| 3 | Instantaneous Sag | 10 | 90 | >0.008333 | 0.5 |
| 4 | Instantaneous Swell | 110 | unlimited | >0.008333 | 0.5 |
| 5 | Momentary Interruption | 0 | <10 | >0.008333 | 3 |
| 6 | Momentary Sag | 10 | 90 | >0.5 | 3 |
| 7 | Momentary Swell | 114 | unlimited | >0.5 | 3 |
| 8 | Temporary Interruption | 0 | <10 | >3 | 60 |
| 9 | Temporary Sag | 10 | 90 | >3 | 60 |
| 10 | Temporary Swell | 110 | unlimited | >3 | 60 |
| 11 | Sustained Interruption | 0 | <10 | >60 | unlimited |
| 12 | Undervoltages | 10 | 90 | >60 | unlimited |
| 13 | Overvoltages | 110 | unlimited | >60 | unlimited |
| 14 | Nominal | Anything not covered above | | | |

As used herein, the event ID may be used to uniquely identify a power quality event class. Unlike existing PRI metrics that consists of a group of theoretical metrics such as Mean Time Between Failure (MTBF), the new PRI may be based on historical measurement data with smart meters. In some embodiments, the new PRI is targeted at achieving two main goals: 1) Accurate evaluation of current network reliability status; and 2) Effective prediction of potential network outages in the future. Corresponding to the above objectives, quantitative PRI metrics are proposed including: instantaneous network reliability over a time slice; cumulative suffer time of an electronic component; and expected survival time of an electronic component.

In one example, instantaneous network reliability over a time slice may be defined as a vector $<q_1, q_2, \ldots, q_m>$, where m is the total number of edges of the network and $q_i$ is the power quality ID on edge i over the time slice. Note, that due to the fast propagation speed of electric flow, the impact of a power quality change may be instantaneous (in the granularity of a time slice) throughout network. In some examples, cumulative suffer time of an electronic component is the total number of time slices during which the electric component experiences unfavorable power conditions. The definition of unfavorable power conditions may be device-dependent. In addition, the expected survival time of an electronic component may be defined as the expected time that the electric component would survive, given the past and current instantaneous network reliability.

Estimation of Instantaneous Network Reliability

Figure 32:
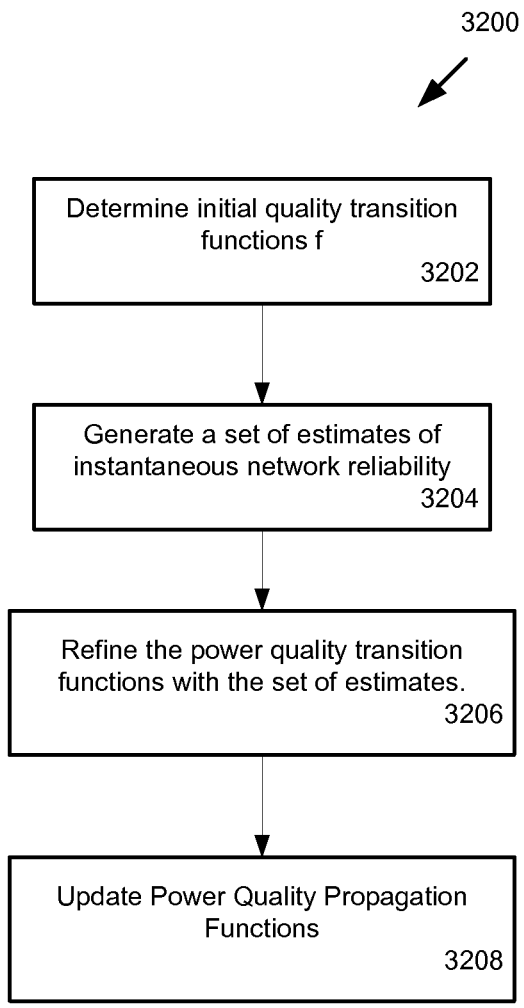
FIG. 32 is a flowchart of a method of determining expectation maximization in accordance with one embodiment.

Because the measurements of the power quality are taken on a limited number of edges over a time slice. The power quality on those limited number of edges is denoted as $q_1$, $q_2$, . . . , $q_l$, where l<m. In one example, an iterative expectation maximization (EM) method 3200 is performed by the PRI component 604, as shown in FIG. 32. In step 3202, the PRI component 604 may determine the initial power quality transition functions, $f$, for classes of electrical components. As further described below, a data-driven approach may be used to approximate $f$ by using published statistical data and collected historical power quality events.

In step 3204, the PRI component 604 may generate a set of estimates of instantaneous network reliability by using available measurement results and statistical inference as further described below. In one example, the power quality of a network may not be metered at every edge in the graph, and thus the aim is to obtain a set of estimates of the entire network, given the subset of edges that are measured. At the end of this step, a set of feasible estimates of instantaneous network reliability, as well as the maximum likelihood of instantaneous network reliability may be obtained. In one example, step 3204 is performed for each time slice.

In step 3206, the PRI component 604 may refine the power quality transition functions with the results from Step 3204. Step 3206 may be performed over a larger time window which may consist of multiple time slices. The above steps may not be performed in real time. For example, the steps could be performed on an hourly or a daily basis with log data from smart meters, depending on the conditions on the reliability evaluation.

In step 3208, the PRI component 604 may update the power quality propagation functions, as they may change with time.

Step 3202: A Data-Driven Approach to Power Quality Propagation Function

According to some examples, the manufacturer of an electric device may be able to provide the statistical results on the correlation between the quality of input power and the quality of output power. Nevertheless, such test results may not be available in most cases. To obtain the power quality transition function $f$ of an electric device, the monitoring and control system may measure and record the power quality of the input link and the power quality of output link(s) of the device. Based on the operating log data, statistical analysis may then be performed to build the power quality transition function $f$, which is represented with a probability matrix.

Figure 33:
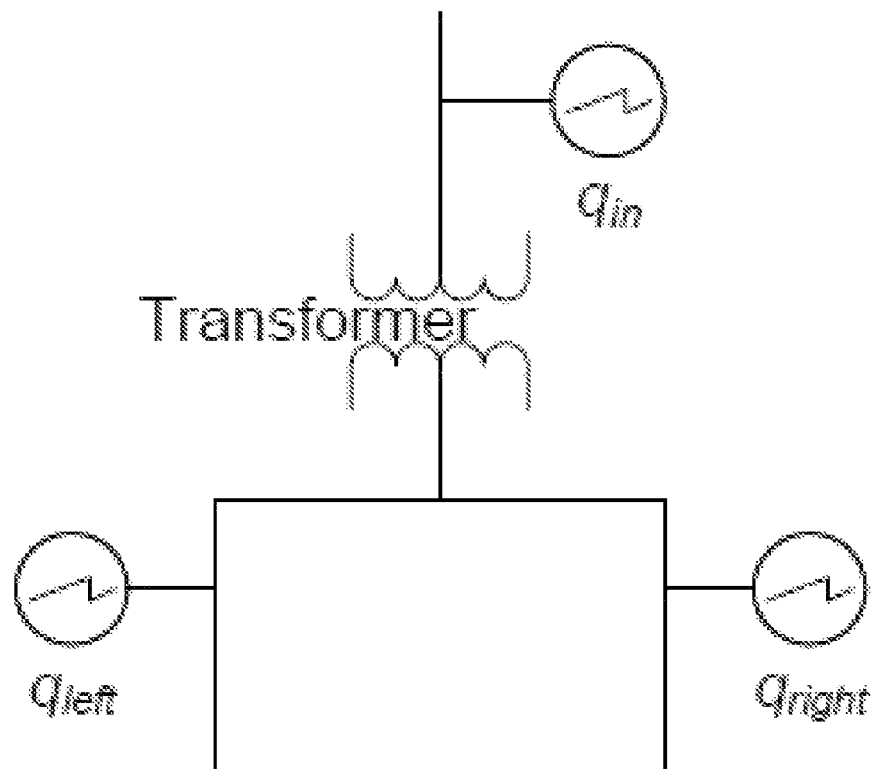
FIG. 33 is a schematic of a transformer in accordance with one embodiment.

FIG. 33 illustrates one example of the data-driven approach using a transformer. As shown in FIG. 33, the transformer may have one input and two output branches. To obtain the power quality transition function $f$ of the transformer, the monitoring and control system includes one measurement point at the transformer input ($q_{in}$) and two measurement points along each of the two branches of the transformer output ($q_{left}$ and $q_{right}$). Power quality events are classified according to Table I. The nominal class represents high quality power with no events. Since power quality events of different classes often have different durations, electrical components may introduce a tiny delay in propagation, and meters may not be perfectly synchronized, we allow a small time window (i.e., the duration of a time slice) around each event to identify correlated events.

We then associate the data between the three metering points $q_{in}$, $q_{left}$ and $q_{right}$. If the input is used as the reference, for each event $q_{in}$, all other events $q_{left}$ and $q_{right}$ that occurred within the same time slice of event $q_{in}$ can be determined. If an output had no event in that time window, it should be assigned an event of class "nominal" and associated with $q_{in}$. If an output had more than one event, only the most severe may be associated with $q_{in}$. Similarity, if using other two points as the reference, we can repeat this same process to find the association.

By counting the number of output events given each input type, the probabilistic power quality transition function $f$ can be generated between an input/output pair shown in Tables II and III.

TABLE II

AN EXAMPLE TRANSITION MATRIX FOR TRANSFORMER

| | | Output Power Quality ID | | | | | | | | | | | | | |
|---|---|---|---|---|---|---|---|---|---|---|---|---|---|---|---|
| | | 1 | 2 | 3 | 4 | 5 | 6 | 7 | 8 | 9 | 10 | 11 | 12 | 13 | 14 |
| Input Power Quality ID | 1 | 0 | 0 | 0 | 0 | 0 | 0 | 0 | 0 | 0 | 0 | 0 | 0 | 0 | 24 |
| | 2 | 0 | 0 | 5 | 0 | 0 | 0 | 0 | 0 | 0 | 0 | 0 | 0 | 0 | 17 |
| | 3 | 0 | 0 | 124 | 0 | 0 | 3 | 0 | 0 | 0 | 0 | 0 | 0 | 0 | 17 |
| | 4 | 0 | 0 | 0 | 0 | 0 | 0 | 0 | 0 | 0 | 0 | 0 | 0 | 0 | 0 |
| | 5 | 0 | 0 | 0 | 0 | 0 | 0 | 0 | 0 | 0 | 0 | 0 | 0 | 0 | 0 |
| | 6 | 0 | 0 | 7 | 0 | 0 | 21 | 0 | 0 | 0 | 0 | 0 | 0 | 0 | 0 |
| | 7 | 0 | 0 | 0 | 0 | 0 | 0 | 0 | 0 | 0 | 0 | 0 | 0 | 0 | 0 |
| | 8 | 0 | 0 | 0 | 0 | 0 | 0 | 0 | 0 | 0 | 0 | 0 | 0 | 0 | 2 |
| | 9 | 0 | 0 | 0 | 0 | 0 | 0 | 0 | 0 | 0 | 0 | 0 | 0 | 0 | 0 |
| | 10 | 0 | 0 | 0 | 0 | 0 | 0 | 0 | 0 | 0 | 0 | 0 | 0 | 0 | 0 |
| | 11 | 0 | 0 | 2 | 0 | 0 | 0 | 0 | 0 | 0 | 0 | 0 | 2 | 0 | 0 |
| | 12 | 0 | 0 | 0 | 0 | 0 | 0 | 0 | 0 | 0 | 0 | 0 | 0 | 0 | 0 |
| | 13 | 0 | 0 | 0 | 0 | 0 | 0 | 0 | 0 | 0 | 0 | 0 | 0 | 0 | 0 |
| | 14 | 0 | 0 | 6 | 0 | 0 | 1 | 0 | 0 | 0 | 0 | 0 | 0 | 0 | 5 |

TABLE III

AN EXAMPLE POWER QUALITY TRANSITION FUNCTION FOR TRANSFORMER

| | | Output Quality ID | | | |
|---|---|---|---|---|---|
| | | 3 | 6 | 12 | 14 |
| Input Quality ID | 1 | 0 | 0 | 0 | 1.00 |
| | 2 | 0.23 | 0 | 0 | 0.77 |
| | 3 | 0.86 | 0.02 | 0 | 0.12 |
| | 6 | 0.25 | 0.75 | 0 | 0 |
| | 8 | 0 | 0 | 0 | 1.00 |
| | 11 | 0.50 | 0 | 0.50 | 0 |

Note that the numbers in the matrix of Table II represent the times that the corresponding input/output events occur. The matrix in Table III omits the lines in Table II that include all zeros, and translates the counts to frequency values.

Step 3204: Markov Chain Monte Carlo (MCMC) Simulation to Estimate Instantaneous Network Reliability In step 3204, the density functions of the unknown values of power quality in Q are determined, given a power grid network represented by G=<V,E,W,Q,F> as described above. The node, edge, weight and function values V,E,W,F available but power quality, Q only partially known from the available measure values of q. In other words, Q=<$q_1$, $q_2$, ..., $q_m$>, represents the complete set of power quality values and $Q_{obs}$={$q_1$, $q_2$, ..., $q_l$}, represents a subset of the power quality values measured by smart meters where l<m. $Q_{est}$={$q_{l+1}$, ..., $q_m$}, represents a subset of the power quality values that are estimated and are currently unknown. In step 3204, the PRI component 604 determines the density function of $q_i$ (i=l+1; l+2, ..., m).

In one embodiment, the PRI component 604 uses the Markov Chain Monte Carlo (MCMC) simulation to provide estimated power quality values. One example of the solution is illustrated in Algorithm 1:

Algorithm 1 MCMC simulation to estimate instantaneous network reliability

INPUT: G = < V, E, W, $Q_{obs}$, F >  Algorithm (1)
INPUT: max {The maximum number of samples}
OUTPUT: density function of $q_i$ ∈ $Q_{est}$
{Initialization:}

-continued

Algorithm 1 MCMC simulation to estimate instantaneous network reliability for all $q_i$ ∈ $Q_{est}$ do
   Assign a value uniformly at random
end for
for i = 1 to max do
   {Improve the current estimates:}
   $\overline{Q}_{est}$~h($Q_{est}$) {by resampling $Q_{est}$ using a proposal function}
   $\overline{P}$ = Prob{$\overline{Q}_{est}|Q_{obs}$, F}
   $\alpha = \min\left(1, \frac{\overline{P}}{P}\right)$
   $Q_{est} = \overline{Q}_{est}$ with probability α
end for
return density function (i.e., frequency) of $q_i$ ∈ $Q_{est}$ In one example, the PRI component 604 may randomly initialize the latent variables and construct a Markov chain by accepting new states with a probability proportional to their likelihood. States generated during the initial "burn-in" period are disregarded and from the Markov chain are sampled. The sampling frequency may be long enough to ensure samples are independent.

The Metropolis-Hastings algorithm may then be used to implement the re-sampling. From the current state in the Markov chain, a symmetric transition to a new state by re-sampling all observations q is described by:

$$q^{i+1} = \mathrm{mod}(\lfloor N(q^i,\sigma)+0.5 \rfloor, M) \qquad \text{Equation (1)}$$

where M is the number of classes of power quality events and N($q^i$, σ) is a Gaussian with mean $q^i$ and standard deviation σ.

Step 3206: Learn Power Quality Propagation Functions with EM

In Step 3206, known transition functions are assumed: The transition functions may not be known a priori, because these statistics may not be published and a network rarely has enough metering points to apply the simple technique shown in Step 3202. In one example, the PRI component 604 may need to estimate the transition functions based on incomplete metering of a network.

The proposed approach includes using expectation maximization (EM) to find a maximum likelihood estimation of power quality transition functions at time slice t (denoted by $F^t$), given a known network graph, device type d for each node, the locations of observed edges, and a history of observations $Q_{obs}$ up to time slice t. Due to the rarity of severe power quality events, the observation history should be sufficiently long to properly characterize the network components. One example of the EM determination is shown in Algorithm 2:

---
Algorithm 2 Expectation Maximization
---

Input: $Q_{obs}$ for time history $t \in T$      Algorithm (2)
Input: α (learning rate)
Output: transfer functions $f_d \in F$
Initialize $f_d^{i=0}$ for every device type d, where i denotes the iteration number
while functions in F not converged do
   Obtain samples $Q_{est}^i$ given current F (using Algorithm 1)
   for each device type d do
     Collect evidence for d, denoted by $Q_d^i$, from $Q_{est}^i$
     for $q_{in}$ in $Q_d^i$ do
       for $q_{out}$ in $Q_d^i$ do
         β = $|q_{out}|/|q_{in}|$ (number of times $q_{out}$ is output divided by number of times $q_{in}$ is input)
       end for
     end for
     $f_d^{i+1} = \alpha\beta + (1 - \alpha)(f_d^i)$
   end for
end while

---

Step 3208: Update Power Quality Propagation Functions with Online EM

The power quality transition functions may change over time. As such, the PRI component 604 need to dynamically refine the power quality transition functions to maximize the expected instantaneous network reliability as time goes on. This can be achieved by re-running batch EM as described in Step 3206 at regular intervals. Alternatively, online EM may be used.

Performance Indicator Based on Cumulative Suffer Time

In some embodiments, a new performance indicator may be determined based on the expected survival time for each component in the network, given the past and the current instantaneous network reliability. In at least one embodiment, to determine the expected survival time, the network is considered over a larger time window. As such, the cumulative suffer time of an electric device may then be used to predict the expected time for maintenance of the device.

Existing reliability theory usually assumes that the failure rate of an electric component is constant and that the time between failures follows an exponential distribution. Behind this assumption, the electric component is supposed to be "memory-less", which is the unique property of exponential distribution. In other words, the predicted amount of time to next failure does not depend on the historical operations of the component. Although this assumption may greatly ease the mathematical analysis of power system reliability, it may not be true in practice. Intuitively, the longer a device may be in service, the more likely it is to be worn out, and the more likely failure would occur. In one example, for a given device, the predicted amount of time between failures is more likely to diminish as the time in service increases. Thus, to predict system failure and take effective preventive actions, the new performance indicator determination may include an accurate model to capture the correlation between the failure rate and the historical operations of the device.

To determine expected survival time, it may be typically assumed that the failure rate of a device, λ, may be no longer constant, but is instead a variable over time, λ (t). For example, the failure rate of an automobile in its fifth year may be several times greater than its failure rate during its first year of operation. This variable model is more realistic, but it implicitly assumes a static, stable operating environment, or the impact of operating conditions is negligible. To overcome this pitfall, operating conditions (mainly power quality) are considered and a performance indicator over the evaluation framework is developed.

Case Study

Figure 34:
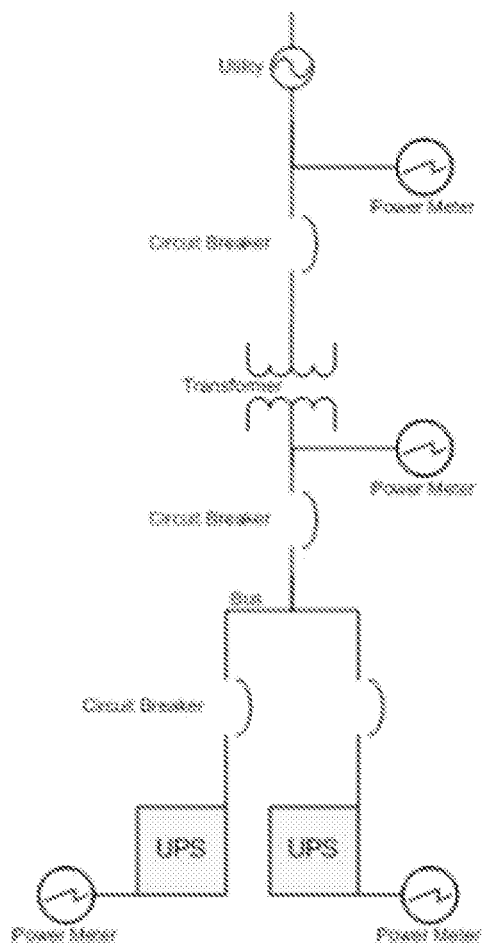
FIG. 34 is a schematic of a simulated network used to demonstrate the PRI metric analysis in accordance with one embodiment.

FIG. 34 illustrates one example of a simulated network to demonstrate the new PRI approach using a known topology and power quality transition functions. The electrical network shown in FIG. 34 includes a utility supplying power to two UPS units, as well as circuit breakers, a transformer, a bus and multiple power meters. Since true transition functions are not available for a wide range of network components, power quality classes are created including classes 1-5.

In this example, the power quality is assumed to be equivalent at all branches or outputs. In one embodiment, it may be possible to remove this assumption by introducing a virtual node to the graph, with multiple independent outputs. The probability density function (PDF) of the power quality at each unobserved node at time t is determined given the observed data and known transition functions. The transition functions are shown in Table VI, and the resulting network power quality is shown in Table V.

TABLE IV

TRANSITION FUNCTIONS

| | | Output PQ | | | | |
|---|---|---|---|---|---|---|
| | | Class 1 | Class 2 | Class 3 | Class 4 | Class 5 |
| | | Switch | | | | |
| Input PQ | Class 1 | 0.6 | 0.1 | 0.1 | 0.1 | 0.1 |
| | Class 2 | 0.4 | 0.3 | 0.1 | 0.1 | 0.1 |
| | Class 3 | 0.4 | 0.1 | 0.3 | 0.1 | 0.1 |
| | Class 4 | 0.4 | 0.1 | 0.1 | 0.3 | 0.1 |
| | Class 5 | 0.4 | 0.1 | 0.1 | 0.1 | 0.3 |
| | | Transformer | | | | |
| Input PQ | Class 1 | 0.85 | 0 | 0 | 0 | 0.15 |
| | Class 2 | 0.35 | 0.5 | 0.15 | 0 | 0 |
| | Class 3 | 0.2 | 0.15 | 0.5 | 0.15 | 0 |
| | Class 4 | 0.2 | 0 | 0.15 | 0.5 | 0.15 |
| | Class 5 | 35 | 0 | 0 | 0.15 | 0.5 |
| | | Bus | | | | |
| Input PQ | Class 1 | 1 | 0 | 0 | 0 | 0 |
| | Class 2 | 0.1 | 0.9 | 0 | 0 | 0 |
| | Class 3 | 0.1 | 0 | 0.9 | 0 | 0 |
| | Class 4 | 0.1 | 0 | 0 | 0.9 | 0 |
| | Class 5 | 0.1 | 0 | 0 | 0 | 0.9 |
| | | UPS | | | | |
| Input PQ | Class 1 | 1 | 0 | 0 | 0 | 0 |
| | Class 2 | 0.8 | 0.2 | 0 | 0 | 0 |
| | Class 3 | 0.8 | 0 | 0.2 | 0 | 0 |
| | Class 4 | 0.8 | 0 | 0 | 0.2 | 0 |
| | Class 5 | 0.8 | 0 | 0 | 0 | 0.2 |

TABLE V

PDFs OF POWER QUALITY. METERED DEVICES ARE SHOWN IN BOLD.

| | | Probability of PQ event in each Class | | | | |
|---|---|---|---|---|---|---|
| ID | Device Type | Class 1 | Class 2 | Class 3 | Class 4 | Class 5 |
| 1 | Utility | 0 | 0 | 1 | 0 | 0 |
| 2 | Switch | 0 | 0.0812 | 0.8340 | 0.0848 | 0 |
| 3 | Transformer | 0 | 0 | 1 | 0 | 0 |
| 4 | Switch | 0.6246 | 0.1610 | 0.0530 | 0.0202 | 0.1412 |
| 5 | Bus | 0.7294 | 0.1452 | 0 | 0 | 0.1254 |
| 6 | Switch | 0.1134 | 0.0970 | 0.0910 | 0.1186 | |
| 7 | UPS | 1 | 0 | 0 | 0 | 0 |
| 8 | Switch | 0.5992 | 0.1182 | 0.0856 | 0.0872 | 0.1098 |
| 9 | UPS | 1 | 0 | 0 | 0 | 0 |

Figure 35:
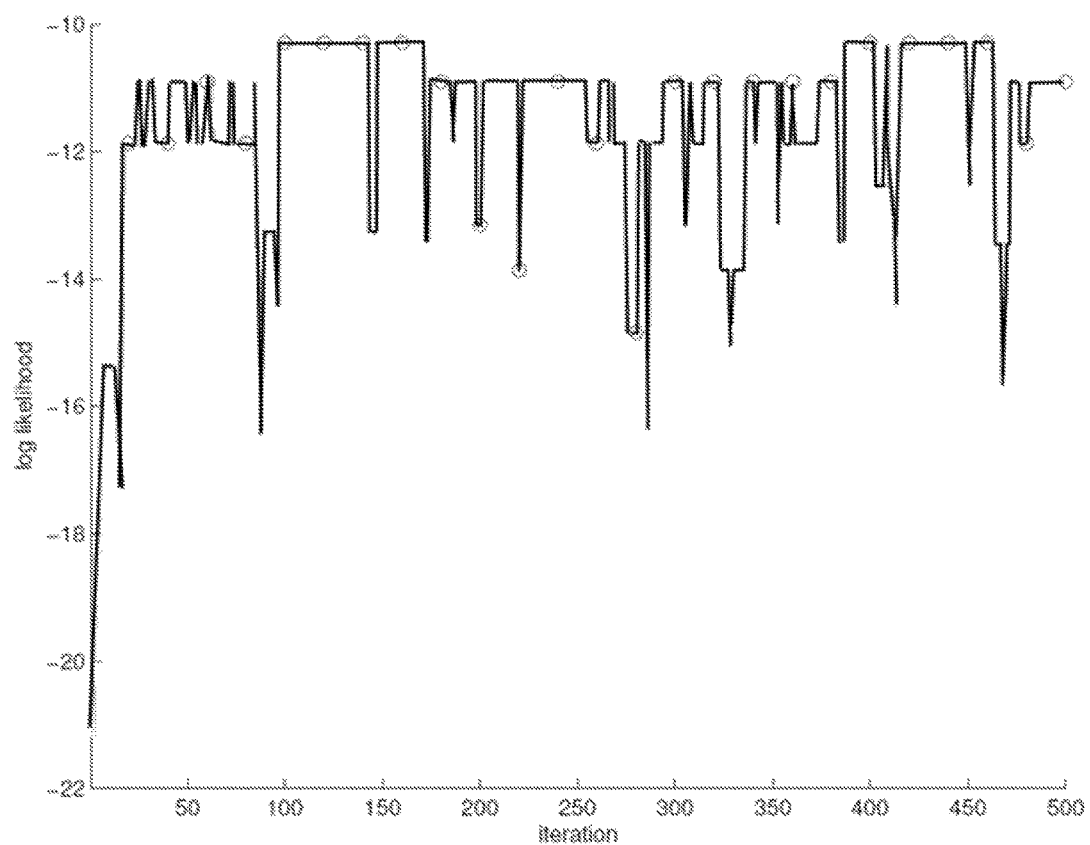
FIG. 35 is a graph showing a log-likelihood of the power quality at each unobserved node in accordance with one embodiment.

The samples returned by Algorithm (1) are a subset of the samples that are generated. Samples generated during the initial "burn-in" period may be discarded. After the burn-in period, every δ (in one example δ=20) sample may be returned as shown in FIG. 35. Although the method of proposing transitions is simple and may not result in large jumps through the state space, the acceptance test can be evaluated efficiently. Thus, testing of many proposals may be included. The resulting chain is ergodic and thus, given a sufficient number of samples, produces samples representative of the true probability distribution.

Figure 36:
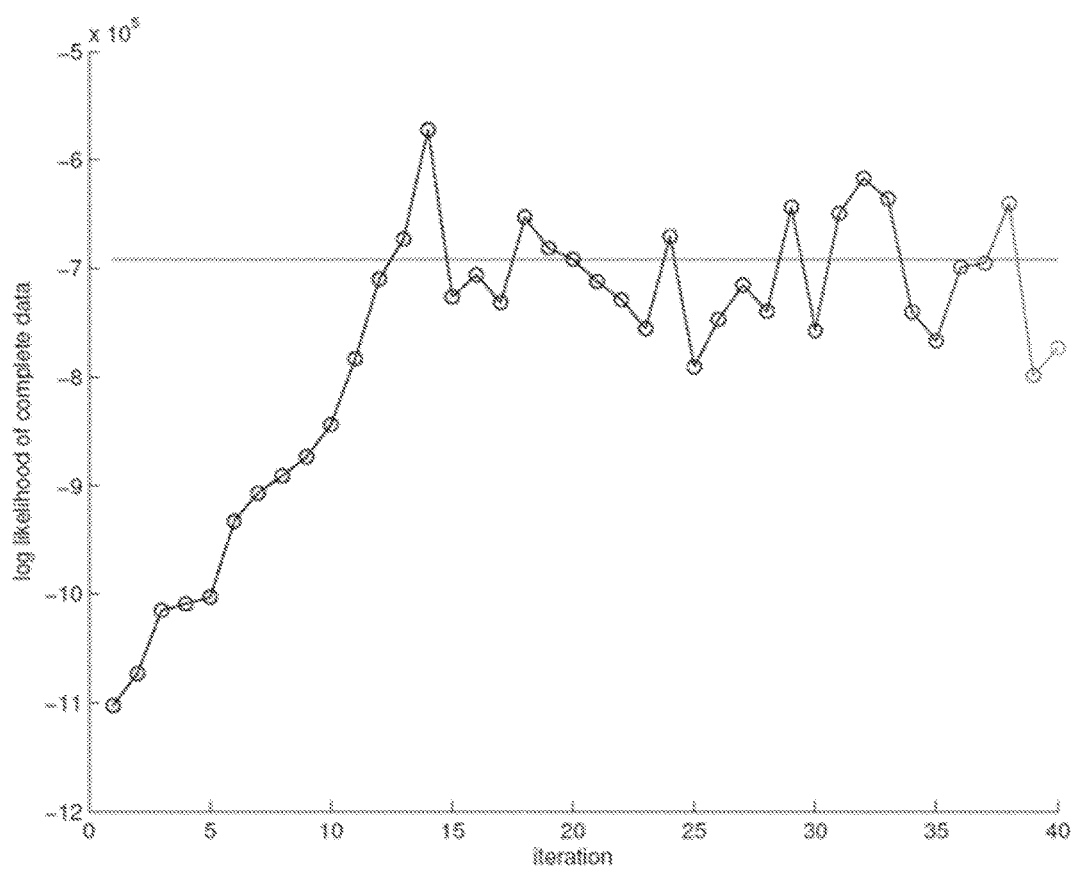
FIG. 36 is a graph showing a log-likelihood of the power quality including the maximum likelihood parameters in accordance with one embodiment.

All transition functions are then calculated given the observed data. Assuming that all instances of a class of devices (e.g. all switches) have the same transition function, the PRI component uses Markov Chain Expectation Maximization, as described in steps 3204-3208, to determine estimated power quality numbers and perform re-sampling as power quality numbers change with time. Transition functions are initialized to uniform distributions. As shown in FIG. 36, the system converges to a local maximum. However, the system is under-constrained and the local maximum is not the true value of power quality. In this simulation, the system can converge to true values of power quality by measuring more nodes. In practice, there is likely to be a much smaller percentage of observed nodes. In this case, appropriate initial estimates of the transition functions may be used and additionally domain knowledge may be used to impose additional constraints.

The PRI metric can be used to provide a reliability visualization to the user. The reliability may be provided using a physical floor layout of a data center and the power quality measurements described above. The physical floor layout may provide indications to the user regarding the level of reliability of the individual assets in the data center. The visualization may indicate to the user which racks and rows can have additional equipment installed without decreasing the reliability of the system. In one example, colors may be used to indicate different types of the reliability of an asset, with red (R) indicating little reliability, yellow (Y) indicating approaching a reliability limit, and green (G) indicating high reliability and available capacity to add new server equipment:

In at least some embodiments of the invention discussed herein, the accuracy of assessments and calculations refers to the amount of resolution of the monitoring that may be used to operate the optimization system and methods described herein and generate benefits for a facility manager or a user.

In at least some embodiments of the invention discussed herein, the performance of assessments and calculations in real-time refers to processes that are completed in a matter of a few seconds or less rather than several minutes or longer as can happen with complex calculations. In at least one embodiment, real-time may refer to the amount of time needed to dynamically react to system changes. For example, to have the monitoring and control system react and shut down one or more pieces of electrical equipment, such as a equipment rack, or a circuit breaker for the IT Loads, as a result of a power failure.

In at least some embodiments described herein, systems and methods are discussed for managing electrical distribution systems in critical facilities. As discussed herein, the electrical distribution systems may include components such as UPS units and circuit breakers used to power critical equipment and may also include HVAC systems used to cool critical loads and facilities.

Having thus described several aspects of at least one embodiment of this invention, it is to be appreciated various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

What is claimed is:

1. A method for managing an electrical distribution system in a facility, the method comprising:
   conducting, using a computer system, measurements related to power quality at a plurality of nodes in the electrical distribution system using a monitoring system;
   receiving at a computer system from the monitoring system data related to actual energy use of components of the electrical distribution system and data related to the power quality at the plurality of nodes in the electrical distribution system;
   using the computer system, generating a current network reliability status for the electrical distribution system based on the data related to the power quality;
   using the computer system, providing an estimate of power quality at a node in the electrical distribution system other than the plurality of nodes based on the data related to the power quality;
   receiving at the computer system a request for a modification to the electrical distribution system;
   using the computer system, providing a revised electrical distribution system design based on the request and the data related to actual energy use using a system optimization function for the electrical distribution system, the system optimization function including at least one calculation of a current power reliability metric for the electrical distribution system based on the network reliability status and the estimate of power quality;
   modifying the electrical distribution system in accordance with the revised electrical distribution system design to provide a modified electrical distribution system in the facility; and
   receiving at the computer system from the monitoring system data related to actual energy use of components of the modified electrical distribution system.

2. The method of claim 1, further comprising using the computer system to validate the modified electrical distribution system using the data related to actual energy use of components of the modified electrical distribution system.

3. The method of claim 1, wherein using a system optimization function includes iteratively determining system parameters, including the current power reliability metric, to achieve an optimized solution.

4. The method of claim 3, wherein iteratively determining system parameters includes determining parameters related to at least one of efficiency, risk, and redundancy.

5. The method of claim 4, wherein iteratively determining system parameters includes calculating an efficiency metric for the electrical distribution system based on at least one of a redundancy level of the electrical distribution system and outdoor climate at a geographical location of the electrical distribution system.

6. The method of claim 4, wherein iteratively determining system parameters includes analyzing the monitoring system data to determine freed capacity in the electrical distribution system, comparing the freed capacity against utilization needs and providing a recommendation for a change in utilization of components in the electrical distribution system based on the freed capacity.

7. The method of claim 4, wherein iteratively determining system parameters includes determining and updating at least one real-time redundancy value for the electrical distribution system.

8. The method of claim 1, wherein the estimate of power quality is further based on a power quality transition function of at least one component in the electrical distribution system.

9. A system for managing an electrical distribution system, the system comprising:
   a monitoring system having a plurality of electrical monitors coupled to components of the electrical distribution system; and
   a controller coupled to the monitoring system and configured to:
      conduct measurements related to power quality at a plurality of nodes in the electrical distribution system using the monitoring system;
      receive from the monitoring system data related to actual energy use of the components of the electrical distribution system and data related to power quality at the plurality of nodes in the electrical distribution system;
      generate a current network reliability status for the electrical distribution system based on the data related to the power quality;
      provide an estimate of power quality at a node in the electrical distribution system other than the plurality of nodes based on the data related to the power quality;
      receive a request for a modification to the electrical distribution system;
      generate a revised electrical distribution system design based on the request and the data related to actual energy use using a system optimization function for the electrical distribution system, the system optimization function including at least one calculation of a current power reliability metric for the electrical distribution system based on the network reliability status and the estimate of power quality;
      receive from the monitoring system data related to actual energy use of components of the modified electrical distribution system.

10. The system of claim 9, wherein the controller is configured to validate the modified electrical distribution system using the data related to actual energy use of components of the modified electrical distribution system.

11. The system of claim 9, wherein using a system optimization function includes iteratively determining system parameters, including the current power reliability metric, to achieve an optimized solution.

12. The system of claim 11, wherein iteratively determining system parameters includes determining parameters related to at least one of efficiency, risk, and redundancy.

13. The system of claim 11, wherein iteratively determining system parameters includes calculating an efficiency metric for the electrical distribution system based on at least one of a redundancy level of the electrical distribution system and outdoor climate at a geographical location of the electrical distribution system.

14. The system of claim 11, wherein iteratively determining system parameters includes analyzing the monitoring system data to determine freed capacity in the electrical distribution system, comparing the freed capacity against utilization needs and providing a recommendation for a change in utilization of components in the electrical distribution system based on the freed capacity.

15. The system of claim 11, wherein iteratively determining system parameters includes determining and updating at least one real-time redundancy value for the electrical distribution system.

16. The system of claim 9, wherein the estimate of power quality is further based on a power quality transition function of at least one component in the electrical distribution system.

17. A non-transitory computer-storage medium having stored thereon sequences of instruction including instructions that will cause a processor to:
   conduct measurements related to power quality at a plurality of nodes in the electrical distribution system using a monitoring system;
   receive from the monitoring system data related to actual energy use of components of an electrical distribution system and data related to power quality at the plurality of nodes in the electrical distribution system;
   generate a current network reliability status for the electrical distribution system based on the data related to the power quality;
   provide an estimate of power quality at a node in the electrical distribution system other than the plurality of nodes based on the data related to the power quality;
   receive a request for a modification to the electrical distribution system;
   generate a revised electrical distribution system design based on the request and the data related to actual energy use using a system optimization function for the electrical distribution system, the system optimization function including at least one calculation of a current power reliability metric for the electrical distribution system based on the network reliability status and the estimate of power quality; and
   receive from the monitoring system data related to actual energy use of components of the modified electrical distribution system.

18. The non-transitory computer-storage medium of claim 17, further comprising sequences of instruction that will cause the processor to validate the modified electrical distribution system using the data related to actual energy use of components of the modified electrical distribution system.

19. The non-transitory computer-storage medium of claim 17, further comprising sequences of instruction that will cause the processor to use the system optimization function to iteratively determine system parameters, including the current power reliability metric, to achieve an optimized solution.

20. The non-transitory computer-storage medium of claim 19, wherein iteratively determining system parameters includes determining parameters related to at least one of efficiency, risk, and redundancy.

* * * * *